United States Patent
Kimoto et al.

(10) Patent No.: US 11,227,961 B2
(45) Date of Patent: *Jan. 18, 2022

(54) PHOTOELECTRIC CONVERSION DEVICE

(71) Applicant: SHARP KABUSHIKI KAISHA, Osaka (JP)

(72) Inventors: Kenji Kimoto, Osaka (JP); Naoki Koide, Osaka (JP); Liumin Zou, Osaka (JP); Masamichi Kobayashi, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 174 days.

This patent is subject to a terminal disclaimer.

(21) Appl. No.: 15/031,834

(22) PCT Filed: Oct. 24, 2014

(86) PCT No.: PCT/JP2014/078369
§ 371 (c)(1),
(2) Date: Apr. 25, 2016

(87) PCT Pub. No.: WO2015/060432
PCT Pub. Date: Apr. 30, 2015

(65) Prior Publication Data
US 2016/0268458 A1    Sep. 15, 2016

(30) Foreign Application Priority Data
Oct. 25, 2013 (JP) .............................. JP2013-222822

(51) Int. Cl.
*H01L 31/036* (2006.01)
*H01L 31/0747* (2012.01)
(Continued)

(52) U.S. Cl.
CPC .......... *H01L 31/036* (2013.01); *H01L 31/028* (2013.01); *H01L 31/022425* (2013.01);
(Continued)

(58) Field of Classification Search
CPC . Y02E 10/50; Y02E 10/547; H01L 31/02168; H01L 31/022441;
(Continued)

(56) References Cited

U.S. PATENT DOCUMENTS

| 5,279,682 A * | 1/1994 | Wald ............... H01L 31/022425 136/256 |
| 2002/0066478 A1* | 6/2002 | Hayashi .............. H01L 31/0236 136/244 |

(Continued)

FOREIGN PATENT DOCUMENTS

| JP | 2007-281156 | 10/2007 |
| JP | 2010-123859 | 6/2010 |

(Continued)

OTHER PUBLICATIONS

International Search Report for PCT/JP2014/078369 dated Jan. 13, 2015, two (2) pages.

*Primary Examiner* — Mayla Gonzalez Ramos
(74) *Attorney, Agent, or Firm* — ScienBiziP, P.C.

(57) ABSTRACT

There is provided a photoelectric conversion device which can prevent the contact resistance between a non-crystalline semiconductor layer containing impurities and an electrode formed on the non-crystalline silicon layer from increasing, and can improve the element characteristics. A photoelectric conversion element (10) includes a silicon substrate (12), a first non-crystalline semiconductor layer (20n), a second non-crystalline semiconductor layer (20p), a first electrode (22n), and a second electrode (22p). One electrode (22n) includes first conductive layers (26n, 26p), and second (Continued)

conductive layers (28n, 28p). The first conductive layers (26n, 26p) have a first metal as a main component. The second conductive layers (28n, 28p) contain a second metal which is more likely to be oxidized than the first metal, are formed to be in contact with the first conductive layers (26n, 26p), and are disposed to be closer to the silicon substrate (12) than the first conductive layers (26n, 26p).

19 Claims, 42 Drawing Sheets

(51) Int. Cl.
- *H01L 31/0224* (2006.01)
- *H01L 31/028* (2006.01)
- *H01L 31/0352* (2006.01)

(52) U.S. Cl.
CPC .. *H01L 31/022441* (2013.01); *H01L 31/0352* (2013.01); *H01L 31/0747* (2013.01); *Y02E 10/547* (2013.01)

(58) Field of Classification Search
CPC . H01L 31/0516; H01L 31/0682; H01L 31/18; H01L 31/1868
See application file for complete search history.

(56) References Cited

U.S. PATENT DOCUMENTS

| | | | |
|---|---|---|---|
| 2003/0035906 A1* | 2/2003 | Memarian | C23C 14/0036 428/1.3 |
| 2005/0062041 A1* | 3/2005 | Terakawa | H01L 31/0747 257/53 |
| 2008/0047602 A1* | 2/2008 | Krasnov | H01L 31/022466 136/256 |
| 2009/0289320 A1* | 11/2009 | Cohen | B82Y 10/00 257/458 |
| 2010/0224245 A1* | 9/2010 | Bartholomeusz | H01L 31/0322 136/256 |
| 2011/0049541 A1* | 3/2011 | Katsuno | H01L 33/405 257/94 |
| 2011/0108114 A1 | 5/2011 | Mizuno et al. | |
| 2011/0139243 A1* | 6/2011 | Shim | H01L 31/02168 136/259 |
| 2012/0199183 A1* | 8/2012 | Oh | H01L 31/02167 136/252 |
| 2012/0279562 A1 | 11/2012 | Yang et al. | |
| 2013/0269771 A1 | 10/2013 | Cheun et al. | |
| 2014/0048013 A1* | 2/2014 | Ding | C30B 33/005 117/58 |
| 2014/0158200 A1 | 6/2014 | Maki et al. | |
| 2015/0034141 A1* | 2/2015 | Albaugh | H01L 31/022425 136/244 |
| 2015/0072467 A1* | 3/2015 | Chan | H01L 31/022441 438/98 |

FOREIGN PATENT DOCUMENTS

| | | |
|---|---|---|
| JP | 2010-129872 A | 6/2010 |
| JP | 2013-513966 | 4/2013 |
| JP | 2013098241 A * | 5/2013 |
| WO | 2009/154137 A1 | 12/2009 |
| WO | WO 2011/077963 | 6/2011 |
| WO | 2013/030993 A1 | 3/2013 |
| WO | WO-2013090607 A2 * | 6/2013 |

* cited by examiner

|  | CONDUCTIVE TYPE OF SILICON SUBSTRATE 32 | CONDUCTIVE TYPE OF NON-CRYSTALLINE SILICON LAYER 36 | STRUCTURE OF ELECTRODE 32 |
|---|---|---|---|
| SAMPLE A | n | n | Ag |
| SAMPLE B | n | n | Ag/Ti/Ag |
| SAMPLE C | n | n | Ag/Ni/Ag |
| SAMPLE D | p | p | Ag |
| SAMPLE E | p | p | Ag/Ti/Ag |
| SAMPLE F | P | P | Ag/Ni/Ag |

PHOTOELECTRIC CONVERSION DEVICE

This application is the U.S. national phase of International Application No. PCT/JP2014/078369 filed 24 Oct. 2014 which designated the U.S. and claims priority to JP Patent Application No. 2013-222822 filed 25 Oct. 2013, the entire contents of each of which are hereby incorporated by reference.

TECHNICAL FIELD

The present invention relates to a photoelectric conversion device.

BACKGROUND ART

In recent years, a solar battery which serves as a photoelectric conversion device has drawn attention. An example of the solar battery is a rear surface electrode type solar battery.

The rear surface electrode type solar battery is disclosed in Japanese Unexamined Patent Application Publication No. 2007-281156. In the related art, the rear surface electrode type solar battery includes a crystalline semiconductor; an n-type non-crystalline semiconductor layer which is formed on a rear surface which is opposite to an irradiation surface of sunlight, in the crystalline semiconductor; a p-type non-crystalline semiconductor layer which is formed on the rear surface; and electrodes which are formed on the n-type non-crystalline semiconductor layer and the p-type non-crystalline semiconductor layer.

However, as described in the related art, in a case where the electrodes are formed on the non-crystalline semiconductor layers, there is a problem that the contact resistance between the non-crystalline semiconductor layer and the electrode increases.

SUMMARY OF INVENTION

An object of the present invention is to provide a photoelectric conversion device which can reduce the contact resistance between a non-crystalline semiconductor layer containing impurities and an electrode formed on the non-crystalline semiconductor layer, and can improve the element characteristics thereof.

A photoelectric conversion device according to an aspect of the present invention includes: a semiconductor substrate, a first semiconductor layer, a second semiconductor layer, a first electrode, and a second electrode. The first semiconductor layer has a first conductive type. The second semiconductor layer has a second conductive type opposite to the first conductive type. The first electrode is formed on the first semiconductor layer. The second electrode is formed on the second semiconductor layer. The first electrode includes a first conductive layer and a second conductive layer. The second conductive layer is formed to be in contact with the first conductive layer. The first conductive layer includes a first metal as a main component. The second conductive layer includes a second metal. The second metal is more likely to be oxidized than the first metal.

The photoelectric conversion device according to the aspect of the present invention can prevent the contact resistance between the non-crystalline semiconductor layer containing impurities and the electrode formed on the non-crystalline semiconductor layer from increasing, and the characteristics of the photoelectric conversion device can be improved.

DESCRIPTION OF EMBODIMENTS

Figure 1:
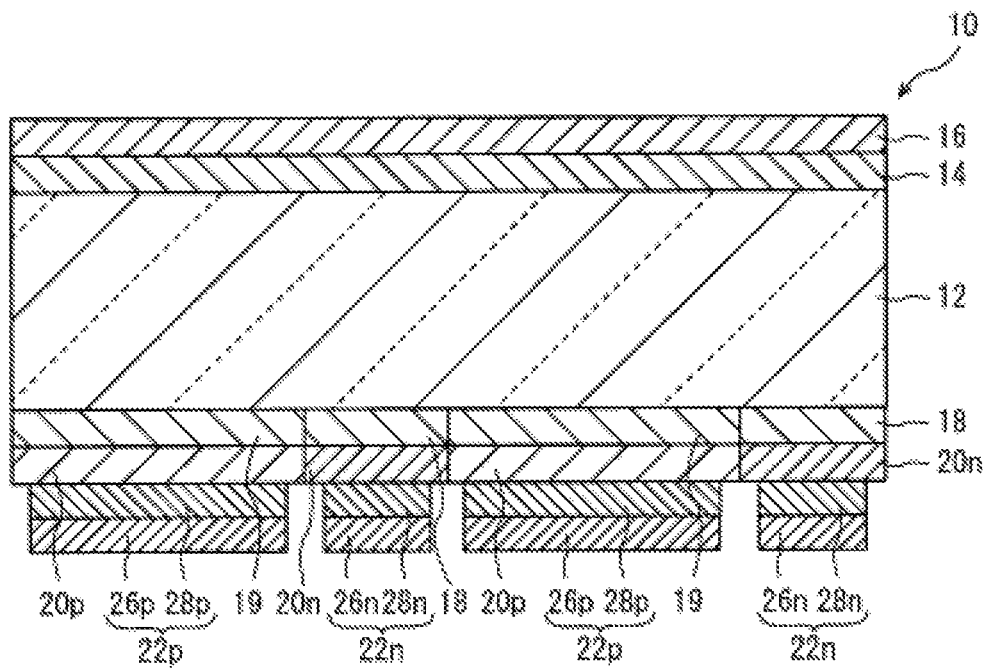
FIG. 1 is a sectional view illustrating a schematic configuration of a photoelectric conversion element according to a first embodiment of the present invention.

A photoelectric conversion device according to a first aspect of the present invention includes a semiconductor substrate, a first semiconductor layer, a second semiconductor layer, a first electrode, and a second electrode. The first semiconductor layer has a first conductive type. The second semiconductor layer has a second conductive type opposite to the first conductive type. The first electrode is formed on the first semiconductor layer. The second electrode is formed on the second semiconductor layer. The first electrode includes a first conductive layer and a second conductive layer. The second conductive layer is formed to be in contact with the first conductive layer. The first conductive layer includes a first metal as a main component. The second conductive layer includes a second metal. The second metal is more likely to be oxidized than the first metal.

In the first aspect, it is possible to suppress oxidization of the first metal. Therefore, for example, even in a case where a heat treatment is performed when manufacturing the photoelectric conversion device, it is possible to reduce resistance of the first conductive layer. As a result, it is possible to reduce the contact resistance between the first semiconductor layer and the first electrode. Therefore, it is possible to improve the characteristics of the photoelectric conversion device.

In the photoelectric conversion device according to a second aspect of the present invention, in the photoelectric conversion device according to the first aspect, the second conductive layer is disposed between the first conductive layer and the first semiconductor layer.

In the second aspect, it is possible to suppress the oxidization of the first semiconductor layer. Therefore, for example, even in a case where the heat treatment is performed when manufacturing the photoelectric conversion device, it is difficult to form a high resistance layer on an interface between the first electrode and the first semiconductor layer. As a result, it is possible to reduce the contact resistance between the first semiconductor layer and the first electrode. Therefore, it is possible to improve the characteristics of the photoelectric conversion device. It is preferable that the second conductive layer is formed to be in contact with the first semiconductor layer. In this case, for example, even in a case where the heat treatment is performed when manufacturing the photoelectric conversion element, it is possible to further prevent the high resistance layer from being formed on the interface between the first electrode and the first semiconductor layer.

In the photoelectric conversion device according to a third aspect of the present invention, in the photoelectric conversion device according to the second aspect, the first electrode further includes a third conductive layer which is formed between the first semiconductor layer and the second conductive layer, and the third conductive layer includes a third metal which is more unlikely to be oxidized than the second metal as a main component.

In the third aspect, since the second conductive layer is more likely to be oxidized than the first conductive layer and the third conductive layer, for example, even in a case where annealing is performed in an oxygen-contained atmosphere, the third conductive layer is hardly oxidized, the oxygen is diffused in the first conductive layer, and the second conductive layer is oxidized. Therefore, it is possible to prevent the third conductive layer from being oxidized and having high resistance. In addition, by the oxidization of the second conductive layer, since the oxygen is blocked by the second conductive layer, it is possible to suppress oxidization of the third conductive layer and the first semiconductor layer, and to suppress an increase in contact resistance. In addition, even in a case where the annealing is performed in an inert gas atmosphere, such as nitrogen or argon, since it is not possible to completely prevent remaining oxygen gas from mixing thereinto, even in a case where the annealing is performed in the inert gas atmosphere, it is possible to obtain similar effects to those in a case where the annealing is performed in the oxygen-contained atmosphere.

In the photoelectric conversion device according to a fourth aspect of the present invention, in the photoelectric conversion device according to the third aspect, the first electrode further includes a fourth conductive layer which is formed to be in contact with the first semiconductor layer and the third conductive layer, and the fourth conductive layer includes a fourth metal which is more likely to be oxidized than the third metal.

In the fourth aspect, since the fourth conductive layer is preferentially oxidized in addition to the second conductive layer, it is possible to further improve the heat resistance properties.

In the photoelectric conversion device according to a fifth aspect of the present invention, in the photoelectric conversion device according to the fourth aspect, the fourth conductive layer contains an oxygen atom.

In the fifth aspect, it is possible to suppress oxidization of the third metal.

In the photoelectric conversion device according to a sixth aspect of the present invention, in the photoelectric conversion device according to the fifth aspect, the maximum concentration of the oxygen atom in the fourth conductive layer is further on a side opposite to the semiconductor substrate than the center of the fourth conductive layer in the film thickness direction.

In the sixth aspect, it is possible to suppress oxidization of the third metal.

In the photoelectric conversion device according to a seventh aspect of the present invention, in the photoelectric conversion device according to any of the fourth to sixth aspects, the fourth metal is more likely to be oxidized than a main component element of the first semiconductor layer.

In the seventh aspect, for example, even in a case where the heat treatment is performed when manufacturing the photoelectric conversion device, it is possible to suppress oxidization of the main component element of the first semiconductor layer.

In the photoelectric conversion device according to an eighth aspect of the present invention, in the photoelectric conversion element according to any of the first to seventh aspects, the second conductive layer contains the oxygen atom.

In the eighth aspect, it is possible to suppress oxidization of the first metal.

In the photoelectric conversion device according to a ninth aspect of the present invention, in the photoelectric conversion device according to the eighth aspect, the maximum concentration of the oxygen atom in the second conductive layer is further on the side opposite to the semiconductor substrate than the center of the second conductive layer in the film thickness direction. In the ninth aspect, it is possible to suppress oxidization of the first metal.

In the photoelectric conversion device according to a tenth aspect of the present invention, in the photoelectric conversion device according to the any of the first to ninth aspects, the second metal is more likely to be oxidized than the main component element of the first semiconductor layer.

In the tenth aspect, for example, even in a case where the heat treatment is performed when manufacturing the photoelectric conversion device, it is possible to suppress oxidization of the main component element of the first semiconductor layer.

In the photoelectric conversion device according to an eleventh aspect of the present invention, in the photoelectric conversion device according to any of the first to tenth aspects, the first semiconductor layer includes a non-crystalline semiconductor.

In the eleventh aspect, by the oxidization of the second conductive layer, since the oxygen diffused from the outside is effectively blocked, the oxidization of the non-crystalline semiconductor is unlikely occur. Therefore, it is possible to reduce the contact resistance between the first semiconductor layer including the non-crystalline semiconductor, and the first electrode, and to improve photoelectric conversion efficiency of the photoelectric conversion device.

In the photoelectric conversion device according to a twelfth aspect of the present invention, in the photoelectric conversion device according to the eleventh aspect, the main component element of the first semiconductor layer is silicon, the first metal is any of silver, platinum, and gold, and the second metal is at least one of nickel, cobalt, iron, chrome, zinc, tantalum, manganese, titanium, aluminum, magnesium, cerium, niobium, molybdenum, and tungsten.

In the twelfth aspect, it is possible to suppress oxidization of the first metal.

In the photoelectric conversion device according to a thirteenth aspect of the present invention, in the photoelectric conversion device according to the third or fourth aspect, the main component element of the first semiconductor layer is silicon, the first metal is any of silver, platinum, and gold, the second metal is at least one of nickel, cobalt, iron, chrome, zinc, tantalum, manganese, titanium, aluminum, magnesium, cerium, niobium, molybdenum, and tungsten, and the third metal is any of silver, platinum, and gold.

In the thirteenth aspect, it is possible to suppress oxidization of the first metal and the first semiconductor layer.

In the photoelectric conversion device according to a fourteenth aspect of the present invention, in the photoelectric conversion device according to any of the fourth to seventh aspects, the main component element of the first semiconductor layer is silicon, the first metal is any of silver, platinum, and gold, the second metal is at least one of nickel, cobalt, iron, chrome, zinc, tantalum, manganese, titanium, aluminum, magnesium, cerium, niobium, molybdenum, and tungsten, the third metal is any of silver, platinum, and gold, and the fourth metal is at least one of nickel, cobalt, iron, chrome, zinc, tantalum, manganese, titanium, aluminum, magnesium, cerium, niobium, molybdenum, and tungsten.

In the fourteenth aspect, it is possible to suppress oxidization of the first metal and the third metal.

In the photoelectric conversion device according to a fifteenth aspect of the present invention, in the photoelectric conversion device according to any of the first to fourteenth aspects, the first conductive layer includes a plurality of metal crystal grains, and the average crystal grain size of the metal crystal grains is greater than the thickness of the first conductive layer in the in-surface direction of the first conductive layer.

In the fifteenth aspect, it is possible to prevent the contact resistance between the first electrode and the first semiconductor layer from increasing.

In the photoelectric conversion device according to a sixteenth aspect of the present invention, in the photoelectric conversion device according to any of the fourth to seventh aspects, the third conductive layer includes a plurality of metal crystal grains, and the average crystal grain size of the metal crystal grains is greater than the thickness of the third conductive layer in the in-surface direction of the third conductive layer.

In the sixteenth aspect, it is possible to prevent the contact resistance between the first electrode and the first semiconductor layer from increasing.

In the photoelectric conversion device according to a seventeenth aspect of the present invention, in the photoelectric conversion device according to the fifteenth or sixteenth aspect, in the metal crystal grains, a crystal axis which is parallel to the thickness direction of the semiconductor substrate is preferentially oriented in the <111> direction.

In the seventeenth aspect, it is possible to further suppress irregularity of the contact resistance.

In the photoelectric conversion device according to an eighteenth aspect of the present invention, in the photoelectric conversion device according to any of the first to seventeenth aspects, the first conductive layer further contains tin.

In the eighteenth aspect, in a case where soldering is performed on the first conductive layer, it is possible to alloy the first metal and tin in the solder, and to obtain an effect of high adhesiveness and low resistance. In addition, the second conductive layer functions as a barrier layer, and it is possible to prevent the soldering from penetrating the first conductive layer and reaching the semiconductor layer. As a result, it is possible to suppress a decrease in open-circuit voltage.

In the photoelectric conversion device according to a nineteenth aspect of the present invention, in the photoelectric conversion element according to the first aspect, the third semiconductor layer including an intrinsic non-crystalline semiconductor is formed between the semiconductor substrate and the first semiconductor layer.

In the nineteenth aspect, compared to a case where the first semiconductor layer is formed directly on the semiconductor substrate, passivation characteristics of a rear surface of the semiconductor substrate is improved.

In the photoelectric conversion device according to a twentieth aspect of the present invention, in the photoelectric conversion device according to the eighteenth aspect, the intrinsic non-crystalline semiconductor is hydrogenated amorphous silicon.

In the twentieth aspect, the passivation characteristics of the rear surface of the semiconductor substrate is further improved.

In the photoelectric conversion device according to a twenty-first aspect of the present invention, in the photoelectric conversion device according to the first aspect, a non-crystalline semiconductor of the first conductive type is hydrogenated amorphous silicon.

In the twenty-first aspect, it is possible to suppress deterioration of a contact interface between the first electrode and the first semiconductor layer.

In the photoelectric conversion device according to a twenty-second aspect of the present invention, in the photoelectric conversion device according to the first aspect, the second semiconductor layer includes a non-crystalline semiconductor of the second conductive type, and the second electrode includes the first conductive layer and the second conductive layer.

In the twenty-second aspect, it is possible to prevent the contact resistance between the second electrode and the second semiconductor layer from increasing.

In the photoelectric conversion device according to a twenty-third aspect of the present invention, in the photoelectric conversion device according to the twenty-second aspect, a fourth semiconductor layer including the intrinsic non-crystalline semiconductor is formed between the semiconductor substrate and the second semiconductor layer.

In the twenty-third aspect, compared to a case where the second semiconductor layer is formed directly on the semiconductor substrate, the passivation characteristics of the rear surface of the semiconductor substrate is improved.

In the photoelectric conversion device according to a twenty-fourth aspect of the present invention, in the photoelectric conversion element according to the twenty-second or twenty-third aspect, the non-crystalline semiconductor of the second conductive type is hydrogenated amorphous silicon.

In the twenty-fourth aspect, it is possible to suppress deterioration of the contact interface between the second electrode and the second semiconductor layer.

In the photoelectric conversion device according to a twenty-fifth aspect of the present invention, in the photoelectric conversion device according to the first aspect, the first semiconductor layer and the second semiconductor layer are formed on the rear surface opposite to a light-receiving surface in the semiconductor substrate.

In the twenty-fifth aspect, in the photoelectric conversion device of a rear surface electrode type, it is possible to improve the device characteristics.

In the photoelectric conversion device according to a twenty-sixth aspect of the present invention, in the photoelectric conversion device according to the twenty-fifth aspect, the width dimension of the first semiconductor layer is less than that of the second semiconductor layer in the in-surface direction of the semiconductor substrate.

In the twenty-sixth aspect, the distance by which a light-generated minority carrier should move to reach the second semiconductor layer is reduced. Therefore, the number of recombining minority carriers decreases until reaching the second semiconductor layer, and the short-circuit in photoelectric current increases. Therefore, it is possible to improve conversion efficiency of the photoelectric conversion device.

In the photoelectric conversion device according to a twenty-seventh aspect of the present invention, in the photoelectric conversion device according to the first aspect, the first conductive type is a p-type.

In the twenty-seventh aspect, it is possible to prevent the contact resistance between the first electrode and the first semiconductor layer from increasing.

A photoelectric conversion module according to the first aspect of the present invention includes the photoelectric conversion device according to any of the first to twenty-seventh aspects of the present invention. In the first aspect, it is possible to improve performance of the photoelectric conversion module.

A photoelectric conversion system according to the first aspect of the present invention includes the photoelectric conversion module according to the first aspect of the present invention. In the first aspect, it is possible to improve performance of the photoelectric conversion system.

Hereinafter, more specific embodiments of the present invention will be described with reference to the drawings. The same parts or the same corresponding parts in the drawings will be given the same reference numerals, and the description thereof will not be repeated. In addition, in the specification, the photoelectric conversion device includes, for example, the photoelectric conversion element, a solar battery, a photoelectric conversion module, and a photoelectric conversion system. Hereinafter, the photoelectric conversion device according to the embodiments of the present invention will be specifically described.

First Embodiment

FIG. 1 illustrates a photoelectric conversion element 10 which serves as a photoelectric conversion device according to a first embodiment of the present invention. The photoelectric conversion element 10 is a rear surface electrode type solar battery.

The photoelectric conversion element 10 includes a silicon substrate 12, a passivation film 14, a reflection preventing film 16, intrinsic non-crystalline silicon layers 18 and 19, an n-type non-crystalline silicon layer 20n, a p-type non-crystalline silicon layer 20p, an electrode 22n, and an electrode 22p.

The silicon substrate 12 is an n-type single crystal silicon substrate. The thickness of the silicon substrate 12 is, for example, 50 μm to 300 μm. The specific resistance of the silicon substrate 12 is, for example, 1.0 Ω·cm to 10.0 Ω·cm. In addition, instead of the n-type single crystal silicon substrate, an n-type polycrystal silicon substrate, an n-type single crystal germanium, or an n-type single crystal silicon germanium, may be used, and in general, the semiconductor substrate may be used. Instead of the n-type, the p-type may be used.

Although not illustrated, a texture structure is formed on the light-receiving surface of the silicon substrate 12. Accordingly, the light which is incident on the silicon substrate 12 is blocked up, and the use efficiency of the light can be improved.

It is preferable that the orientation of the silicon substrate 12 is (100). Accordingly, it becomes easy to form the texture structure.

The light-receiving surface of the silicon substrate 12 is covered with the passivation film 14. The passivation film 14 is, for example, a hydrogenated amorphous silicon film. The film thickness of the passivation film 14 is, for example, 3 nm to 30 nm. In addition, as the passivation film 14, instead of the hydrogenated amorphous silicon film, a silicon nitride film, a silicon oxide film, or a silicon oxynitride film, may be used.

The reflection preventing film 16 covers the passivation film 14. The reflection preventing film 16 is, for example, a silicon nitride film. The film thickness of the reflection preventing film 16 is, for example, 50 nm to 200 nm.

On the rear surface of the silicon substrate 12, the intrinsic non-crystalline silicon layers 18 and 19 are formed. The intrinsic non-crystalline silicon 18 and 19 are made of, for example, an i-type hydrogenated amorphous silicon (a-Si: H). The intrinsic non-crystalline silicon layer 18 is formed at a part of the rear surface of the silicon substrate 12. The intrinsic non-crystalline silicon layer 19 is formed to be adjacent to the intrinsic non-crystalline silicon layer 18 on the rear surface of the silicon substrate 12. In other words, the intrinsic non-crystalline silicon layers 18 and 19 are alternately formed on the entire rear surface of the silicon substrate 12. The thickness of the intrinsic non-crystalline silicon layers 18 and 19 is, for example, 10 nm. In the example illustrated in FIG. 1, the intrinsic non-crystalline silicon layer 19 is formed to be adjacent to the intrinsic non-crystalline silicon layer 18, but, for example, may be formed at a part of the region in which the intrinsic non-crystalline silicon layer 18 is not formed on the rear surface of the silicon substrate 12. In addition, the intrinsic non-crystalline silicon layers 18 and 19 may be made only of a non-crystalline phase, or may be made of a fine crystalline phase and a non-crystalline phase.

On the intrinsic non-crystalline silicon layer 18, the n-type non-crystalline silicon layer 20n is formed. The n-type non-crystalline silicon layer 20n is made of the hydrogenated amorphous silicon (a-Si:H(n)) containing n-type impurities (for example, phosphorus). The thickness of the n-type non-crystalline silicon layer 20n is, for example, 10 nm. The impurities concentration of the n-type non-crystalline silicon layer 20n is, for example, $1 \times 10^{19}$ cm$^{-3}$ to $1 \times 10^{21}$ cm$^{-3}$. The n-type non-crystalline silicon layer 20n may be made only of the non-crystalline phase, or may be made of the fine crystalline phase and the non-crystalline phase. An example of a case where the n-type non-crystalline silicon layer 20n is made of the fine crystalline phase and the non-crystalline phase, is, for example, an n-type microcrystalline silicon.

On the intrinsic non-crystalline silicon layer 19, the p-type non-crystalline silicon layer 20p is formed. The p-type non-crystalline silicon layer 20p is made of the hydrogenated amorphous silicon (a-Si:H(p)) containing p-type impurities (for example, boron). The thickness of the p-type non-crystalline silicon layer 20p is, for example, 10 nm. The impurities concentration of the p-type non-crystalline silicon layer 20p is, for example, $1 \times 10^{19}$ cm$^{-3}$ to $1 \times 10^{21}$ cm$^{-3}$. The p-type non-crystalline silicon layer 20p may be made only of the non-crystalline phase, or may be made of the fine crystalline phase and the non-crystalline phase. An example of a case where the p-type non-crystalline silicon layer 20p is made of the fine crystalline phase and the non-crystalline phase, is a p-type microcrystalline silicon. In the example illustrated in FIG. 1, the n-type non-crystalline silicon layer 20n is formed to be adjacent to the p-type non-crystalline silicon layer 20p, but it is not necessary to be adjacent to the p-type non-crystalline silicon layer 20p, and for example, the n-type non-crystalline silicon layer 20n may be formed at least at a part on the non-crystalline silicon layer 18, or the p-type non-crystalline silicon layer 20p may be formed at least at a part on the non-crystalline silicon layer 19.

In the in-surface direction of the silicon substrate 12, it is preferable that the width dimension of the n-type non-crystalline silicon layer 20n is less than the width dimension of the p-type non-crystalline silicon layer 20p. As a ratio of the area of the p-type non-crystalline silicon layer 20p with respect to the sum of the area of the n-type non-crystalline silicon layer 20n and the area of the p-type non-crystalline silicon layer 20p (area ratio of the p-type non-crystalline silicon layer 20p) increases, the distance by which the light-generated minority carrier (positive hole) should move to reach the p-type non-crystalline silicon layer 20p decreases. Therefore, the number of recombining positive holes until reaching the p-type non-crystalline silicon layer 20p decreases, and the short-circuit photoelectric current increases. Therefore, a conversion ratio of the photoelectric conversion element 10 is improved. A preferable area ratio of the p-type non-crystalline silicon layer 20p is 63% to 90%.

Although not illustrated, the texture structure may be formed on the rear surface of the silicon substrate 12. In this case, in the intrinsic non-crystalline silicon layers 18 and 19, and the n-type non-crystalline silicon layer 20n and the p-type non-crystalline silicon layer 20p, unevenness which corresponds to the texture structure of the rear surface of the silicon substrate 12 is formed.

On the n-type non-crystalline silicon layer 20n, the electrode 22n is formed. The electrode 22n includes a conductive layer 26n and a conductive layer 28n.

In the conductive layer 26n, silver which is an example of the first metal is a main component. The conductive layer 26n may contain metal other than silver. The thickness of the conductive layer 26n is, for example, 100 nm to 1000 nm. The conductive layer 26n is formed to be in contact with the conductive layer 28n. A containing ratio (composition ratio) of silver in the conductive layer 26n is preferably 50% or more, more preferably 80% or more, and still more preferably 90% or more. Instead of silver, gold or platinum may be used. The thickness of the conductive layer 26n is, for example, 50 nm to 1000 nm.

The conductive layer 28n contains metal (second metal), such as titanium. It is preferable that the thickness of the conductive layer 28n is 0.1 nm to 10 nm. In this case, light absorption by the metal (second metal), such as titanium, decreases, and a reflection ratio by the electrode 22n increases. Therefore, the element characteristics are improved. The thickness of a conductive layer 28 may be equal to or less than that of 1 atom layer. The conductive layer 28n is formed to be in contact with the conductive layer 26n and the n-type non-crystalline silicon layer 20n. The containing ratio (composition ratio) of titanium (Ti) in the conductive layer 28n is preferably 1% or more, more preferably 10% or more, and still more preferably 90% or more. It is preferable that the metal other than the second metal contained in the conductive layer 28n is more unlikely to be oxidized than the second metal. In this case, high resistance due to the oxidization of the conductive layer 28n is unlikely to be achieved. A part of titanium which is an example of the second metal may be oxidized. In other words, the conductive layer 28n may contain oxygen. It is preferable that the amount of oxygen in the conductive layer 28n is, for example, 1 at % to 50 at %. In this case, it is possible to decrease light absorption by the conductive layer 28n (second conductive layer) while maintaining the contact resistance to be low. Instead of titanium, any one or more among nickel, cobalt, iron, chrome, zinc, tantalum, manganese, aluminum, magnesium, cerium, niobium, molybdenum, and tungsten, may be used. The conductive layer 28n has conductive properties at least in the film thickness direction.

On the p-type non-crystalline silicon layer 20p, the electrode 22p is formed. The electrode 22p includes a conductive layer 26p and a conductive layer 28p.

In the conductive layer 26p, silver which is an example of the first metal is a main component. The conductive layer 26p may contain metal other than silver. The thickness of the conductive layer 26p is, for example, 100 nm to 1000 nm. The conductive layer 26p is formed to be in contact with the conductive layer 28p. A containing ratio (composition ratio) of silver in the conductive layer 26p is preferably 50% or more, more preferably 80% or more, and still more preferably 90% or more. Instead of silver, gold or platinum may be used. The thickness of the conductive layer 26p is, for example, 50 nm to 1000 nm.

The conductive layer 28p contains metal (second metal), such as titanium. It is preferable that the thickness of the conductive layer 28p is 0.1 nm to 10 nm. In this case, light absorption by titanium decreases, and a reflection ratio by the electrode 22p increases. Therefore, the element characteristics are improved. In addition, the thickness of the conductive layer 28 may be equal to or less than that of the 1 atom layer. The conductive layer 28p is formed to be adjacent to the conductive layer 26p and the p-type non-crystalline silicon layer 20p. The containing ratio (composition ratio) of titanium (Ti) in the conductive layer 28p is preferably 1% or more, more preferably 10% or more, and still more preferably 90% or more. It is preferable that the metal other than the second metal contained in the conductive layer 28p is more unlikely to be oxidized than the second metal. A part of titanium which serves as an example of the second metal may be oxidized. In other words, the conductive layer 28p may contain oxygen. It is preferable that the amount of oxygen in the conductive layer 28p is, for example, 1 at % to 50 at %. In this case, it is possible to decrease light absorption by the conductive layer 28p while maintaining the contact resistance to be low. Instead of titanium, any one or more among nickel, cobalt, iron, chrome, zinc, tantalum, manganese, aluminum, magnesium, cerium, niobium, molybdenum, and tungsten, may be used. The conductive layer 28p has conductive properties at least in the film thickness direction. The thickness of the conductive layer 28p is, for example, 1 nm to 500 nm.

In addition, in the specification, regarding two types of metal, metal A and metal B, the expression "the metal A is more likely to be oxidized than the metal B" means that "reference generation Gibbs energy of an oxide of the metal A is less than a reference generation Gibbs energy of an oxide of the metal B (an absolute value is large)" at a certain temperature. The "certain temperature" is, for example, 100° C. to 500° C.

In the conductive layers 28n and 28p, in a case where a part of titanium which serves as an example of the second metal is oxidized, the composition ratios of oxygen with respect to the titanium in the conductive layers 28n and 28p are respectively less than 2, and preferably 1 or less. In a case of the composition ratio in which metal is rich, absorption of oxygen is more possible than in a case where the composition ratio is a stoichiometric ratio. As a result, it is possible to suppress oxidization of the conductive layers 26n and 26p, the n-type non-crystalline silicon layer 20n, and the p-type non-crystalline silicon layer 20p. In other words, a case where complete $TiO_2$ is achieved is a case where Ag or non-crystalline silicon becomes oxidized by a heat treatment. A case where there is room for oxidizing to titanium oxide is a case where oxidization of Ag or non-crystalline silicon by the heat treatment is prevented.

In addition, in a case where the texture structure is formed on the rear surface of the silicon substrate 12, adhesiveness between the electrode 22n and the n-type non-crystalline silicon layer 20n and adhesiveness between the electrode 22p and the p-type non-crystalline silicon layer 20p are improved. Accordingly, yield and reliability of the photoelectric conversion element 10 are improved. Furthermore, compared to a case where the rear surface of the silicon substrate 12 is flat, since the contact surface between the electrode 22n and the n-type non-crystalline silicon layer 20n, and a contact area between the electrode 22p and the p-type non-crystalline silicon layer 20p become large, the contact resistance decreases. In addition, when viewed from the thickness direction of the silicon substrate 12, the texture may be formed in any one of a region including at least a part of the region overlapping the electrode 22n, and a region including at least a part of the region overlapping the electrode 22p.

[Manufacturing Method of Photoelectric Conversion Element]

With reference to FIGS. 2A to 2F, a manufacturing method of the photoelectric conversion element 10 will be described.

Figure 2A:
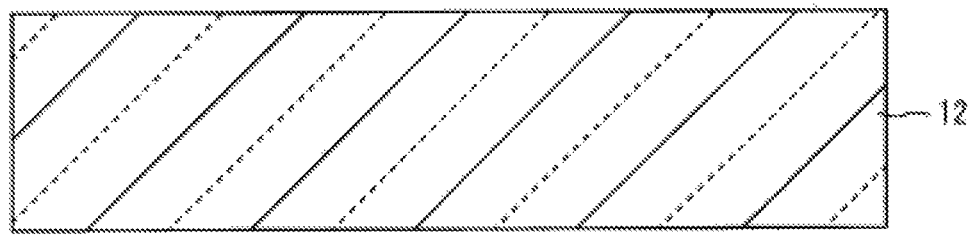
FIG. 2A is a sectional view illustrating a manufacturing method of a photoelectric conversion device illustrated in FIG. 1, and is a sectional view illustrating a silicon substrate of the photoelectric conversion device illustrated in FIG. 1.

First, as illustrated in FIG. 2A, the silicon substrate 12 is prepared. The silicon substrate 12 has the texture structure on the entire light-receiving surface. A method for forming the texture structure is, for example, wet etching. By performing the wet etching on the entire light-receiving surface of the silicon substrate 12, the texture structure is formed on the entire light-receiving surface of the silicon substrate 12.

The wet etching is performed, for example, by using an alkaline solution. The time for the wet etching is, for example, 10 minutes to 60 minutes. The alkaline solution used in the wet etching is, for example, NaOH or KOH, and the concentration thereof is, for example, 5%.

Figure 2B:
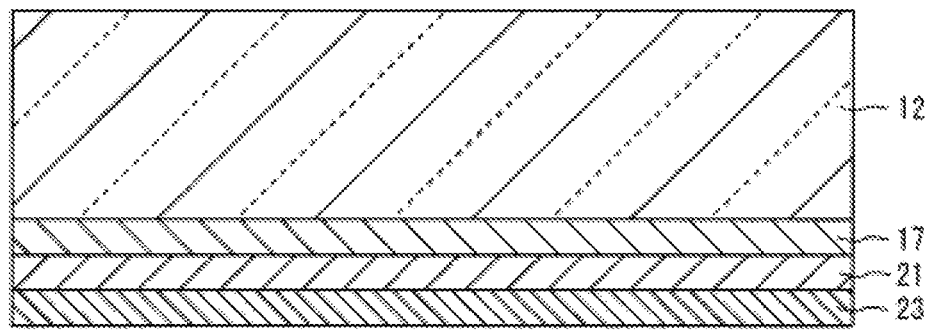
FIG. 2B is a sectional view illustrating a state where an intrinsic non-crystalline silicon layer, a p-type non-crystalline silicon layer, and a coating layer are formed on the silicon substrate illustrated in FIG. 2A.

Next, as will be described in FIG. 2B, an intrinsic non-crystalline silicon layer 17, a p-type non-crystalline silicon layer 21, and a coating layer 23, are formed in order on the rear surface of the silicon substrate 12.

The intrinsic non-crystalline silicon layer 17 is formed, for example, by using a plasma CVD. In a case where the intrinsic non-crystalline silicon layer 17 is formed by the plasma CVD, reaction gas which is led into a reaction chamber provided with a plasma CVD device, is silane gas and hydrogen gas. The temperature of the silicon substrate 12 is, for example, 100° C. to 300° C.

The p-type non-crystalline silicon layer 21 is formed, for example, by using the plasma CVD. In a case where the p-type non-crystalline silicon layer 21 is formed by the plasma CVD, the reaction gas which is led into the reaction chamber provided in the plasma CVD device, is silane gas, hydrogen gas, and diboran gas. The temperature of the silicon substrate 12 is, for example, 100° C. to 300° C.

The coating layer 23 is made of, for example, the silicon nitride film. The silicon nitride is formed, for example, by the plasma CVD method. Instead of the silicon nitride film, the silicon oxide film or the silicon oxynitride film may be used.

Figure 2C:
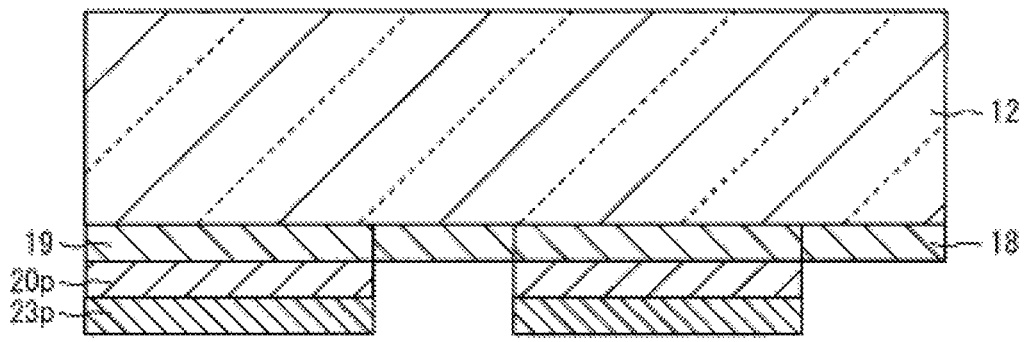
FIG. 2C is a view illustrating a state where the coating layer and the p-type non-crystalline silicon layer are patterned, and the coating layer and the p-type non-crystalline silicon layer are formed, on the silicon substrate illustrated in FIG. 2B.

Next, as illustrated in FIG. 2C, by patterning the coating layer 23 and the p-type non-crystalline silicon layer 21, a coating layer 23p and the p-type non-crystalline silicon layer 20p are formed. In the intrinsic non-crystalline silicon layer 17, a region which is covered with the p-type non-crystalline silicon layer 20p becomes the intrinsic non-crystalline silicon layer 19, and a region other than this becomes the intrinsic non-crystalline silicon layer 18. The patterning uses, for example, a photolithography method. In this method, after performing the patterning so that the region which becomes the p-type non-crystalline silicon layer 20p is coated with a photoresist, by using a photoresist as a mask, for example, by using mixed liquid of hydrofluoric acid and nitric acid, etching is performed with respect to the coating layer 23 and the p-type non-crystalline silicon layer 21. At this time, in the intrinsic non-crystalline silicon layer 17, the region which is not covered with the p-type non-crystalline silicon layer 20p (intrinsic non-crystalline silicon layer 18) is exposed.

Figure 2D:
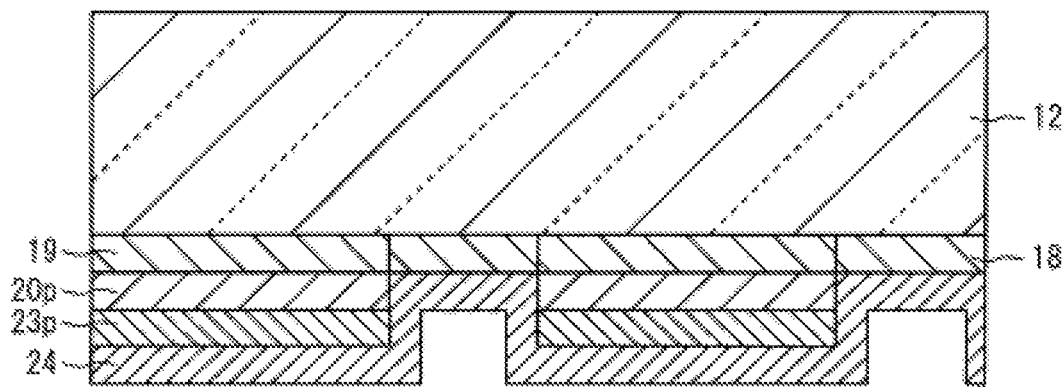
FIG. 2D is a view illustrating a process of forming an n-type non-crystalline silicon layer on the silicon substrate illustrated in FIG. 2C.

Next, as illustrated in FIG. 2D, for example, by using the plasma CVD method, an n-type non-crystalline silicon layer 24 is formed on the rear surface side of the silicon substrate 12. In a case where the plasma CVD method is used, the reaction gas which is led into the reaction chamber provided in the plasma CVD device is silane gas, hydrogen gas, and phosphine gas. The temperature of the silicon substrate 12 is, for example, 100° C. to 300° C.

Figure 2E:
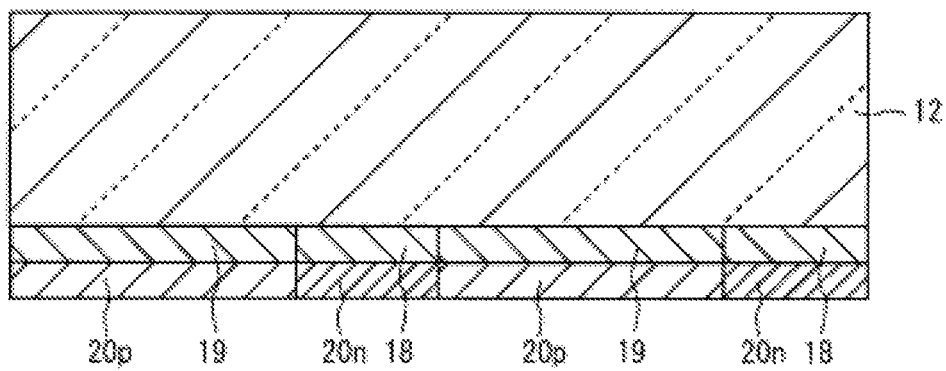
FIG. 2E is a sectional view illustrating a state where the intrinsic non-crystalline silicon layer is formed, and the n-type non-crystalline silicon layer and the p-type non-crystalline silicon layer are formed on the intrinsic non-crystalline silicon layer, on a rear surface of the silicon substrate illustrated in FIG. 2C.

Next, by removing the coating layer 23 formed on the p-type non-crystalline silicon layer 20p, as illustrated in FIG. 2E, the n-type non-crystalline silicon layer 24 on the coating layer 23 is lifted off. Accordingly, the n-type non-crystalline silicon layer 20n is formed on the intrinsic non-crystalline silicon layer 18. A method of removing the coating layer 23 formed on the p-type non-crystalline silicon layer 20p is wet etching, for example, using hydrofluoric acid.

Figure 2F:
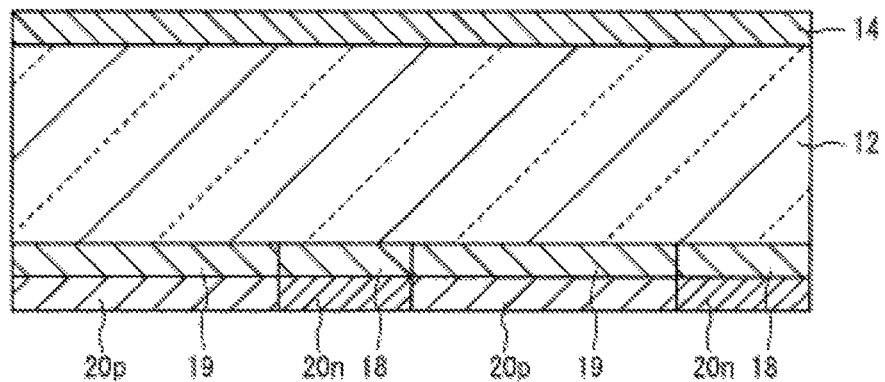
FIG. 2F is a sectional view illustrating a state where a passivation film is formed on a light-receiving surface of the silicon substrate illustrated in FIG. 2E.

Next, as illustrated in FIG. 2F, on the light-receiving surface of the silicon substrate 12, the passivation film 14 is formed, for example, by using the plasma CVD method.

Figure 2G:
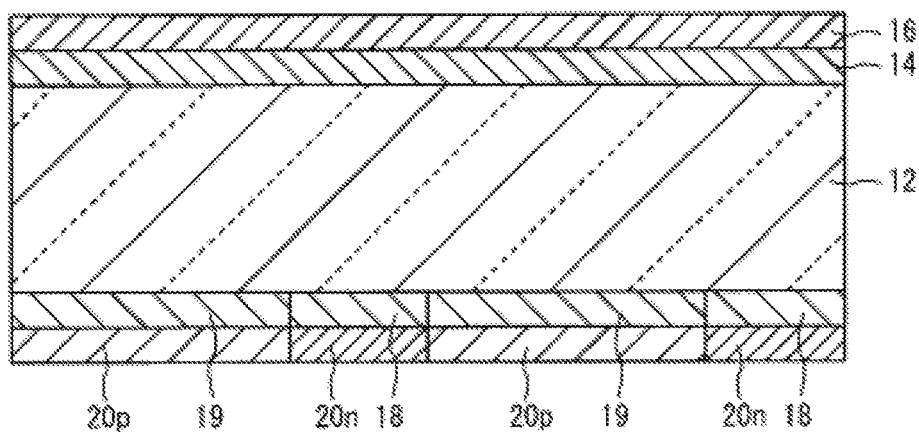
FIG. 2G is a sectional view illustrating a state where a reflection prevention film is formed on the passivation film, on the silicon substrate illustrated in FIG. 2E.

Next, as illustrated in FIG. 2G, the reflection preventing film 16 is formed on the passivation film 14. The reflection preventing film 16 is formed, for example, by forming the silicon nitride film, the silicon oxide film, or the silicon oxynitride film, for example, by the plasma CVD.

Figure 2H:
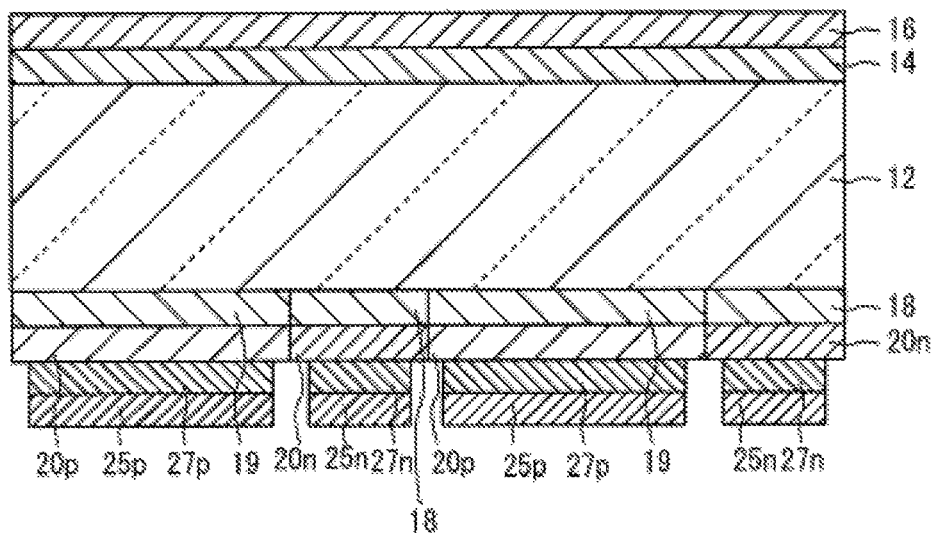
FIG. 2H is a sectional view illustrating a state where a conductive layer made of silver and a conductive layer made of titanium are formed on the silicon substrate illustrated in FIG. 2G.

Next, as illustrated in FIG. 2H, conductive layers 27n and 27p and conductive layers 25n and 25p are formed. A forming method of the conductive layers 27n and 27p and the conductive layers 25n and 25p is, for example, as follows.

First, on the n-type non-crystalline silicon layer 20n and the p-type non-crystalline silicon layer 20p, by a deposition method or a sputtering method, the conductive layer made of titanium and the conductive layer made of silver are formed in order. Next, a resist pattern which serves as a mask is formed on the conductive layer made of silver. The resist pattern is obtained by patterning the resist formed on the conductive layer made of silver. The patterning is performed, for example, by the photolithography method. In a case of being viewed from the thickness direction of the silicon substrate 12, the resist pattern is formed so that a boundary portion between the n-type non-crystalline silicon layer 20n and the p-type non-crystalline silicon layer 20p is opened.

Next, in the conductive layer made of titanium and the conductive layer made of silver, a part which is not covered with the resist is removed by processing, such as wet etching.

Next, the resist pattern is removed. A method of removing the resist pattern is, for example, wet etching. Accordingly, the conductive layer 27n is formed on the n-type non-crystalline silicon layer 20n, and the conductive layer 25n is formed on the conductive layer 27n. In addition, the conductive layer 27p is formed on the p-type non-crystalline silicon layer 20p, and the conductive layer 25p is formed on the conductive layer 27p.

Figure 2I:
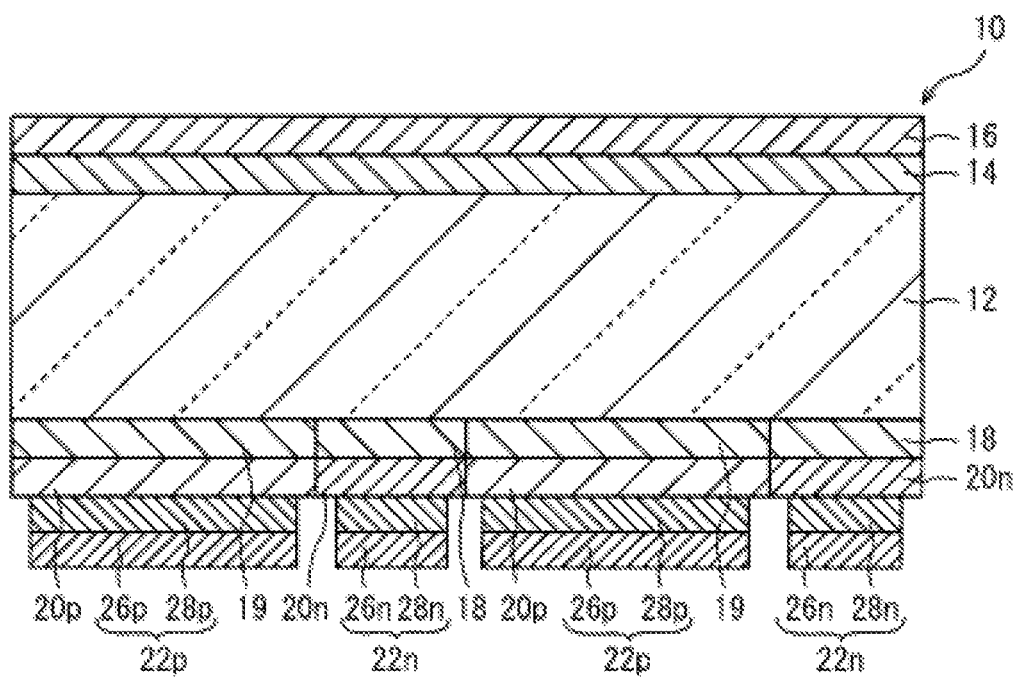
FIG. 2I is a sectional view illustrating a state where an electrode is formed on the silicon substrate illustrated in FIG. 2H.

Next, as illustrated in FIG. 2I, the electrodes 22n and 22p are formed. Accordingly, the photoelectric conversion element 10 which is an object is obtained.

The electrode 22n is formed by performing the heat treatment with respect to the conductive layer 25n and the conductive layer 27n. The electrode 22p is formed by performing the heat treatment with respect to the conductive layer 25p and the conductive layer 27p. The heat treatment is performed, for example, by using a hot plate. The time for the heat treatment is, for example, 15 minutes. It is preferable that the temperature of the heat treatment is 125° C. to 200° C. The heat treatment is performed, for example, in the atmosphere. The heat treatment may be performed in the inert atmosphere or in a vacuum. The heat treatment may be performed by some processes, after the conductive layers 25n and 25p and the conductive layers 27n and 27p are formed.

For example, when manufacturing the module, or the like, the heat treatment may be performed. More specifically, when soldering the electrode, a necessary heat treatment may be performed for melting the solder. In addition, on the electrode 22n and the electrode 22p, further, a conductive film may be formed. In addition, in a case where the soldering is performed on the electrodes 22n and 22p to be connected to an external wiring, a part of or the entirety of conductive layers 26n and 26p may be alloyed with solder. In other words, the conductive layers 26n and 26p may include an alloy of tin (Sn) which is the main component of the solder, as the first metal. In this case, the conductive layers 28n and 28p function as a barrier layer, and it is possible to prevent the solder from penetrating the conductive layers 28n and 28p and from reaching the semiconductor layer (the n-type non-crystalline silicon layer 20n, the p-type non-crystalline silicon layer 20p). In particular, in a case where oxygen is contained in the conductive layers 28n and 28p, the conductive layers 28n and 28p effectively function as the barrier layer. Furthermore, when the solder reaches the semiconductor layer (the n-type non-crystalline silicon layer 20n, the p-type non-crystalline silicon layer 20p), the passivation performance deteriorates and the open-circuit voltage (Voc) is likely to decrease.

In addition, after performing the heat treatment or the like and growing the metal crystal grain having a desired size, on the electrodes 22n and 22p, the conductive film may further be formed. In this case, it is possible to determine the boundary between the electrode 22n and the conductive film, and between the electrode 22p and the conductive film, from discontinuity of distribution of the metal crystal grain, discontinuity of composition, or the like.

[Average Crystal Grain Size]

In the photoelectric conversion element 10, by making the average crystal grain size of the plurality of metal crystal grains (hereinafter, simply referred to as an average crystal grain size) included in the conductive layers 26n and 26p greater than the thickness of the conductive layers 26n and 26p, it is possible to improve the element characteristics. Hereinafter, this will be described. In addition, after performing the heat treatment or the like and growing the metal crystal grain having the desired size, on the electrodes 22n and the electrode 22p, further, the conductive film is formed. In this case, the relationship between the average crystal grain size on the conductive layer on which the metal crystal grain having the desired size is formed, and the thickness of the conductive layer, may satisfy the above-described conditions.

The average crystal grain size is obtained by analyzing the front surfaces of the conductive layers 26n and 26p by an electron backscatter diffraction pattern. The conductive layers 26n and 26p include the plurality of metal crystal grains.

The average crystal grain size is an average of a product of the crystal grain size of each metal crystal grain and an area occupying ratio. The crystal grain size is obtained by the following equation (1).

$$\text{Crystal grain size} = 2 \times \{(\text{area of crystal grain})/\pi\}^{1/2} \quad (1)$$

The "area of crystal grain" in the equation (1) is measured by using the electron backscatter diffraction pattern. The equation (1) assumes that the calculation is performed on the assumption that the area of the crystal grain is an area of a circle, and on the assumption that the crystal grain size is the diameter of the circle. When obtaining the crystal grain size, a corresponding grain boundary of sigma 3 (Σ3) is not handled as a grain boundary. In addition, in a case where deviation of the crystal orientation is equal to or less than 10 degrees, the same crystal grain is achieved.

The area occupying ratio is obtained by dividing the area of the metal crystal grain by the area of the measurement region. Here, the area of the metal crystal grain is the area when orthographic projection is performed on a plane perpendicular to the thickness direction of the silicon substrate 12. The measurement region is 8 μm×23 μm. Furthermore, the metal crystal grain including the boundary of the measurement region is not included in the calculation of the average crystal grain size.

In a case of being viewed from the thickness direction of the silicon substrate 12, the crystal orientation of the metal crystal grain is preferentially orientated to <111>. In this case, since the crystal orientation of the metal crystal grain is aligned, uniformity of a work function of the metal crystal grain on the interface between the conductive layer 26n and the conductive layer 28n, and a work function of the metal crystal grain on the interface between the conductive layer 26p and the conductive layer 28p, is improved. As a result, it is possible to suppress irregularity of the contact resistance. In addition, work functions of a {110} surface, a {100} surface, and a {111} surface of silver, are respectively 4.52 eV, 4.64 eV, and 4.74 eV. The work function of the {111} surface is the largest. Therefore, by making the surface orientation of the metal crystal grain preferentially oriented to {111}, in particular, an effect of reducing the contact resistance between the p-type non-crystalline silicon layer 20p and the electrode 22p, is achieved.

In a case where a metal film 21n is heat-treated at 150° C. for 15 minutes, a ratio of occupying the conductive layer 28n by the metal crystal grain having the crystal orientation of the <111> direction within 10 degrees with respect to the thickness direction of the silicon substrate 12, is 61.0%. In a case where a metal film 21p is heat-treated at 150° C. for 15 minutes, a ratio of occupying the conductive layer 28p by the metal crystal grain having the crystal orientation of the <111> direction within 10 degrees with respect to the thickness direction of the silicon substrate 12, is 60.3%.

In a case where the film thickness of the conductive layer 26n is 0.5 μm, in the plurality of metal crystal grains, a ratio of occupying the conductive layer 26n by the metal crystal grain having the diameter which is equal to or greater than 0.5 μm, is 0.0% before the heat treatment, and is 28.4% after the heat treatment at 150° C. for 15 minutes. In a case where the film thickness of the conductive layer 26p is 0.5 μm, in the plurality of metal crystal grains, a ratio of occupying the conductive layer 26p by the metal crystal grain having the diameter which is equal to or greater than 0.5 μm, is 4.6% before the heat treatment, and is 30.6% after the heat treatment at 150° C. for 15 minutes.

Figure 3:
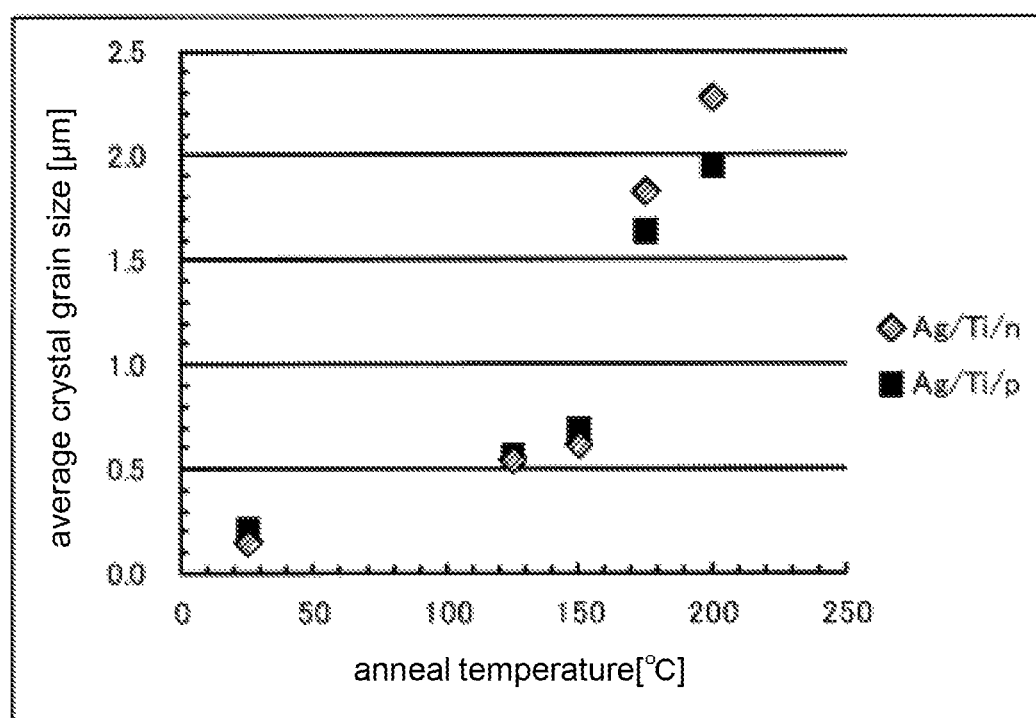
FIG. 3 is a graph illustrating a relationship between an average crystal grain size and the annealing temperature.

The average crystal grain size depends on the temperature (hereinafter, simply referred to as annealing temperature) when the conductive layers 25n and 25p and the conductive layers 27n and 27p are heat-treated. FIG. 3 is a graph illustrating a relationship between the average crystal grain size and the annealing temperature. FIG. 3 illustrates the average crystal grain size in a case where the annealing temperature is 25° C. This shows the average crystal grain size in a state where the heat treatment is not performed. As illustrated in FIG. 3, in the conductive layers 26n and 26p, by performing the heat treatment, the average crystal grain size becomes greater than the average crystal grain size when the heat treatment is not performed. In addition, as the annealing temperature increases, the average crystal grain size increases. Furthermore, in a general example of FIG. 3, the expression Ag/Ti/n illustrates a case where the conductive layer 27n made of titanium and the conductive layer 25n made of silver are formed on the n-type non-crystalline silicon layer 20n, and the expression Ag/Ti/p illustrates a case where the conductive layer 27p made of titanium and the conductive layer 25p made of silver are formed on the p-type non-crystalline silicon layer 20n.

Here, in the photoelectric conversion element 10, the conductive layers 27n and 27p contain titanium. Titanium is more likely to be oxidized than silver. Therefore, in the heat treatment when forming the electrodes 22n and 22p, by oxidizing the titanium, it is possible to suppress oxidization of silver. In other words, in order to increase the average crystal grain size, even when the heat treatment is performed, it is possible to suppress generation of high resistance silver oxide. In addition, by oxidizing the titanium, the n-type non-crystalline silicon layer 20n and the p-type non-crystalline silicon layer 20p are oxidized, and it is possible to effectively prevent the high resistance layer from being formed. In particular, since the p-type non-crystalline silicon layer 20p tends to be more likely to be oxidized than the n-type non-crystalline silicon layer 20n, it is effective to prevent oxidization of the p-type non-crystalline silicon layer 20p.

Figure 4:
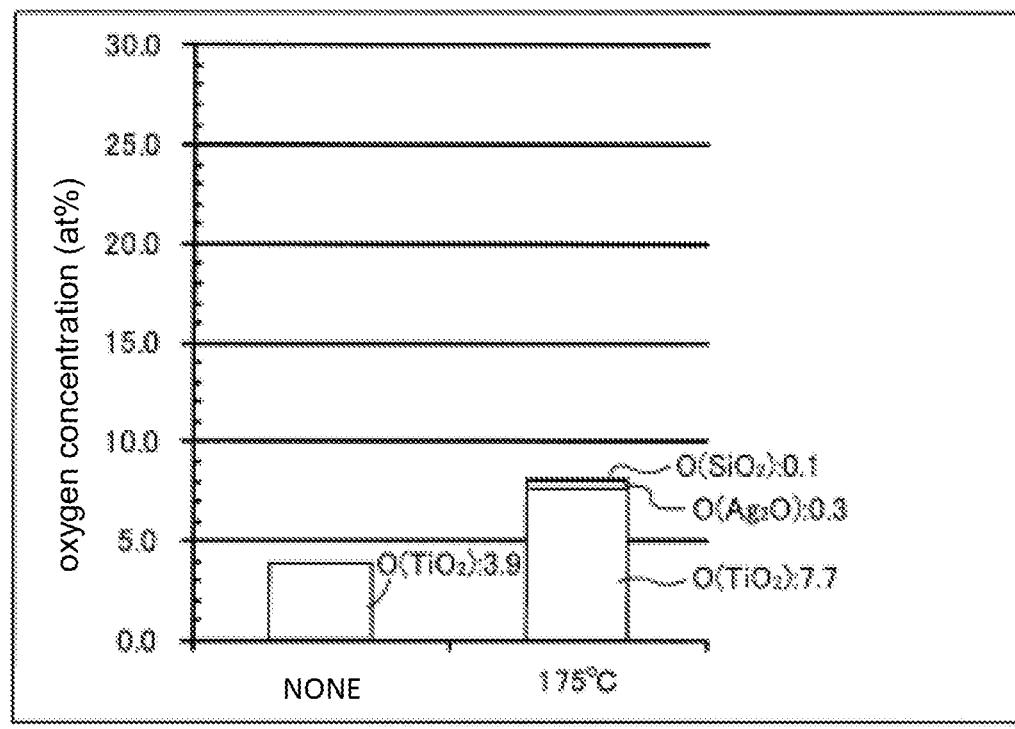
FIG. 4 is a graph illustrating a peak value of an oxygen concentration in the vicinity of an interface between an electrode provided with two conductive layers and the n-type non-crystalline silicon layer.
Figure 5:
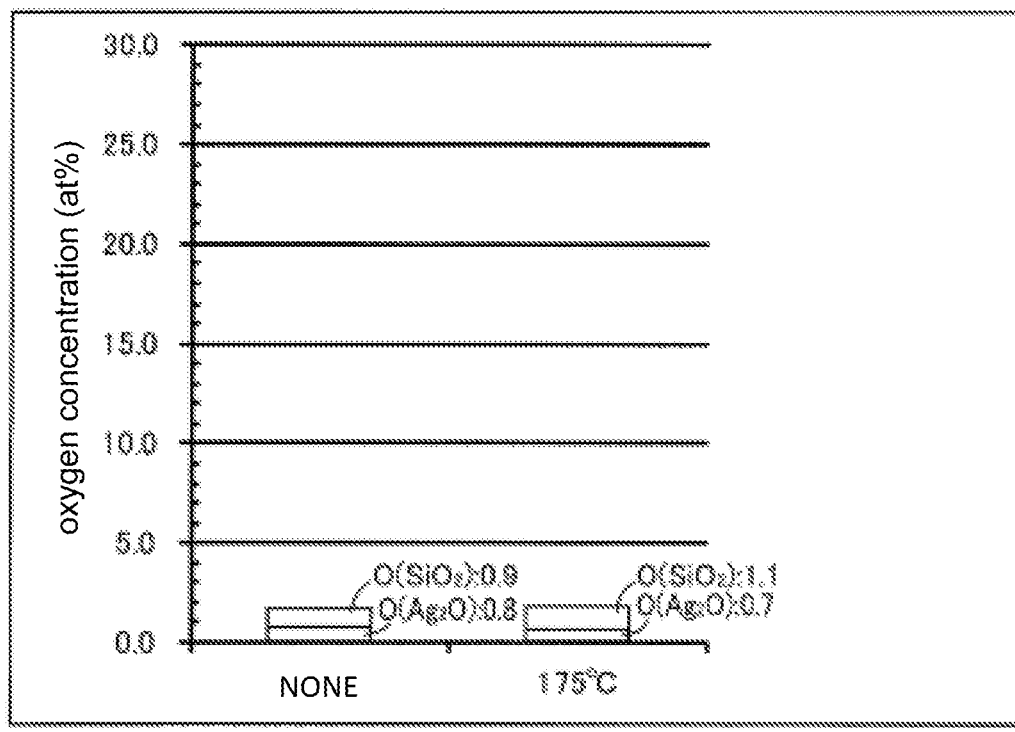
FIG. 5 is a graph illustrating the peak value of the oxygen concentration in the vicinity of the interface between the electrode and the n-type non-crystalline silicon layer, in a case where the electrode which is in contact with the n-type non-crystalline silicon layer is made of one conductive layer.
Figure 6:
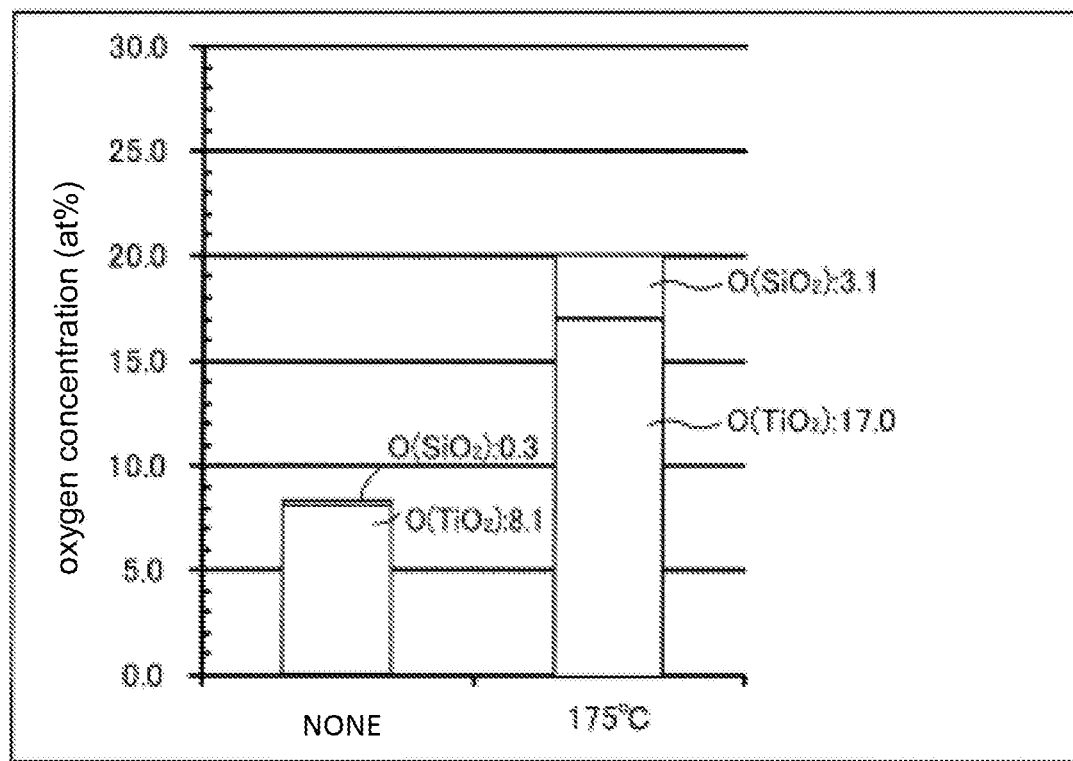
FIG. 6 is a graph illustrating the peak value of the oxygen concentration in the vicinity of an interface between the electrode provided with two conductive layers and the p-type non-crystalline silicon layer.
Figure 7:
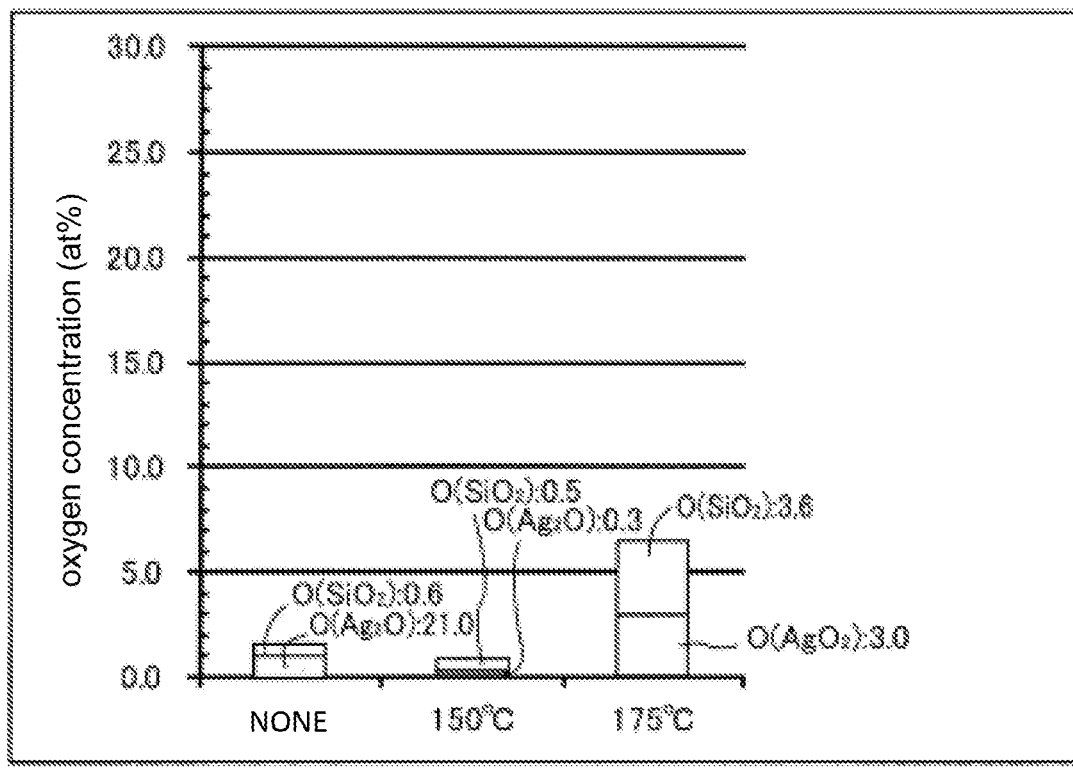
FIG. 7 is a graph illustrating the peak value of the oxygen concentration in the vicinity of the interface between the electrode and the p-type non-crystalline silicon layer, in a case where the electrode which is in contact with the p-type non-crystalline silicon layer is made of one conductive layer.

FIG. 4 illustrates a peak value of the oxygen concentration in the vicinity of the interface between the electrode 22n and the n-type non-crystalline silicon layer 20n. FIG. 5 illustrates the peak value of the oxygen concentration in the vicinity of the interface between the electrode and the n-type non-crystalline silicon layer 20n in a case where the electrode which is in contact with the n-type non-crystalline silicon layer 20n is made only of the conductive layer 26n. FIG. 6 illustrates a peak value of the oxygen concentration in the vicinity of the interface between the electrode 22p and the p-type non-crystalline silicon layer 20p. FIG. 7 illustrates a peak value of the oxygen concentration in the vicinity of the interface between the electrode and the p-type non-crystalline silicon layer 20p in a case where the electrode which is in contact with the p-type non-crystalline silicon layer 20p is made only of the conductive layer 26p. In addition, the peak values of the oxygen concentration illustrated in FIGS. 4 to 7 are measured by auger electron spectroscopy. In addition, the numbers of horizontal axis illustrate the annealing temperature, and "none" illustrates a case where the heat treatment is not performed.

With reference to FIGS. 4 and 5, in a case where the electrode which is in contact with the n-type non-crystalline silicon layer 20n is the electrode 22n, compared to a case where the electrode which is in contact with the n-type non-crystalline silicon layer 20n is made only of the conductive layer 26n, oxidization of silver contained in the conductive layer 26n is suppressed. Specifically, in a case where the electrode which is in contact with the n-type non-crystalline silicon layer 20n is the electrode 22n, compared to a case where the electrode which is in contact with the n-type non-crystalline silicon layer 20n is made only of the conductive layer 26n, a detected amount of oxygen (O) contained in silver oxide ($Ag_2O$) becomes equal to or less than ½.

In addition, in a case where the electrode which is in contact with the n-type non-crystalline silicon layer 20n is the electrode 22n, compared to a case where the electrode which is in contact with the n-type non-crystalline silicon layer 20n is made only of the conductive layer 26n, the oxidization of silicon contained in the n-type non-crystalline silicon layer 20n is suppressed. Specifically, in a case where the electrode which is in contact with the n-type non-crystalline silicon layer 20n is the electrode 22n, compared to a case where the electrode which is in contact with the n-type non-crystalline silicon layer 20n is made only of the conductive layer 26n, a detected amount of oxygen (O) contained in silicon oxide ($SiO_2$) becomes equal to or less than 1/10.

In other words, titanium contained in the conductive layer 28n can suppress the oxidization of silver contained in the conductive layer 26n and the silicon contained in the n-type non-crystalline silicon layer 20n.

With reference to FIGS. 6 and 7, in a case where the electrode which is in contact with the p-type non-crystalline silicon layer 20p is the electrode 22p, compared to a case where the electrode which is in contact with the p-type non-crystalline silicon layer 20p is made only of the conductive layer 26p, the oxidization of silver contained in the conductive layer 26p is suppressed. Specifically, in a case where the electrode which is in contact with the p-type non-crystalline silicon layer 20p is the electrode 22p, compared to a case where the electrode which is in contact with the p-type non-crystalline silicon layer 20p is made only of the conductive layer 26p, oxygen (O) contained in silver oxide ($Ag_2O$) is not detected.

With reference to FIGS. 6 and 7, in a case where the electrode which is in contact with the p-type non-crystalline silicon layer 20p is the electrode 22p, compared to a case where the electrode which is in contact with the p-type non-crystalline silicon layer 20p is made only of the conductive layer 26p, the oxidization of silicon contained in the p-type non-crystalline silicon layer 20p is suppressed. Specifically, in a case where the electrode which is in contact with the p-type non-crystalline silicon layer 20p is the electrode 22p, compared to a case where the electrode which is in contact with the p-type non-crystalline silicon layer 20p is made only of the conductive layer 26p, a detected amount of oxygen (O) contained in silicon oxide ($SiO_2$) becomes less than 9/10.

In other words, titanium contained in the conductive layer 28p can suppress the oxidization of silver contained in the conductive layer 26p and the silicon contained in the p-type non-crystalline silicon layer 20p.

Figure 8:
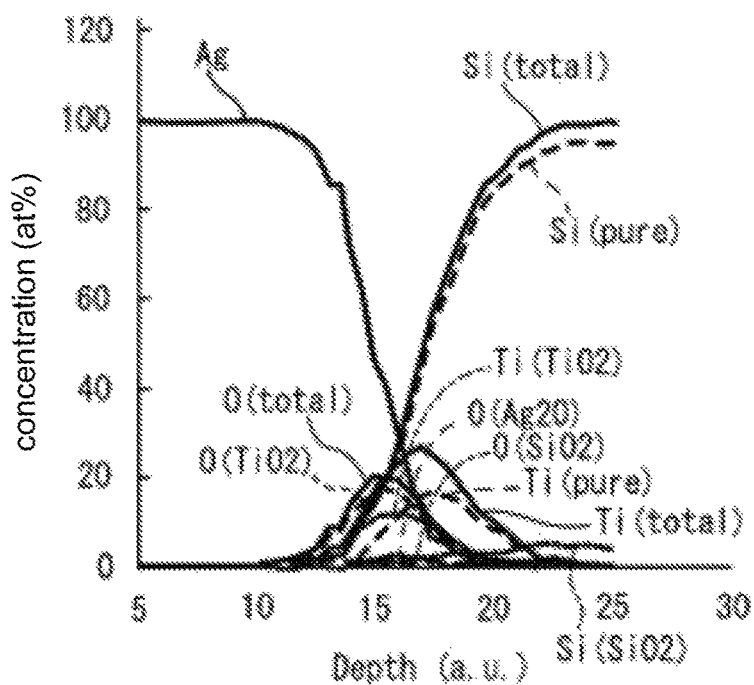
FIG. 8 is a graph illustrating a result of measuring a composition distribution of the electrode which is in contact with the p-type non-crystalline silicon layer when a heat treatment is performed at 175° C., in the depth direction, by auger electron spectroscopy.

FIG. 8 is a graph illustrating a result of measuring the composition distribution of the electrode 22p when the heat treatment is performed at 175° C., in the depth direction, by auger electron spectroscopy. As illustrated in FIG. 8, the maximum concentration of the oxygen atom in the conductive layer 28p is further on the side opposite to the semiconductor substrate 12 than the center of the conductive layer 28p in the film thickness direction.

Figure 9A:
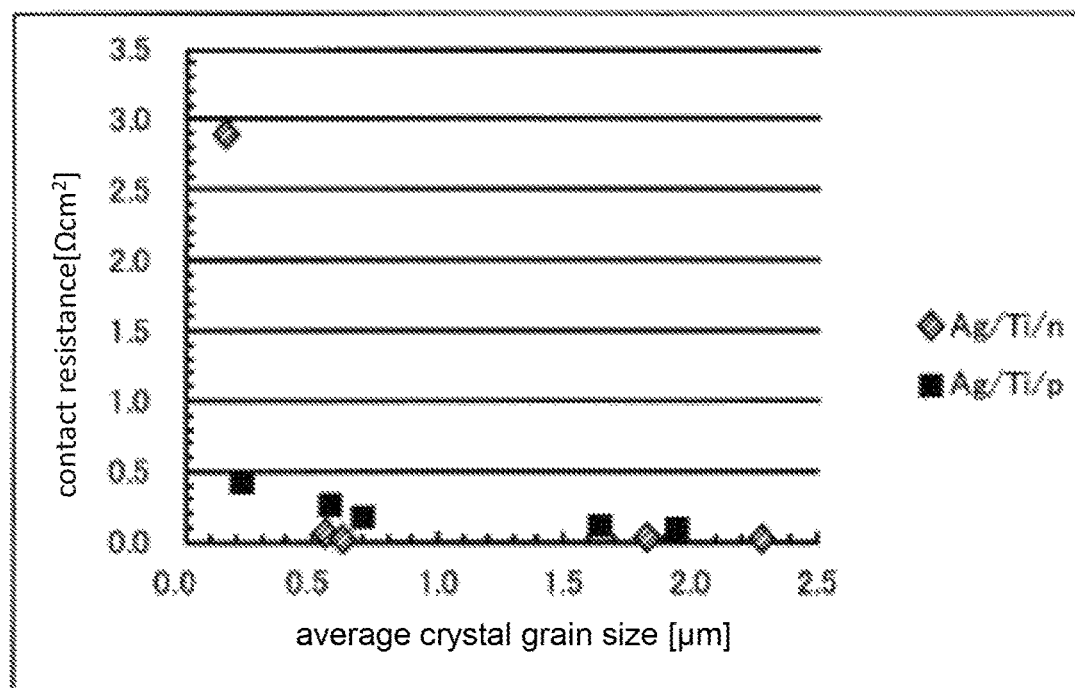
FIG. 9A is a graph illustrating a relationship between the average crystal grain size and the contact resistance.

FIG. 9A is a graph illustrating a relationship between the average crystal grain size and the contact resistance. In a general example of FIG. 9A, the expression Ag/Ti/n illustrates the contact resistance between the electrode 22n and the n-type non-crystalline silicon layer 20n, and the expression Ag/Ti/p illustrates the contact resistance between the electrode 22p and the p-type non-crystalline silicon layer 20p.

Figure 10:
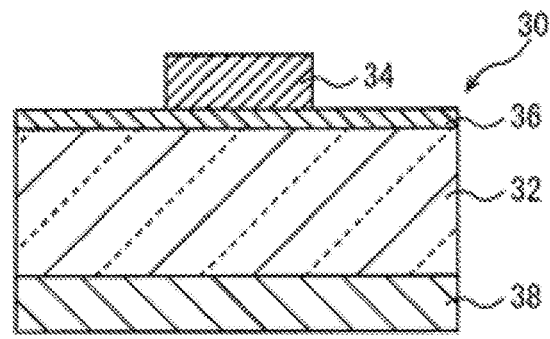
FIG. 10 is a sectional view illustrating a schematic configuration of a sample when the contact resistance is measured.

The contact resistance is measured by creating a sample 30 illustrated in FIG. 10 and using the sample 30. The sample 30 includes a silicon substrate 32, an electrode 34, a non-crystalline silicon layer 36, and an electrode 38.

In the contact resistance between the electrode 22n and the n-type non-crystalline silicon layer 20n, the electrode 34 is considered as the electrode 22n. In this case, the non-crystalline silicon layer 36 contains n-type impurities, and the silicon substrate 32 is an n-type silicon substrate. A resistance ratio of the n-type silicon substrate is equal to or less than 0.01 Ω·cm. The configuration and thickness of the electrode 34 are the same as the configuration and the thickness of the electrode 22n. The thickness and an impurities concentration of the non-crystalline silicon layer 36 are the same as those of the n-type non-crystalline silicon layer 20n. The thickness of the silicon substrate 32 is 300 μm.

In the contact resistance between the electrode 22p and the p-type non-crystalline silicon layer 20p, the electrode 34 is considered as the electrode 22p. In this case, the non-crystalline silicon layer 36 contains p-type impurities, and the silicon substrate 32 is a p-type silicon substrate. A resistance ratio of the p-type silicon substrate is equal to or less than 0.01 Ω·cm. The configuration and thickness of the electrode 34 are the same as the configuration and the thickness of the electrode 22p. The thickness and an impurities concentration of the non-crystalline silicon layer 36 are the same as those of the p-type non-crystalline silicon layer 20p.

In any case where the contact resistance between the electrode 22n and the n-type non-crystalline silicon layer 20n is measured, and where the contact resistance between the electrode 22p and the p-type non-crystalline silicon layer 20p is measured, the electrode 38 is a layered structure of titanium (Ti), palladium (Pd), and silver (Ag).

As described above, in the photoelectric conversion element 10, even when the heat treatment is performed at 125° C. to 200° C., generation of high resistance silver oxide on the conductive layers 26n and 26p can be suppressed. Therefore, by increasing the annealing temperature, and as illustrated in FIG. 9A, by increasing the average crystal grain size in the conductive layer 26n to be greater than the thickness (0.5 μm) of the conductive layer 26n, the contact resistance between the n-type non-crystalline silicon layer 20n and the electrode 22n can be reduced to be lower than the contact resistance in a state where the heat treatment is not performed. Specifically, the contact resistance between the n-type non-crystalline silicon layer 20n and the electrode 22n can be equal to or less than ⅔ of the contact resistance in a state where the heat treatment is not performed.

Here, as a reason why the contact resistance decreases by increasing the average crystal grain size, for example, the following reason is considered.

Figure 11:
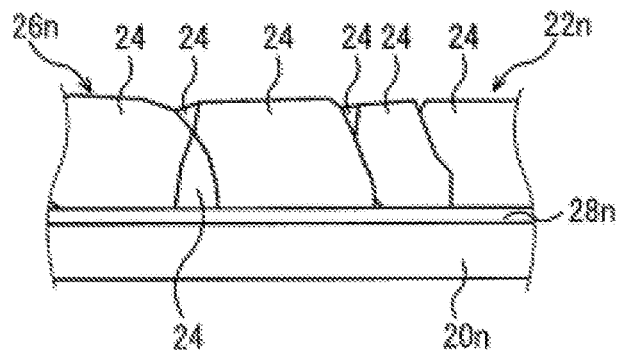
FIG. 11 is a schematic view illustrating an interface level of a metal crystal grain.

As illustrated in FIG. 11, it is considered that a high density interface level is present in the crystal grain boundary which is the interface between the metal crystal grains 24. In other words, as the crystal grain boundary becomes dense, the influence of the interface level increases.

Figure 12:
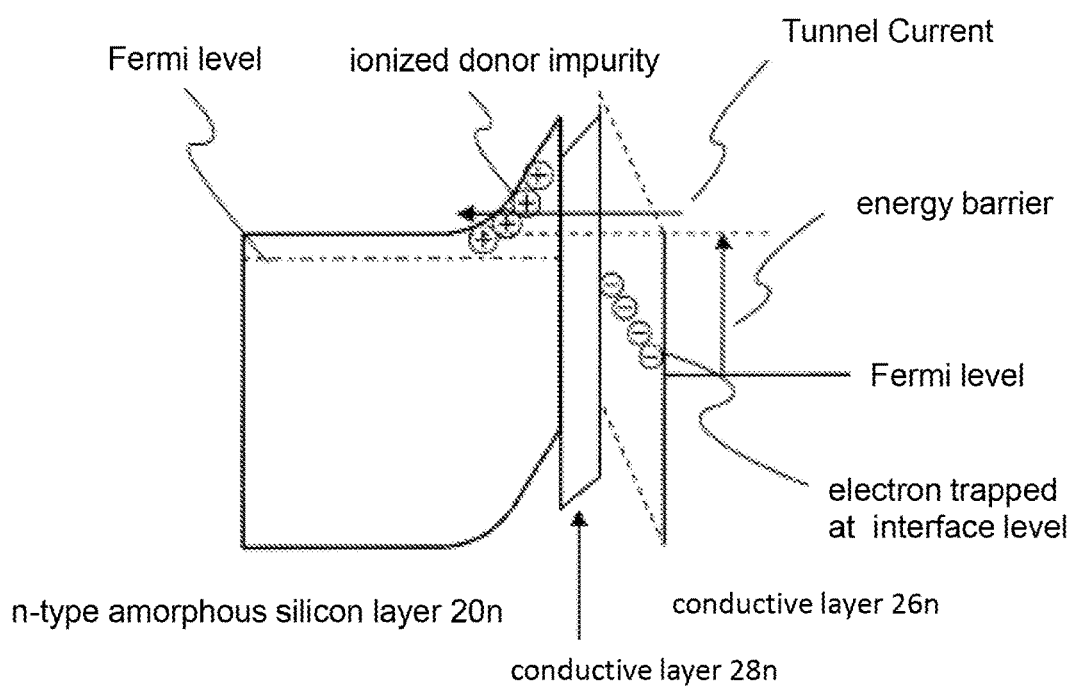
FIG. 12 is a band diagram of the interface between the electrode and the n-type non-crystalline silicon layer in a case where the metal crystal grain is small.

In a case where the metal crystal grain 24 is small, the interface level increases. Therefore, as illustrated in FIG. 12, a dipole is formed between donor impurities ionized in a depletion layer of the n-type non-crystalline silicon layer 20n, and an electron trapped to the interface level of the metal crystal train boundary. As a result, an energy barrier increases, non-ohmic properties are easily achieved, and the contact resistance increases. In addition, in FIG. 12, in order to make it easy to determine the influence of the interface level, it is described that an interface level region is present between titanium oxide (conductive layer 28n) and Ag (conductive layer 26n). In addition, a detailed band structure of titanium oxide TiOx (x<2) is not clear, but a case where the band gap is present is described.

Figure 13:
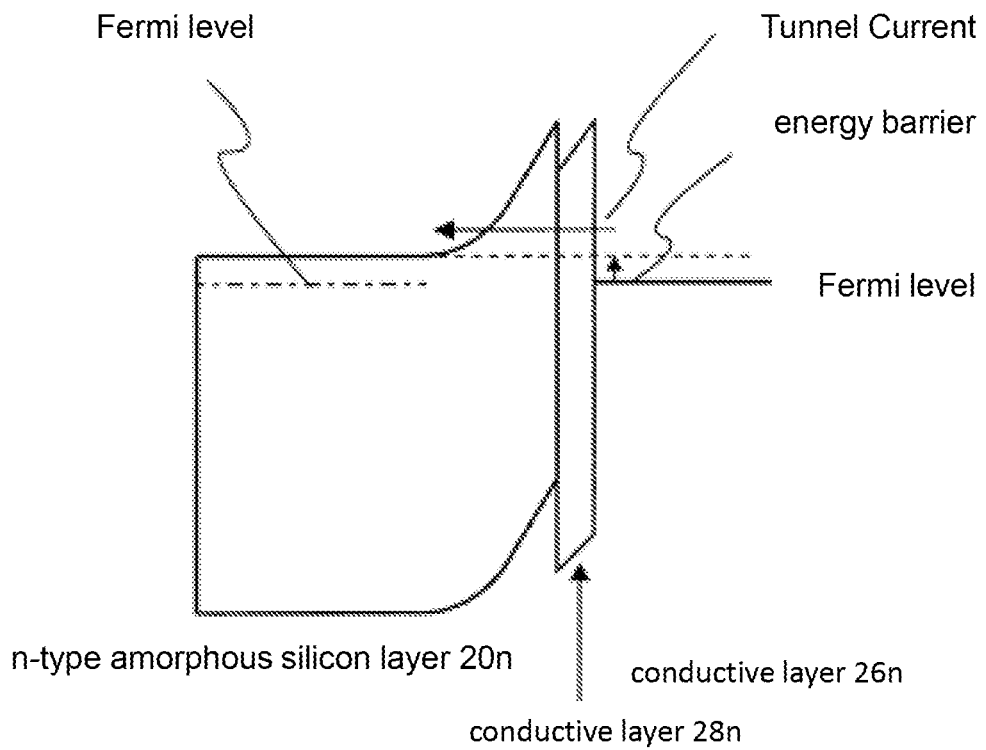
FIG. 13 is a band diagram of the interface between the electrode and the n-type non-crystalline silicon layer in a case where the metal crystal grain is large.

Meanwhile, in a case where the metal crystal grain 24 is large, the crystal grain boundary becomes small. Therefore, the interface level density effectively decreases. In this case, as illustrated in FIG. 13, band bending occurs so that a Fermi level of the n-type non-crystalline silicon layer 20n and a Fermi level of the electrode 22n match each other, and the depletion layer in the n-type non-crystalline silicon layer 20n is formed. In a case where the donor impurities concentration in the n-type non-crystalline silicon layer 20n is sufficiently high, the depletion layer width becomes sufficiently small, and a tunnel current flows. In this case, since an energy barrier between the n-type non-crystalline silicon layer 20n and the electrode 22n is small, ohmic properties are achieved, and the contact resistance becomes low. In other words, the contact resistance in a case where the crystal grain size of the metal crystal grain 24 is large can be low. Furthermore, when the average crystal grain size in the conductive layer 26n is greater than the film thickness of the conductive layer 26n, since most of the crystal grain boundary between the metal crystal grains 24 penetrate in the film thickness direction of the conductive layer 26n, the crystal grain boundary density becomes extremely low in the vicinity of the interface with the n-type non-crystalline silicon layer 20n, and the interface level density becomes extremely small. Therefore, it is preferable that the average crystal grain size in the conductive layer 26n is greater than the film thickness of the conductive layer 26n. (Similarly, it is preferable that the average crystal grain size in the conductive layer 26p is greater than the film thickness of the conductive layer 26p). Furthermore, even in a case where the conductive layer 28n is not provided, due to the same reason as described above, it is unlikely to receive the influence of the interface level as the metal crystal grain 24 increases, and the contact resistance decreases. Even in this case, it is preferable that the average crystal grain size in the conductive layer 26n is greater than the film thickness of the conductive layer 26n. The conductive layer 26p is also similar to this.

In addition, regarding the electrode 22p, the annealing temperature increases, and as illustrated in FIG. 9A, by making the average crystal grain size in the conductive layer 26p to be greater than the thickness (0.5 μm) of the conductive layer 26p, the contact resistance between the p-type non-crystalline silicon layer 20p and the electrode 22p can be decreased to be lower than the contact resistance in a state where the heat treatment is not performed. Specifically, the contact resistance between the p-type non-crystalline silicon layer 20p and the electrode 22p can be equal to or less than ⅙ of the contact resistance in a state where the heat treatment is not performed.

The reason why the contact resistance becomes low in a case where the average crystal grain size in the conductive layer 26p is greater than the thickness of the conductive layer 26p, is considered to be similar to the reason why the contact resistance becomes low in a case where the average crystal grain size in the conductive layer 26n is greater than the thickness of the conductive layer 26n.

Figure 9B:
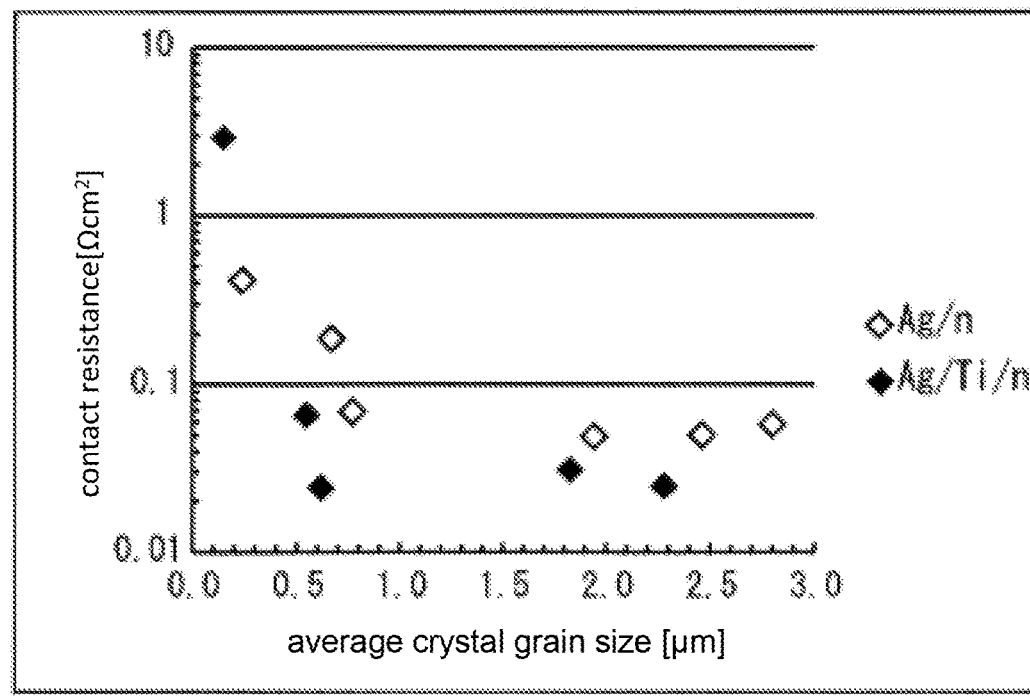
FIG. 9B is a graph illustrating a relationship between the average crystal grain size and the contact resistance.

FIG. 9B is a graph illustrating a relationship between the average crystal grain size and the contact resistance of the conductive layer 26n. In a general example of FIG. 9B, the expression Ag/Ti/n illustrates the contact resistance between the electrode 22n and the n-type non-crystalline silicon layer 20n, and the expression Ag/n illustrates the contact resistance with the n-type non-crystalline silicon layer 20n in a case where the conductive layer 28n is not provided in the electrode 22n. By providing the conductive layer 28n, it can be ascertained that the contact resistance is more remarkably reduced than in a case where the conductive layer 28n is not provided.

Figure 9C:
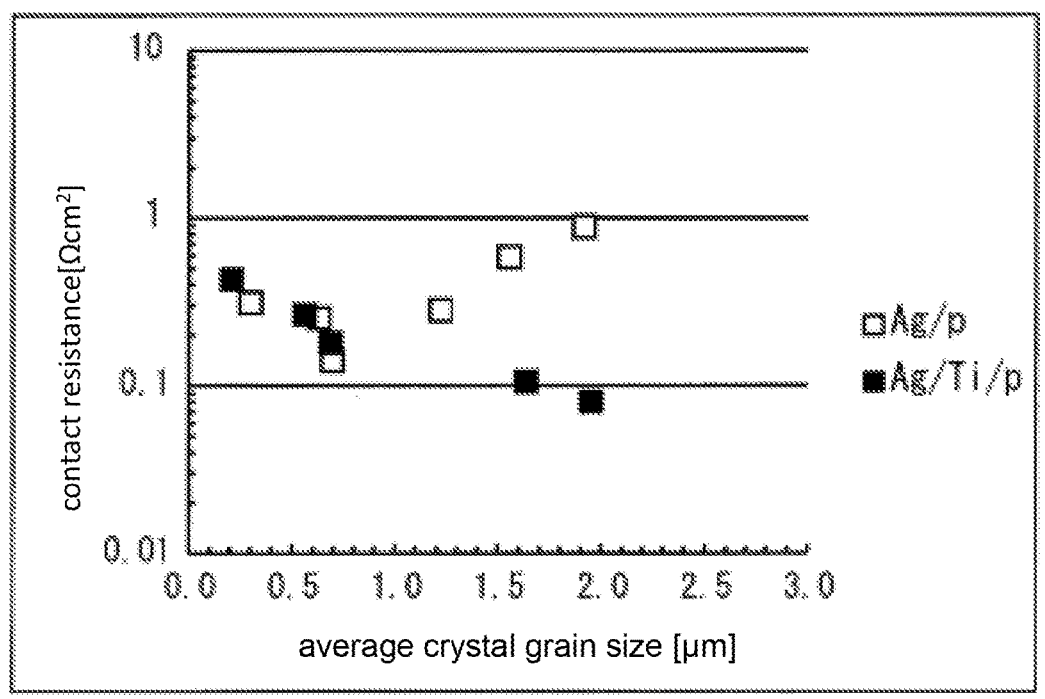
FIG. 9C is a graph illustrating a relationship between the average crystal grain size and the contact resistance.

FIG. 9C is a graph illustrating a relationship between the average crystal grain size and the contact resistance of the conductive layer 26p. In a general example of FIG. 9C, the expression Ag/Ti/p illustrates the contact resistance between the electrode 22p and the p-type non-crystalline silicon layer 20p, and the expression Ag/p illustrates the contact resistance with the n-type non-crystalline silicon layer 20p in a case where the conductive layer 28p is not provided in the electrode 22p. By providing the conductive layer 28p, it can be ascertained that the contact resistance is more remarkably reduced than in a case where the conductive layer 28p is not provided.

Figure 14:
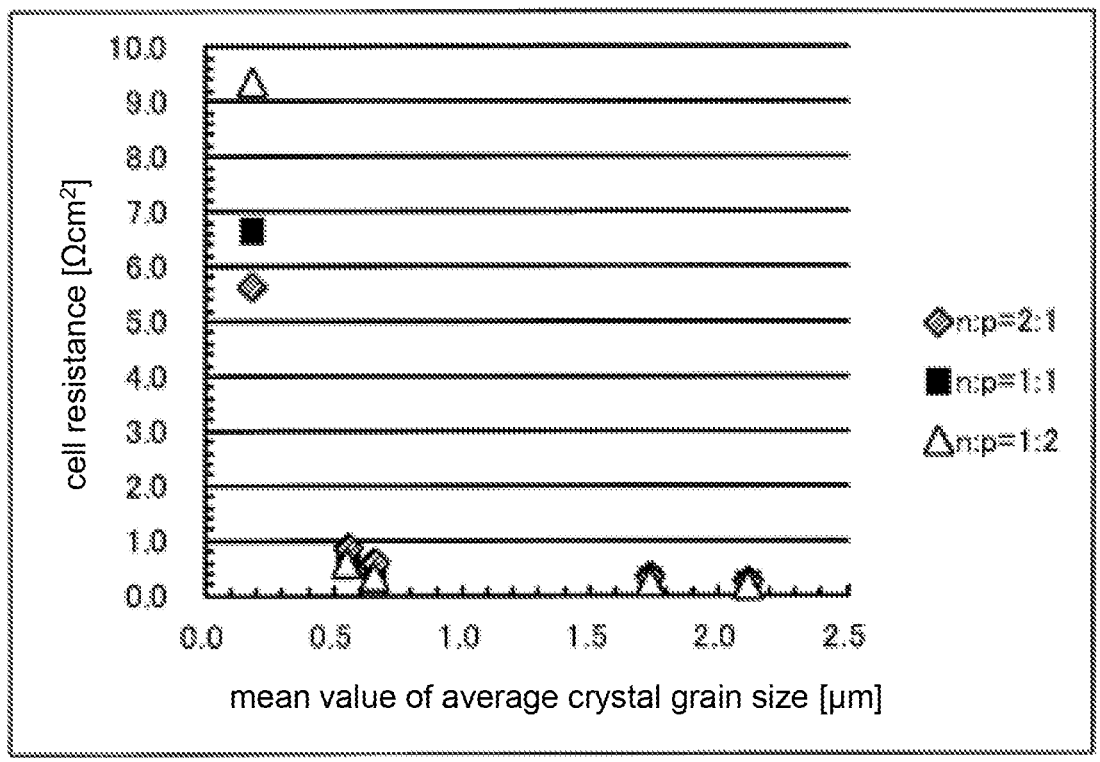
FIG. 14 is a graph illustrating a relationship between cell resistance and an average value of the average crystal grain size.

FIG. 14 is a graph illustrating a relationship between the contact resistance (cell resistance) per 1 cm$^2$ of a photoelectric conversion element, and an average value of the average crystal grain size. In FIG. 14, each expression in the general example, such as n:p=2:1, n:p=1:1, n:p=1:2, illustrates that ratios of the contact area between the electrode 22n and of the n-type non-crystalline silicon layer 20n, and the contact area between the electrode 22p and the p-type non-crystalline silicon layer 20p, are respectively 2:1, 1:1, and 1:2. The cell resistance is the contact resistance of the photoelectric conversion element 10 when a ratio of the contact area between the electrode 22n and the n-type non-crystalline silicon layer 20n, and the contact area between the electrode 22p and the p-type non-crystalline silicon layer 20p, is assumed. The average value of the average crystal grain size is an average value of the average crystal grain size in the electrode 22n and the average crystal grain size in the electrode 22p.

In a case where the contact area between the electrode 22n and the n-type non-crystalline silicon layer 20n is 1, and the contact area between the electrode 22p and the p-type non-crystalline silicon layer 20p is N, the cell resistance is obtained by the following equation (2).

Cell resistance={(the contact resistance between the electrode 22n and the n-type non-crystalline silicon layer 20n)×(1+N)}+{(the contact resistance between the electrode 22p and the p-type non-crystalline silicon layer 20p)×(1+N)/N}     (2)

As illustrated in FIG. 14, in a case where the average crystal grain size in the conductive layers 26n and 26p is greater than the thickness of the conductive layers 26n and 26p, the cell resistance becomes more remarkably lower than the cell resistance in a state where the heat treatment is not performed.

Figure 15:
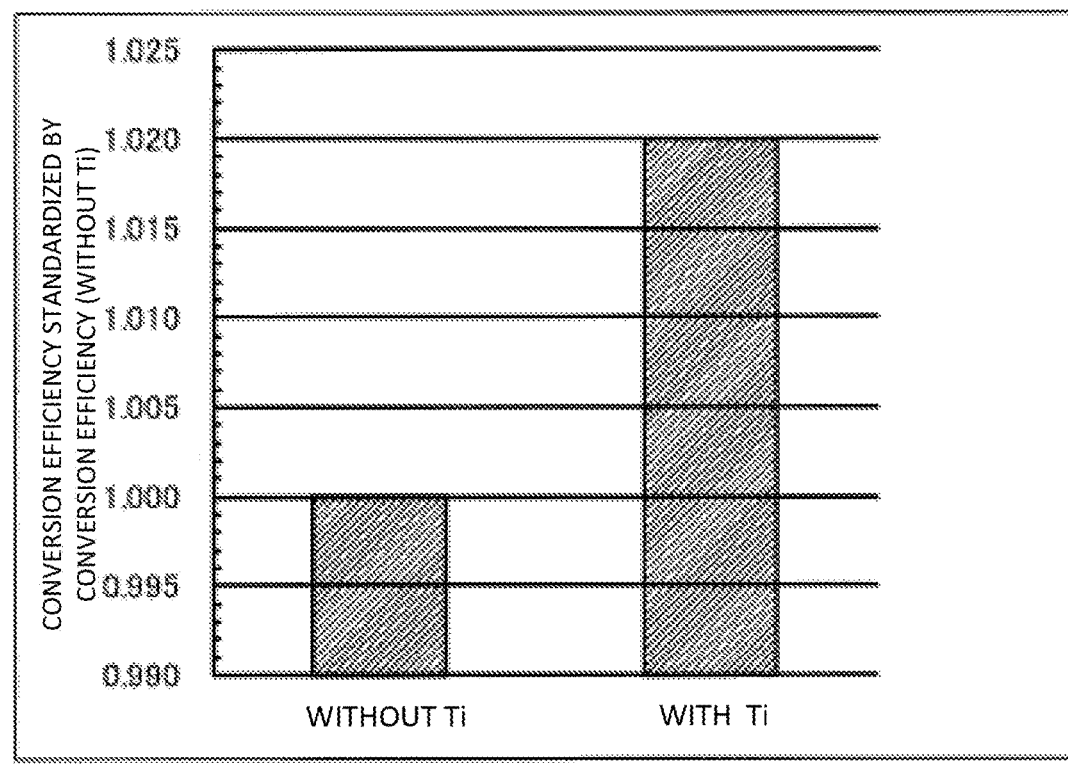
FIG. 15 is a graph illustrating a relationship between a change rate of conversion efficiency η and an electrode configuration.

FIG. 15 is a graph illustrating a relationship between the conversion efficiency η and an electrode configuration of the photoelectric conversion element 10. In FIG. 15, the conversion efficiency η is standardized by using a case where the electrode is configured only of the conductive layers 26n and 26p as a standard. In FIG. 15, the expression "without Ti" means a case where the electrode is configured only of the conductive layers 26n and 26p (a case where the conductive layers 28n and 28p are not provided), and the expression "with Ti" means a case where the conductive layers 28n and 28p are provided.

Figure 16:
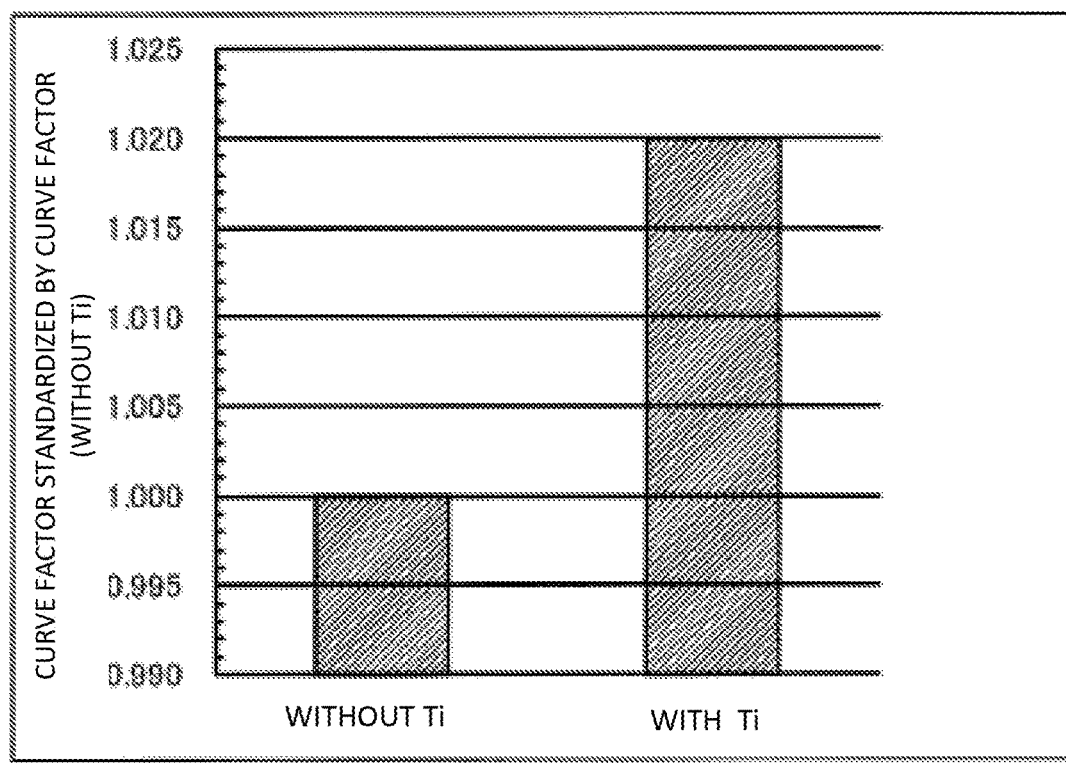
FIG. 16 is a graph illustrating a relationship between a change rate of a curve factor FF and the electrode configuration.

FIG. 16 is a graph illustrating a relationship between a curve factor FF and the electrode configuration. In FIG. 16, the curve factor FF is standardized by using a case where the electrode is configured only of the conductive layers 26n and 26p as a standard. In FIG. 16, the expression "without Ti" means a case where the electrode is configured only of the conductive layers 26n and 26p (a case where the conductive layers 28n and 28p are not provided), and the expression "with Ti" means a case where the conductive layers 28n and 28p are provided.

As illustrated in FIGS. 15 and 16, in a case where the electrodes 22n and 22p are provided, compared to a case where the electrode is configured only of the conductive layers 26n and 26p, the element characteristics (specifically, the conversion efficiency η and the curve factor FF) are improved. In particular, the curve factor FF is improved because the contact resistance between the n-type non-crystalline silicon layer 20n and the electrode 22n and the contact resistance between the p-type non-crystalline silicon layer 20p and the electrode 22p become low by performing the heat treatment.

In other words, in the photoelectric conversion element 10, since the contact resistance between the n-type non-crystalline silicon layer 20n and the electrode 22n and the contact resistance between the p-type non-crystalline silicon layer 20p and the electrode 22p can become low, it is possible to improve the curve factor FF. As a result, it is possible to improve the conversion efficiency η.

Figure 17:
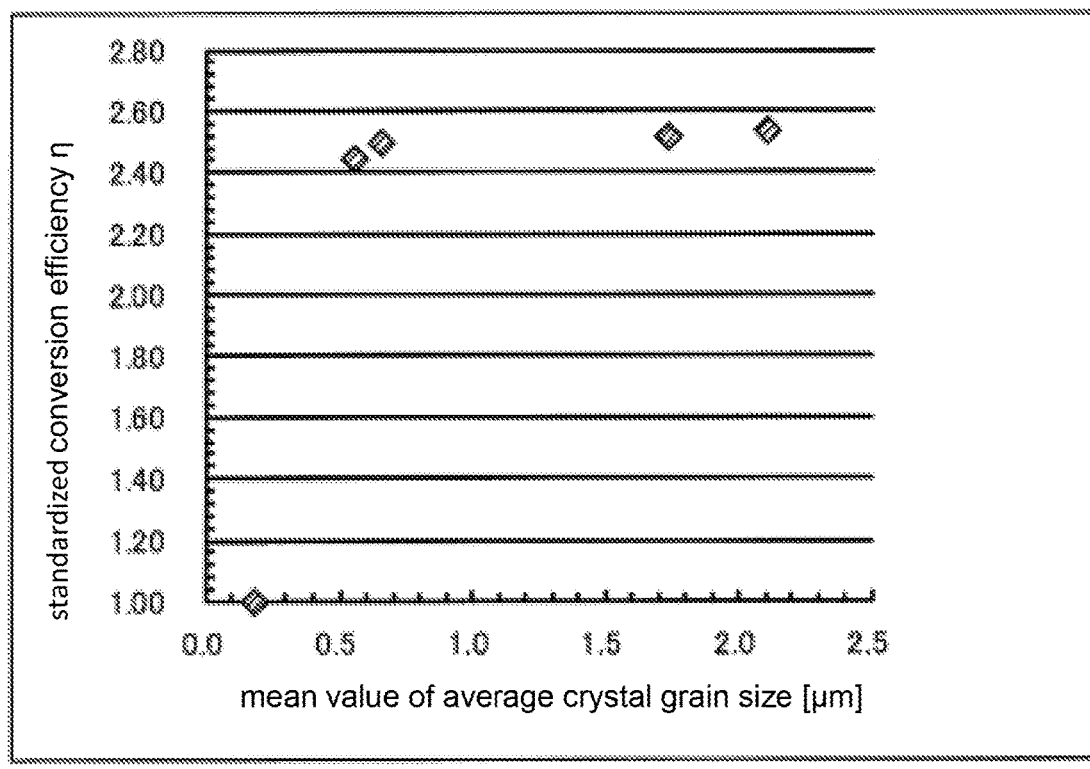
FIG. 17 is a graph illustrating a relationship between the change rate of the conversion efficiency η and the average crystal grain size.

FIG. 17 is a graph illustrating a relationship between the conversion efficiency η and the average crystal grain size of the photoelectric conversion element 10. The conversion efficiency η is standardized by using the conversion efficiency η in a state where the heat treatment is not performed as a reference. The average value of the average crystal grain size is a value obtained by averaging the average crystal grain size of the plurality of metal crystal grains contained in the conductive layer 26n, and the average crystal grain size of the plurality of metal crystal grains contained in the conductive layer 26p.

Figure 18:
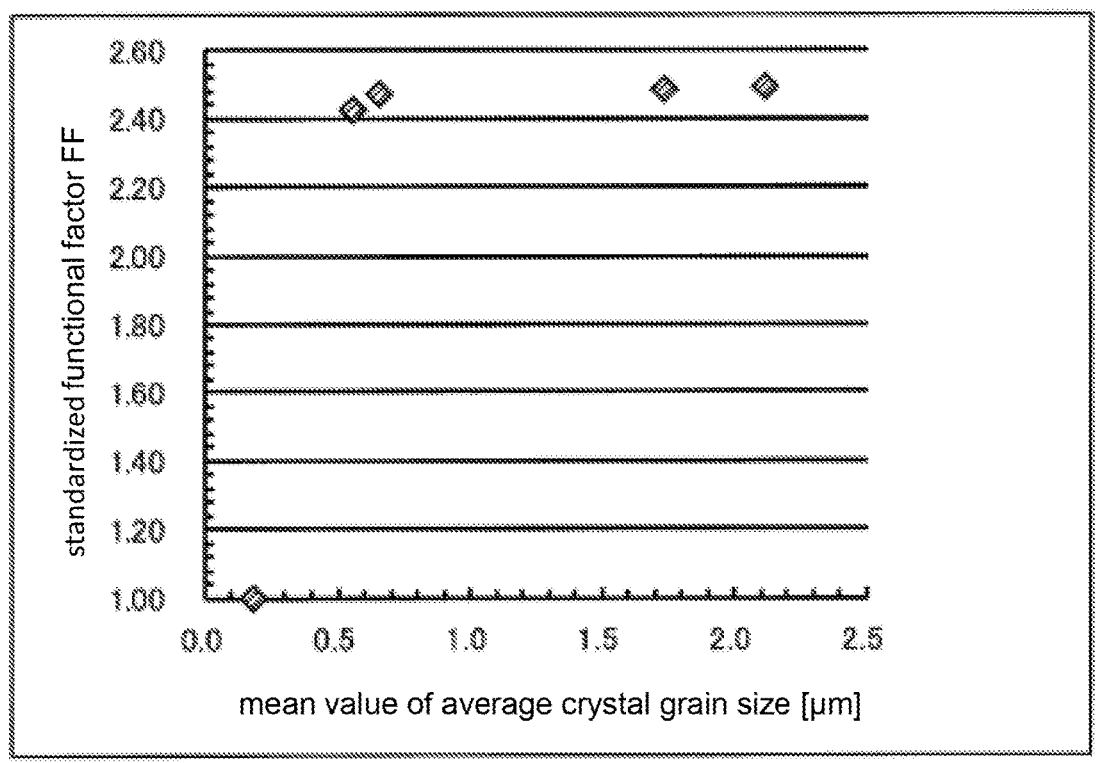
FIG. 18 is a graph illustrating a relationship between the change rate of the curve factor FF and the average crystal grain size.

FIG. 18 is a graph illustrating a relationship between the curve factor FF and the average crystal grain size of the photoelectric conversion element 10. The curve factor FF is standardized by using the curve factor FF in a state where the heat treatment is not performed as a reference. The average value of the average crystal grain size is a value obtained by averaging the average crystal grain size of the plurality of metal crystal grains contained in the conductive layer 26n, and the average crystal grain size of the plurality of metal crystal grains contained in the conductive layer 26p.

FIGS. 17 and 18 illustrate the measurement result of a case where the thickness of the conductive layers 26n and 26p is 0.5 μm. As illustrated in FIGS. 17 and 18, in a case where the average crystal grain size is greater than the thickness of the conductive layers 26n and 26p, the element characteristics (specifically, the conversion efficiency η and the curve factor FF) are improved.

The average value of the average crystal grain size is preferably 0.56 μm or greater. In this case, as illustrated in FIGS. 17 and 18, the element characteristics are improved.

[Modification Example of Photoelectric Conversion Element 10]

The photoelectric conversion element according to the embodiments of the present invention may have the following configurations.

Modification Example 1

Figure 19:
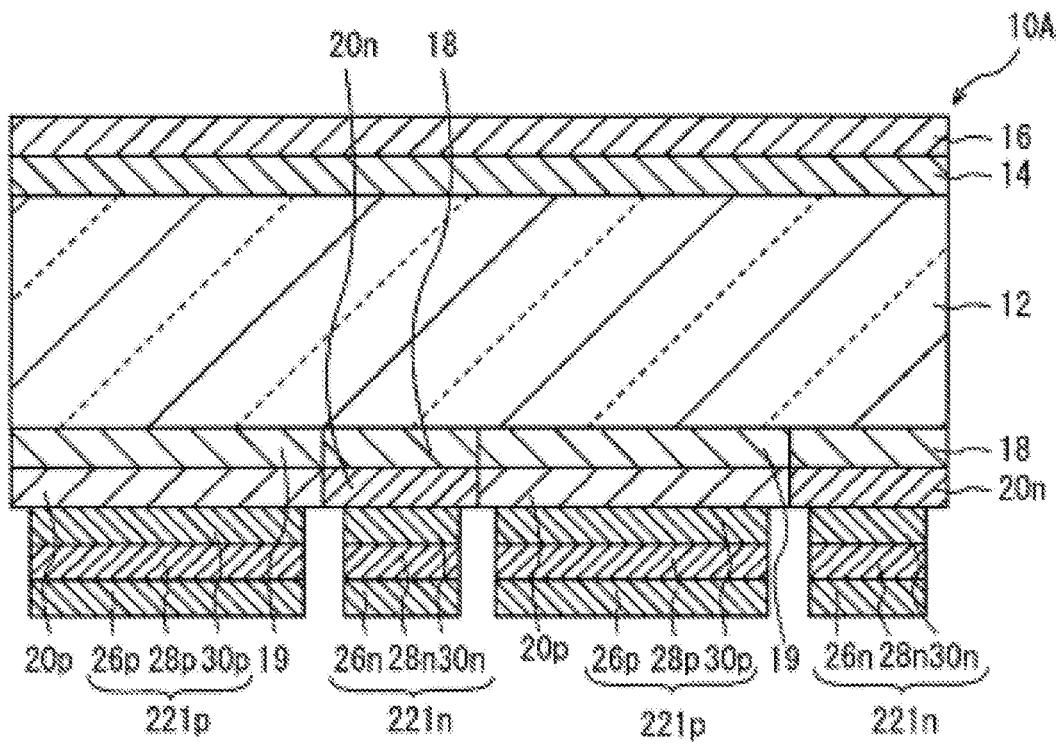
FIG. 19 is a sectional view illustrating a schematic configuration of a photoelectric conversion element according to a modification example 1 of the first embodiment of the present invention.

FIG. 19 is a sectional view illustrating an example of a schematic configuration of a photoelectric conversion element 10A according to a modification example 1 of the embodiment. As illustrated in FIG. 19, the photoelectric conversion element 10A is different compared to the photoelectric conversion element 10 in that conductive layers 30n and 30p are further provided respectively between the conductive layer 28n and the n-type non-crystalline silicon layer 20n, and between the conductive layer 28p and the p-type non-crystalline silicon layer 20p, in electrodes 221n and 221p. The conductive layer 30n has third metal which is more unlikely to be oxidized than the second metal contained in the conductive layer 28n, as a main component. The conductive layer 30p has the third metal which is more unlikely to be oxidized than the second metal contained in the conductive layer 28p, as a main component.

The conductive layers 30n and 30p are made of, for example, silver, as an example of the third metal. The conductive layers 30n and 30p may contain metal other than silver. Since the reflection ratio increases as the ratio of silver increases, the photoelectric conversion efficiency increases. The containing ratio (composition ratio) of silver in the conductive layers 30n and 30p is preferably 50% or more, more preferably 80% or more, and still more preferably 90% or more. Instead of silver, gold or platinum may be used. The thickness of the conductive layers 30n and 30p is, for example, 50 nm to 1000 nm. The conductive layer 30n is formed to be in contact with the conductive layer 28n and the n-type non-crystalline silicon layer 20n. The conductive layer 30p is formed to be in contact with the conductive layer 28p and the p-type non-crystalline silicon layer 20p.

(Manufacturing Method)

A manufacturing method of the photoelectric conversion element 10A in the embodiment is, for example, as follows.

Figure 20A:
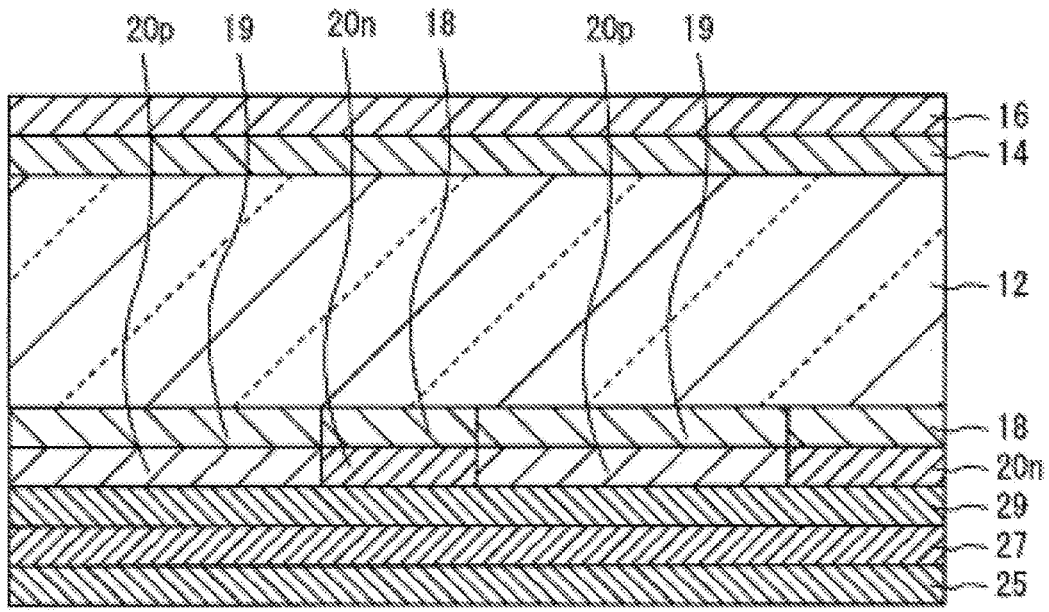
FIG. 20A is a view illustrating a process of manufacturing the electrode of the photoelectric conversion element illustrated in FIG. 19, and is a view illustrating a state where three conductive layers which configure the electrode are formed on the silicon substrate.
Figure 20B:
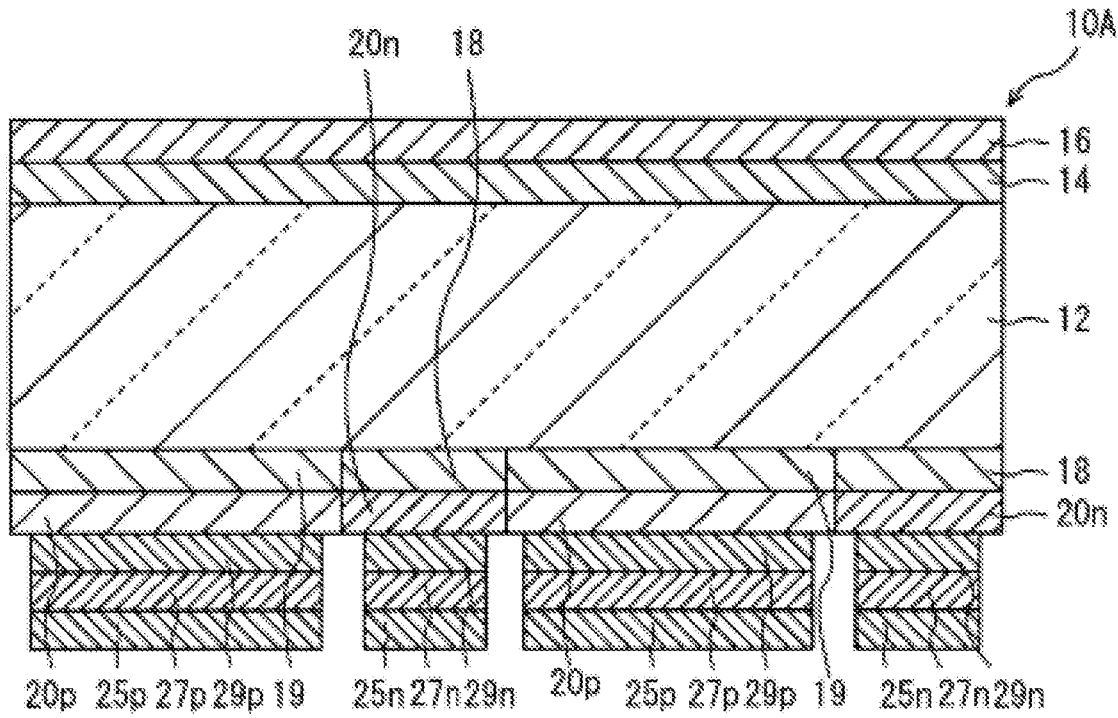
FIG. 20B is a view illustrating a state where three conductive layers illustrated in FIG. 20A are patterned.

First, in FIG. 2G in the first embodiment, after forming the reflection preventing film 16 on the passivation film 14, as illustrated in FIG. 20A, on the n-type non-crystalline silicon layer 20n and the p-type non-crystalline silicon layer 20p, by the deposition method or the sputtering method, a conductive layer 29 made of silver, a conductive layer 27 made of titanium, and a conductive layer 25 made of silver, are formed in order. Next, as illustrated in FIG. 20B, the conductive layer 25, the conductive layer 27, and the conductive layer 29 are patterned, and conductive layers 25A and 25B, conductive layers 27A and 27B, and conductive layers 29A and 29B are formed. The patterning is performed, for example, as follows. First, by the photolithography method or a printing method, the resist pattern which serves as a mask is formed on the conductive layer 25 made of silver. In a case of being viewed in the thickness direction of the silicon substrate 12, the resist pattern is formed so that the boundary portion between the n-type non-crystalline silicon layer 20n and the p-type non-crystalline silicon layer 20p is opened. Next, in the conductive layer 29 made of silver, the conductive layer 27 made of titanium, and the conductive layer 25 made of silver, a part which is not covered with the resist is removed, for example, by the wet etching. After this, the resist is removed. Accordingly, as illustrated in FIG. 20B, conductive layers 29n and 29p are respectively formed on the n-type non-crystalline silicon layers 20n and 20p. The conductive layers 27n and 27p are respectively formed on the conductive layers 29n and 29p. In addition, the conductive layers 25n and 25p are respectively formed on the conductive layers 27n and 27p.

Figure 20C:
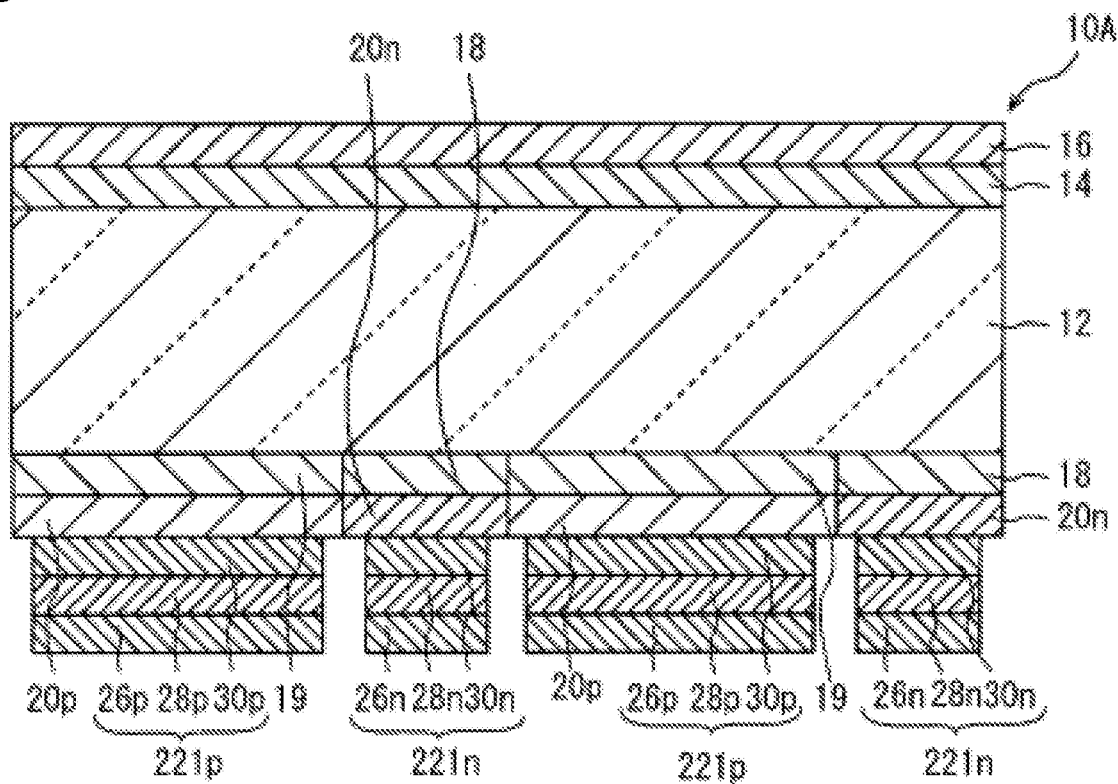
FIG. 20C is a view illustrating a state where the conductive layers illustrated in FIG. 20B are heat-treated and the electrode is formed.

Next, as illustrated in FIG. 20C, by performing the heat treatment with respect to the conductive layers 29n and 29p, the conductive layers 27n and 27p, and the conductive layers 26n and 26p, the electrodes 221n and 221p are formed. The method and timing of performing the heat treatment are similar to those in the first embodiment.

Since the photoelectric conversion device 10A includes the conductive layers 28n and 28p in the electrodes 221n and 221p, even when the annealing is performed after forming the electrodes 221n and 221p, it is possible to prevent the conductive layers 26n and 26p, the conductive layers 30n and 30p, the n-type non-crystalline silicon layer 20n, and the p-type non-crystalline silicon layer 20p, from being oxidized and having high resistance. As a result, compared to a case where the conductive layers 28n and 28p are not provided, in the photoelectric conversion device 10A, the contact resistance between the electrode and the semiconductor layer (the n-type non-crystalline silicon layer 20n, the p-type non-crystalline silicon layer 20p) can be reduced by performing the annealing at higher temperature after forming the electrodes 22n and 22p, and the photoelectric conversion efficiency can be improved. Hereinafter, the reason thereof will be described.

By using the sample 30 illustrated in FIG. 10, the contact resistance between the electrode and the semiconductor layer is evaluated. In a case where the conductive type of the silicon substrate 32 is the n-type, the conductive type of the non-crystalline silicon layer 36 is set to be the n-type, and the film is formed on the condition as that of the n-type non-crystalline silicon layer 20n. In a case where the conductive type of the silicon substrate 32 is the p-type, the conductive type of a non-crystalline silicon 35 is set to be the p-type, and the film is formed on the same condition as that of the p-type non-crystalline silicon layer 20p. The electrode 38 on the rear surface of the silicon substrate 32 is the layered structure of titanium (Ti), palladium (Pd), and silver (Ag).

With respect to each of the conductive types of the non-crystalline silicon layer 36, as a structure of the electrode 34, six types of samples (hereinafter, samples A to F) including a layered film (Ag/Ti/Ag) in which a single layer film (Ag) of silver (Ag), silver (Ag), titanium (Ti), and silver (Ag) are layered in order, and a layered film (Ag/Ni/Ag) in which silver (Ag), nickel (Ni), and silver (Ag) are layered in order, are made.

Figures 21, 22A:
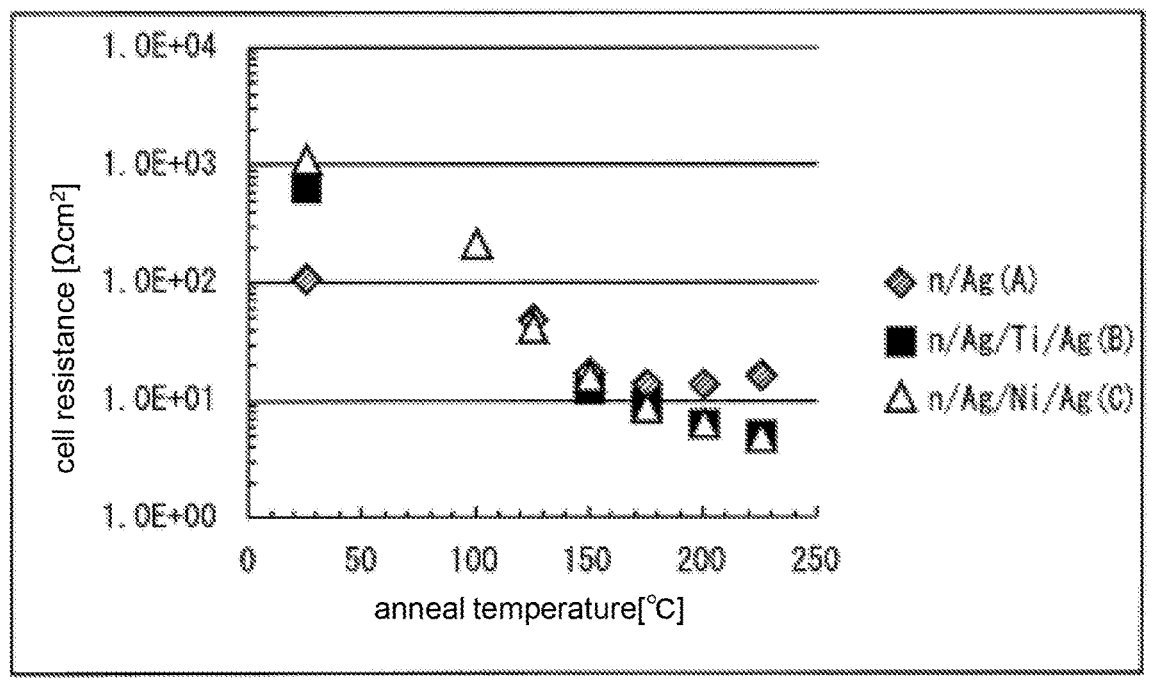
FIG. 21 is a view illustrating a configuration of the samples illustrated in FIG. 10.
FIG. 22A is a view illustrating a relationship between the contact resistance between the electrode and the non-crystalline silicon layer, and the annealing temperature, in samples A to C illustrated in FIG. 21.

FIG. 21 illustrates configurations of six types of samples A to F. The samples A and D of the single layer film (Ag) are made on the same condition as that of the above-described electrodes 22n and 22p except that the conductive layers 28n and 28p are not formed. The samples B and E of the layered film (Ag/Ti/Ag) are formed on the same condition as that of the electrodes 22n and 22p. The samples C and F of the layered film (Ag/Ni/Ag) are formed on the same condition as that of the electrodes 22n and 22p except that the nickel (Ni) is used instead of the titanium (Ti) as the conductive layers 28n and 28p.

FIG. 22A illustrates a relationship between the contact resistance between the electrode 34 and the non-crystalline silicon layer 36, and the annealing temperature, in the samples A to C.

In a case of the sample A (the electrode 34 is the single layer film Ag), the contact resistance between the electrode 34 and the non-crystalline silicon layer 36 (n-type) decreases as the annealing temperature increases at 175° C. or lower, and smoothly increases at 175° C. or higher.

In a case of the sample B (the electrode 34 is the layered film (Ag/Ti/Ag)) and the sample C (the electrode 34 is the layered film (Ag/Ni/Ag)), the contact resistance between the electrode 34 and the non-crystalline silicon layer 36 (n-type) decreases as the annealing temperature increases, and decreases to be lower than that of the sample A at 125° C. or higher.

Figure 22B:
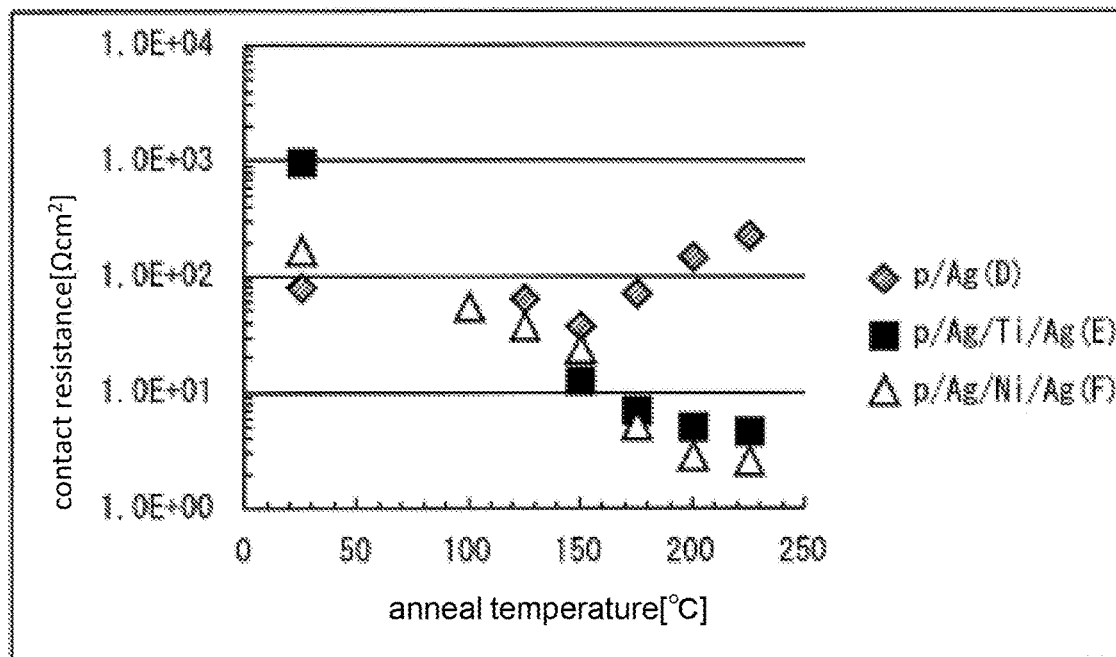
FIG. 22B is a view illustrating a relationship between the contact resistance between the electrode and the non-crystalline silicon layer, and the annealing temperature, in samples D to F illustrated in FIG. 21.

Next, FIG. 22B illustrates a relationship between the contact resistance between the electrode 34 and the non-crystalline silicon layer 36, and the annealing temperature, in the samples D to F.

In a case of the sample D (the electrode 34 is the single layer film Ag), the contact resistance between the electrode 34 and the non-crystalline silicon layer 36 (p-type) decreases as the annealing temperature increases at 150° C. or lower, and increases as the annealing temperature increases at 150° C. or higher.

In a case of the sample E (the electrode 34 is the layered film Ag/Ti/Ag) and the sample F (the electrode 34 is the layered film Ag/Ni/Ag), the contact resistance between the electrode 34 and the non-crystalline silicon layer 36 (p-type) decreases as the annealing temperature increases, and decreases to be lower than that of the sample D at 125° C. or higher. Furthermore, at 175° C. or higher, the contact resistance of the sample F decreases to be lower than that of the sample E.

As illustrated in FIGS. 22A and 22B, in a case where the conductive layers 28n and 28p are provided, compared to a case where the conductive layers 28n and 28p are not provided, it can be ascertained that the low contact resistance is obtained. This result appears particularly remarkably in a case where the conductive type of the semiconductor layer (non-crystalline silicon layer 36) is the p-type.

In addition, in the photoelectric conversion device 10A, while the photoelectric conversion efficiency of a case where the conductive layers 28n and 28p are not provided is 23.6%, the photoelectric conversion efficiency of the photoelectric conversion device 10A is 24.5%.

In the photoelectric conversion device 10A, the conductive layers 28n and 28p contain titanium. Titanium is more likely to be oxidized than silver. Therefore, in the heat treatment when forming the electrodes 221n and 221p, by oxidizing the titanium, it is possible to suppress the oxidization of silver. In other words, in order to increase the average crystal grain size of the conductive layers 30n and 30p, even when the heat treatment is performed, it is possible to suppress generation of high resistance silver oxide. In addition, by oxidizing the titanium, the n-type non-crystalline silicon layer 20n and the p-type non-crystalline silicon layer 20p are oxidized, and it is possible to effectively prevent the high resistance layer from being formed. In particular, since the p-type non-crystalline silicon layer 20p tends to be more likely to be oxidized than the n-type non-crystalline silicon layer 20n, it is effective to prevent oxidization of the p-type non-crystalline silicon layer 20p. In addition, the conductive layers 30n and 30p are made of metal which is more unlikely to be oxidized than the conductive layers 28n and 28p similar to the conductive layers 26n and 26p. Therefore, the conductive layers 28n and 28p are more preferentially oxidized than the conductive layers 30n and 30p, the oxidization of the conductive layers 30n and 30p is suppressed. Therefore, high resistance more unlikely occurs between the n-type non-crystalline silicon layer 20n and the p-type non-crystalline silicon layer 20p and between the conductive layers 30n and 30p, than between the electrodes 22n and 22p which are not provided with the conductive layers 30 and 30p, and the photoelectric conversion efficiency can further be improved. Furthermore, in the photoelectric conversion device 10A, by using a material having high reflection ratio, such as silver, as the conductive layers 30n and 30p, since the light which penetrates the silicon substrate is efficiently reflected by the conductive layers 30n and 30p, compared to the photoelectric conversion device 10, it is possible to obtain high short-circuit current without damaging the contact resistance. Accordingly, the photoelectric conversion efficiency is further improved.

Figure 23A:
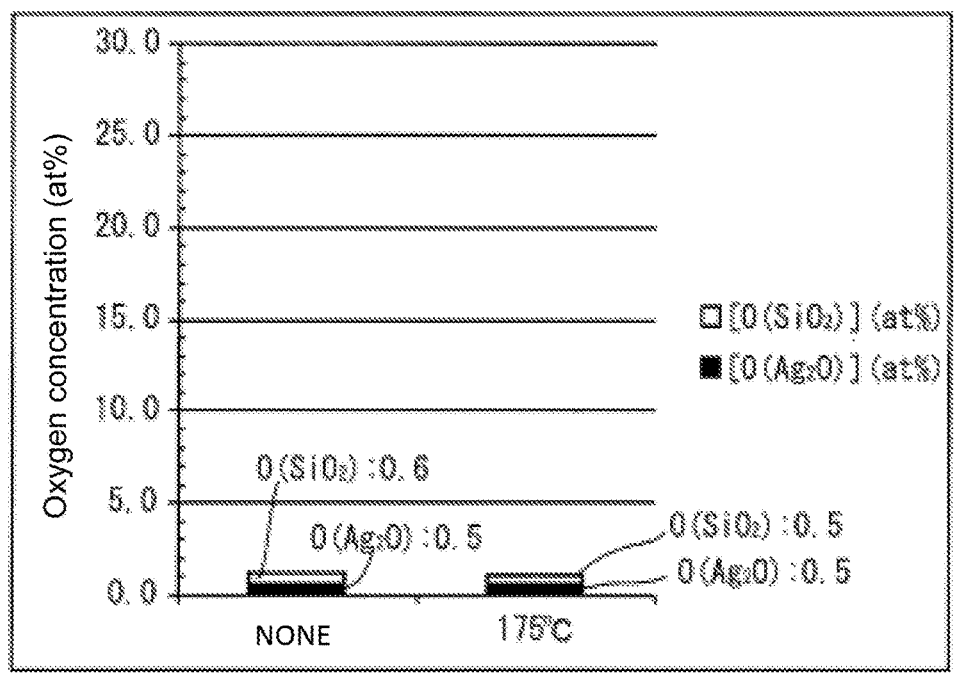
FIG. 23A is a view illustrating a peak value of the oxygen concentration in the vicinity of the interface between the electrode and the n-type non-crystalline silicon layer in the sample B illustrated in FIG. 21.
Figure 23B:
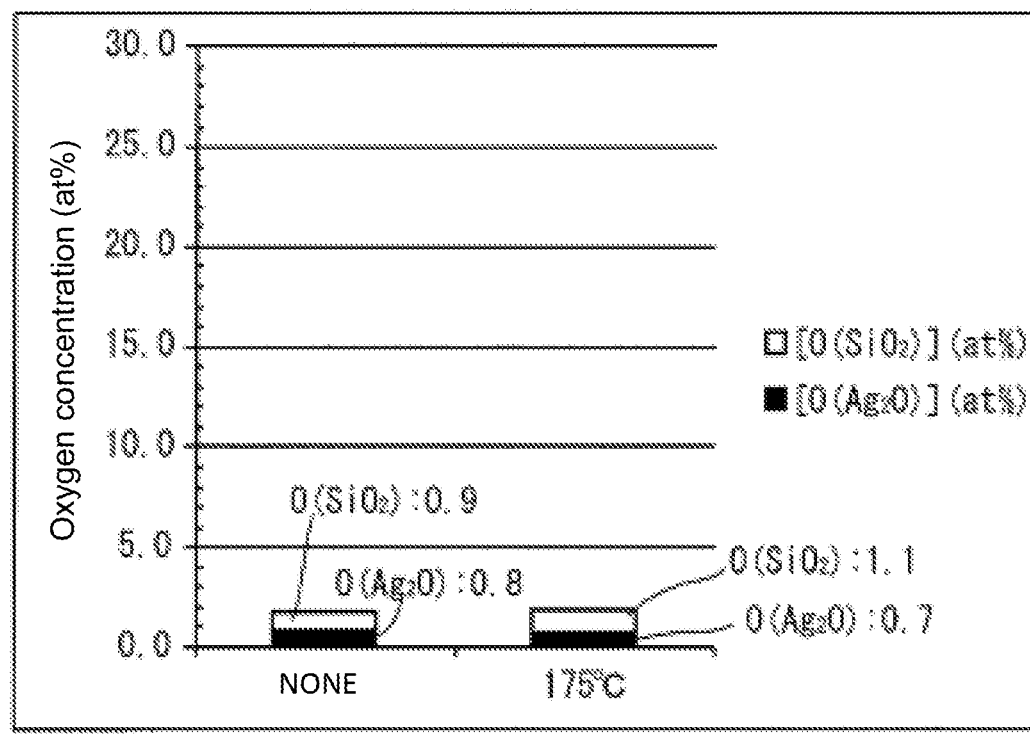
FIG. 23B is a view illustrating a peak value of the oxygen concentration in the vicinity of the interface between the electrode and the non-crystalline silicon layer in the sample A illustrated in FIG. 21.
Figure 23C:
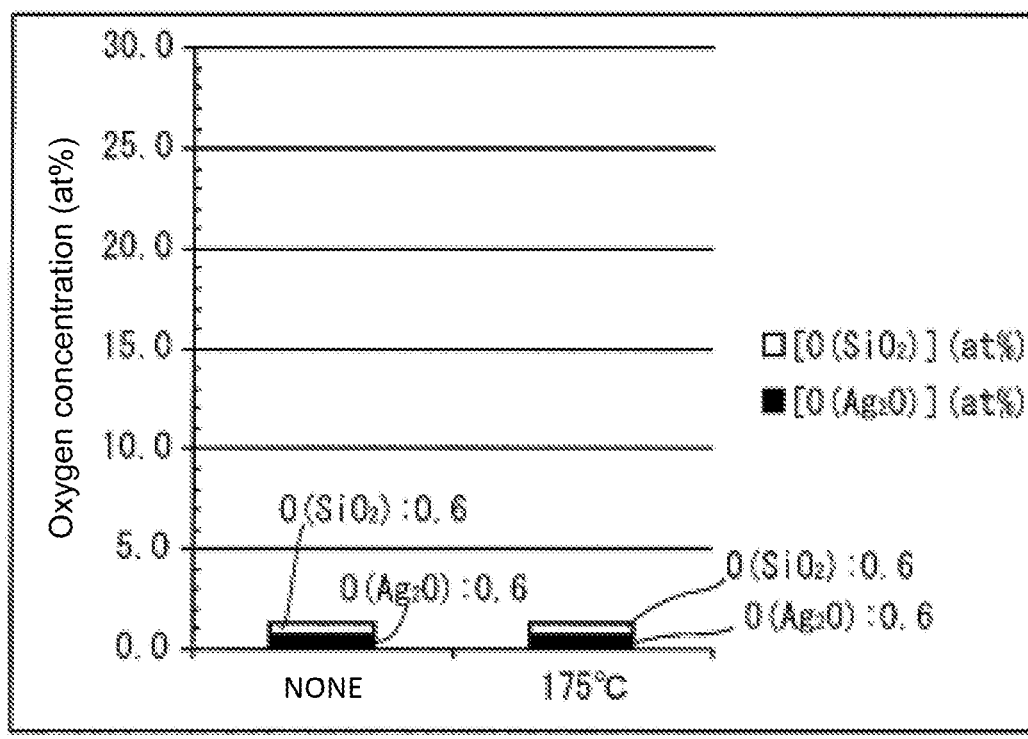
FIG. 23C is a view illustrating a peak value of the oxygen concentration in the vicinity of the interface between the electrode and the non-crystalline silicon layer in the sample E illustrated in FIG. 21.
Figure 23D:
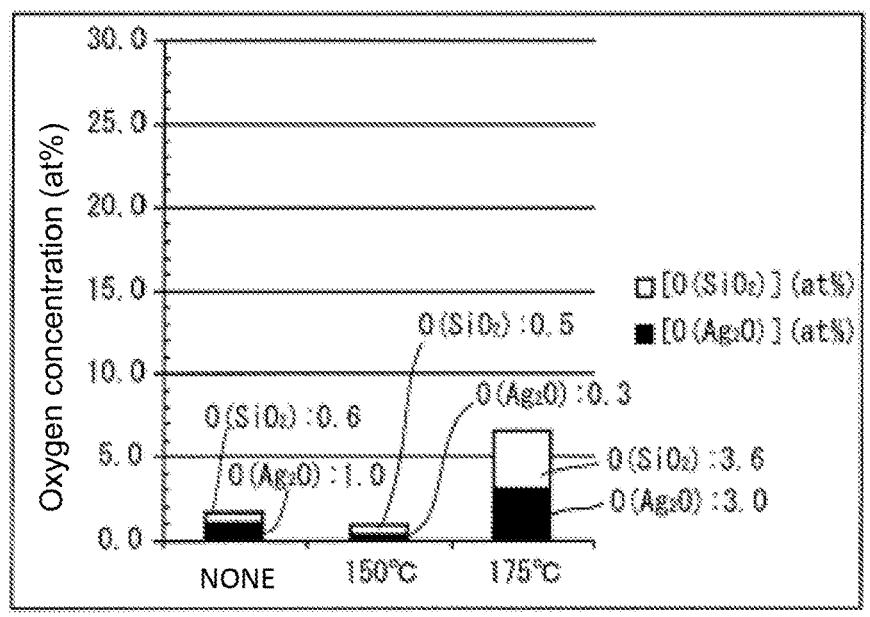
FIG. 23D is a view illustrating a peak value of the oxygen concentration in the vicinity of the interface between the electrode and the non-crystalline silicon layer in the sample D illustrated in FIG. 21.

Here, FIG. 23A illustrates a peak value of the oxygen concentration in the vicinity of the interface between the electrode 34 and the n-type non-crystalline silicon layer 36 (n-type) in the sample B. In addition, FIG. 23B illustrates a peak value of the oxygen concentration in the vicinity of the interface between the electrode 34 and the non-crystalline silicon layer 36 (n-type) in the sample A. FIG. 23C illustrates a peak value of the oxygen concentration in the vicinity of the interface between the electrode 34 and the non-crystalline silicon layer 36 (p-type) in the sample E. In addition, FIG. 23D illustrates a peak value of the oxygen concentration in the vicinity of the interface between the electrode 34 and the non-crystalline silicon layer 36 (p-type) in the sample D. In addition, the peak values of the oxygen concentration illustrated in FIGS. 23A and 23D, are measured by the auger electron spectroscopy.

With reference to FIGS. 23A and 23B, in the sample B, the oxidization of silver contained in the conductive layer 30n is more suppressed than in the sample A. Specifically, in a case where the annealing temperature is 175° C., each detected amount of oxygen (O) contained in the silver oxide ($Ag_2O$) of the sample B and the sample A is 0.5% and 0.7%. In the sample B, compared to the sample A, the detected amount of oxygen (O) contained in silver oxide ($Ag_2O$) is reduced by approximately 29%.

In addition, in the sample B, compared to the sample A, the oxidization of silicon contained in the non-crystalline silicon layer 36 (n-type) is more suppressed. Specifically, in a case where the annealing temperature is 175° C., each detected amount of oxygen (O) contained in the silicon oxide ($SiO_2$) of the sample B and the sample A is 0.5% and 1.1%. In the sample B, compared to the sample A, the detected amount of oxygen (O) contained in silicon oxide ($SiO_2$) is reduced by approximately 55%.

As a result, by titanium contained in the conductive layer 28n, it is ascertained that the oxidization of silver contained in the conductive layer 30n and silicon contained in the n-type non-crystalline silicon layer 20n, is suppressed.

Next, with reference to FIGS. 23C and 23D, in the sample E, compared to the sample D, the oxidization of silver contained in the conductive layer 30p is suppressed. Specifically, in a case where the annealing temperature is 175° C., each detected amount of oxygen (O) contained in the silver oxide ($Ag_2O$) of the sample E and the sample D is 0.6% and 3.0%. In the sample E, compared to the sample D, oxygen (O) contained in silver oxide ($Ag_2O$) is reduced by approximately ⅕.

With reference to FIGS. 23C and 23D, in the sample E, compared to the sample D, the oxidization of silicon contained in the non-crystalline silicon layer 36 (p-type) is suppressed. Specifically, each detected amount of oxygen (O) contained in the silicon oxide ($SiO_2$) of the sample E and the sample D is 0.6% and 3.6%. In the sample E, compared to the sample D, the detected amount of oxygen (O) contained in silicon oxide ($SiO_2$) is reduced by approximately ⅙.

As a result, by titanium contained in the conductive layer 28p, it is ascertained that the oxidization of silver contained in the conductive layer 30p and silicon contained in the p-type non-crystalline silicon layer 20p, is suppressed.

In the above-described photoelectric conversion device 10A, even when the heat treatment is performed in forming the electrodes 221n and 221p, high resistance silver oxide is not generated in the conductive layers 26n and 26p and the conductive layers 30n and 30p, and further, high resistance silicon oxide is not generated in the n-type non-crystalline silicon layer 20n and the p-type non-crystalline silicon layer 20p. Therefore, by increasing the annealing temperature, the contact resistance between the n-type non-crystalline silicon layer 20n and the electrode 221n can be further reduced compared to a case where the conductive layers 28n and 28p are not provided.

Since the conductive layers 26n and 26p are unlikely to be oxidized, for example, when soldering is performed on the electrode for manufacturing a solar battery module, or the like, it is possible to improve wettability between the solder and the conductive layers 26n and 26p, and to reduce the contact resistance. In particular, in a case where the semiconductor (the n-type non-crystalline silicon layer 20n, the p-type non-crystalline silicon layer 20p) is more likely to be oxidized than the conductive layers 30n and 30p, when oxygen is diffused in the conductive layers 30n and 30p, the semiconductor is oxidized prior to the conductive layers 30n and 30p, an insulation layer made of oxide of the semiconductor is formed, and high resistance is easily achieved. However, according to the configuration of the modification example 1, since the conductive layers 28n and 28p are preferentially oxidized, such a problem is unlikely to occur. In addition, in a case where the conductive layers 30n and 30p are more likely to be oxidized than the semiconductor, that is, for example, in a case where the semiconductor is silicon and the conductive layers 30n and 30p are aluminum, when the heat treatment, such as the annealing, is performed, the conductive layers 30n and 30p are oxidized, the insulation layer made of oxide of the conductive layers 30n and 30p is formed, and high resistance is easily achieved. However, according to the configuration of the modification example 1, since the conductive layers 28n and 28p are preferentially oxidized, such a problem is unlikely to occur. In addition, it is preferable that the average crystal grain sizes in the conductive layer 30n and the conductive layer 30p, are respectively greater than the thicknesses of the conductive layer 30n and the conductive layer 30p. In this case, the influence of the interface level between the metal crystal grains becomes small, and the contact resistance is remarkably reduced. In addition, it is preferable that the crystal orientation of the silicon substrate 12 in the thickness direction of the metal crystal grains in the conductive layer 30n and the conductive layer 30p, is preferentially oriented in the <111> direction. In this case, the contact resistance is further reduced.

In addition, between the conductive layer 26p and the p-type non-crystalline silicon layer 20p, a conductive layer containing fourth metal (for example, titanium) which is more likely to be oxidized than the third metal, may further be provided. In this case, it is possible to further suppress the oxidization of the conductive layer 26p and the p-type non-crystalline silicon layer. In addition, between the conductive layer 26n and the n-type non-crystalline silicon layer 20n, a conductive layer containing the fourth metal (for example, titanium) which is more likely to be oxidized than the third metal, may further be provided. In this case, it is possible to further suppress the oxidization of the conductive layer 26n and the n-type non-crystalline silicon layer 20n.

Modification Example 2

In the embodiment and the modification example 1, for example, only the electrode which is in contact with the n-type non-crystalline silicon layer 20n may be provided with the conductive layer 28n.

Figure 24:
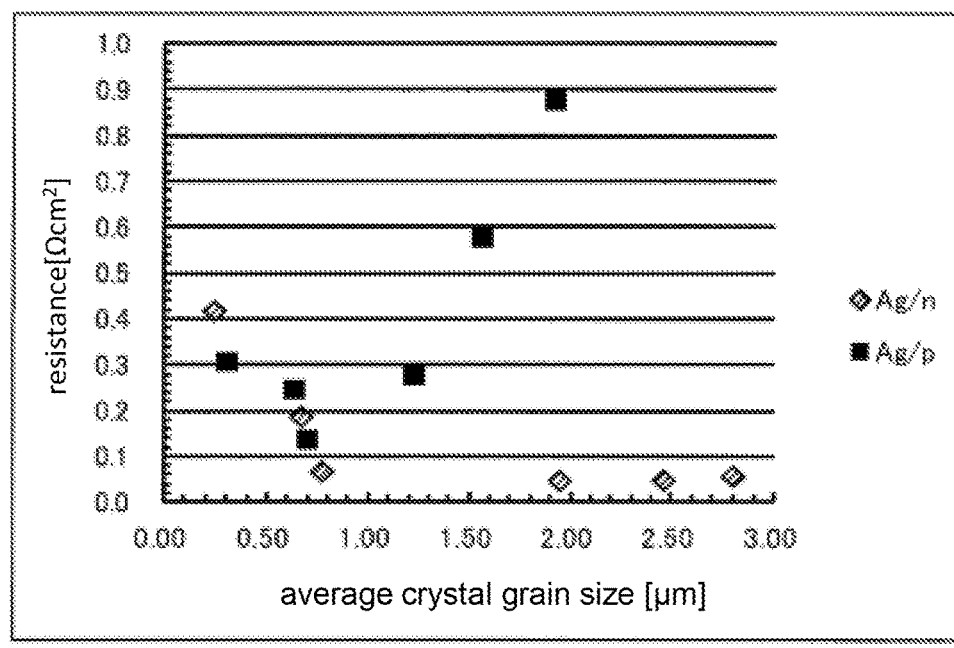
FIG. 24 is a graph illustrating a relationship between the average crystal grain size and the contact resistance.

FIG. 24 is a graph illustrating a relationship of the average crystal grain size with respect to the contact resistance between the electrode provided only with the conductive layer 26n and the n-type non-crystalline silicon layer 20n, and the contact resistance between the electrode provided only with the conductive layer 26p and the p-type non-crystalline silicon layer 20p. In addition, FIG. 24 illustrates a relationship between the contact resistance and the average crystal grain size in a case where the thickness of the conductive layers 26n and 26p is 0.5 μm.

In a modification example 2, the electrode which is in contact with the p-type non-crystalline silicon layer 20p is made only of the conductive layer 26p. As illustrated in FIG. 24, if the average crystal grain size is set to be equal to or less than 1.2 μm, even when the electrode which is in contact with the p-type non-crystalline silicon layer 20p is not provided with the conductive layer 28p, it is possible to decrease the contact resistance between the electrode provided only with the conductive layer 26p and the p-type non-crystalline silicon layer 20p. In addition, in the modification example 2, in the electrode provided only with the conductive layer 26p, even in a case where the average crystal grain size is greater than 1.2 μm in the conductive layer 26p, it is possible to reduce the contact resistance at least between an electrode 32n and the n-type non-crystalline silicon layer 20n. Therefore, the photoelectric conversion element according to the embodiment of the present invention can employ a configuration in which only the electrode which is in contact with the n-type non-crystalline silicon layer 20n is provided with the conductive layer 28n.

Modification Example 3

In the embodiment and the modification example 1, for example, only the electrode which comes into contact with the p-type non-crystalline silicon layer 20p may be provided with the conductive layer 28p. In this case, the electrode which comes into contact with the n-type non-crystalline silicon layer 20n is made only of the conductive layer 26n. As illustrated in FIG. 24, if the average crystal grain size is set to be equal to or greater than 0.5 μm, even when the electrode which comes into contact with the n-type non-crystalline silicon layer 20n is not be provided with the conductive layer 28n, the contact resistance between the electrode provided only with the conductive layer 26n and the n-type non-crystalline silicon layer 20n can be remarkably reduced compared to a case where the heat treatment is not performed. Therefore, the photoelectric conversion element according to the embodiment of the present invention can employ a configuration in which only the electrode which comes into contact with the p-type non-crystalline silicon layer 20p is provided with the conductive layer 28p.

Modification Example 4

Figure 25A:
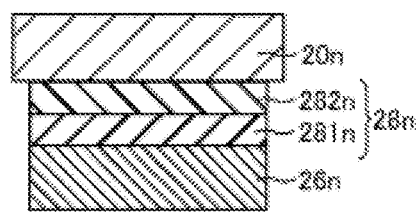
FIG. 25A is a sectional view illustrating a schematic configuration of a second conductive layer which is employed in a photoelectric conversion element according to a modification example 4 of the first embodiment of the present invention.
Figure 25B:
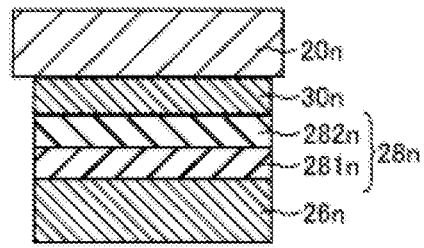
FIG. 25B is a sectional view illustrating a schematic configuration of the second conductive layer which is employed in the photoelectric conversion element according to the modification example 4 of the first embodiment of the present invention.

In the embodiment and the modification example 1, for example, as illustrated in each of FIGS. 25A and 25B, the conductive layer 28n may include a first titanium oxide layer 281n and a second titanium oxide layer 282n. The first titanium oxide layer 281n is formed to be in contact with the conductive layer 26n. The second titanium oxide layer 282n is formed to be in contact with the first titanium oxide layer 281n and the n-type non-crystalline silicon layer 20n. An oxygen content of the second titanium oxide layer 282n is less than that of the first titanium oxide layer 281n. Even in this configuration, the target effects can be achieved. Furthermore, the second titanium oxide layer 282n may be a layer which does not contain oxygen.

Modification Example 5

Figure 26A:
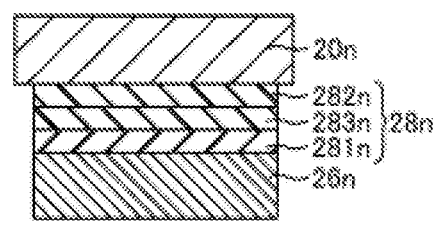
FIG. 26A is a sectional view illustrating a schematic configuration of the second conductive layer which is employed in a photoelectric conversion element according to a modification example 5 of the first embodiment of the present invention.
Figure 26B:
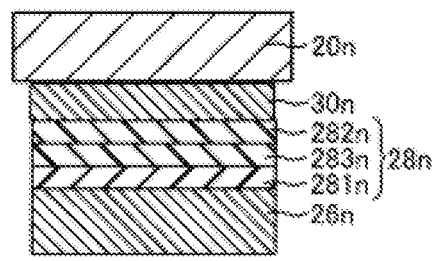
FIG. 26B is a sectional view illustrating a schematic configuration of the second conductive layer which is employed in the photoelectric conversion element according to the modification example 5 of the first embodiment of the present invention.

In the embodiment and the modification example 1, for example, as illustrated in each of FIGS. 26A and 26B, the conductive layer 28n may include the first titanium oxide layer 281n, the second titanium oxide layer 282n and a third titanium oxide layer 283n. The first titanium oxide layer 281n is formed to be in contact with the conductive layer 26n. The second titanium oxide layer 282n is formed to be in contact with the n-type non-crystalline silicon layer 20n. The third titanium oxide layer 283n is formed to be in contact with the first titanium oxide layer 281n and the second titanium oxide layer 283n. An oxygen content of the third titanium oxide layer 283n is less than that of the first titanium oxide layer 281n and the second titanium oxide layer 282n. Even in this configuration, the target effects can be achieved. Furthermore, the third titanium oxide layer may be a layer which does not contain oxygen.

In addition, in the modification examples 4 and 5, the conductive layer 28n is described as an example, but the conductive layer 28p can employ the same configuration.

Modification Example 6

Figure 27A:
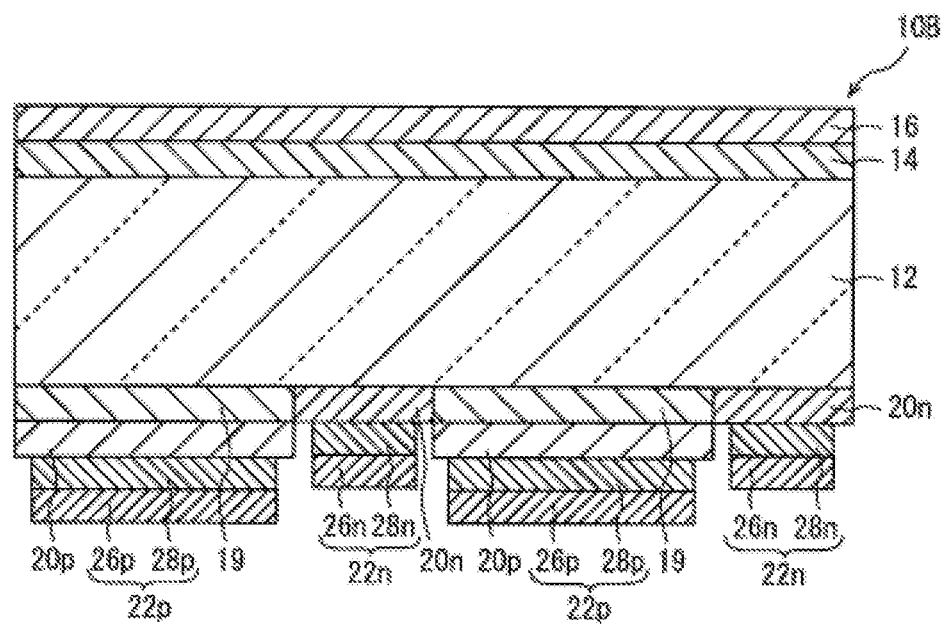
FIG. 27A is a sectional view illustrating an example of a schematic configuration of a photoelectric conversion element according to a modification example 6 of the first embodiment of the present invention.

FIG. 27A is a sectional view illustrating an example of a schematic configuration of a photoelectric conversion element 10B according to a modification example 6 of the embodiment. As illustrated in FIG. 27A, compared to the photoelectric conversion element 10, the photoelectric conversion element 10B is not provided with the intrinsic non-crystalline silicon layer 18.

When manufacturing the photoelectric conversion element 10B, for example, the intrinsic non-crystalline silicon layer and the p-type non-crystalline silicon layer are formed in order on the rear surface of the silicon substrate 12. Next, in the p-type non-crystalline silicon layer, a part except the part which becomes the p-type non-crystalline silicon layer 20p later is removed, and in the intrinsic non-crystalline silicon layer, a part except the part which becomes the intrinsic non-crystalline silicon layer 19 later is removed. Next, on the resist pattern formed on the p-type non-crystalline silicon layer 20p, and on the rear surface of the silicon substrate 12, the n-type non-crystalline silicon layer is formed. Next, the resist pattern formed on the p-type non-crystalline silicon layer 20p is removed. Accordingly, on the rear surface of the silicon substrate 12, the intrinsic non-crystalline silicon layer 19, the p-type non-crystalline silicon layer 20, and the n-type non-crystalline silicon layer 20n are formed.

Figure 27B:
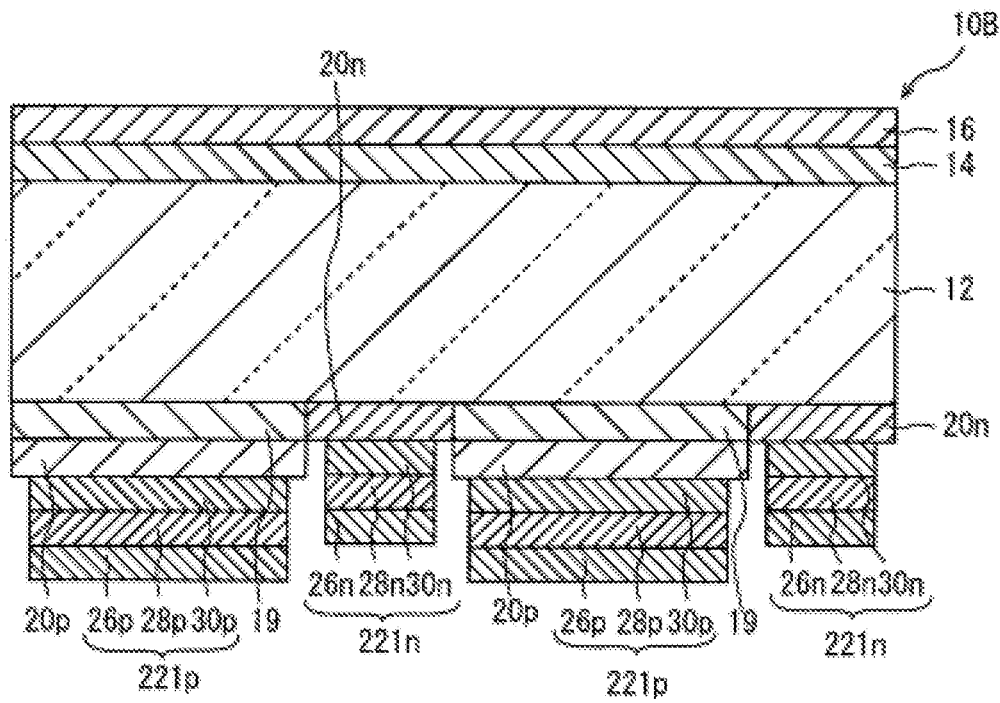
FIG. 27B is a sectional view illustrating an example of a schematic configuration of the photoelectric conversion element according to the modification example 6 of the first embodiment of the present invention.

In addition, as illustrated in FIG. 27B, in the photoelectric conversion element 10B illustrated in FIG. 27A, instead of the electrodes 22n and 22p, the electrodes 221n and 221p may be provided. The electrodes 221n and 221p include the conductive layers 30n and 30p in addition to the conductive layers 26n and 26p and the conductive layers 28n and 28p, similar to the modification example 1. Even in this case, by using the manufacturing method similar to that of the photoelectric conversion element 10B illustrated in FIG. 27A, after forming the p-type non-crystalline silicon layer 20 and the n-type non-crystalline silicon layer 20n, the conductive layer 29, the conductive layer 27, and the conductive layer 25 are formed in order, and the electrodes 22n and 22p are formed.

Modification Example 7

Figure 28A:
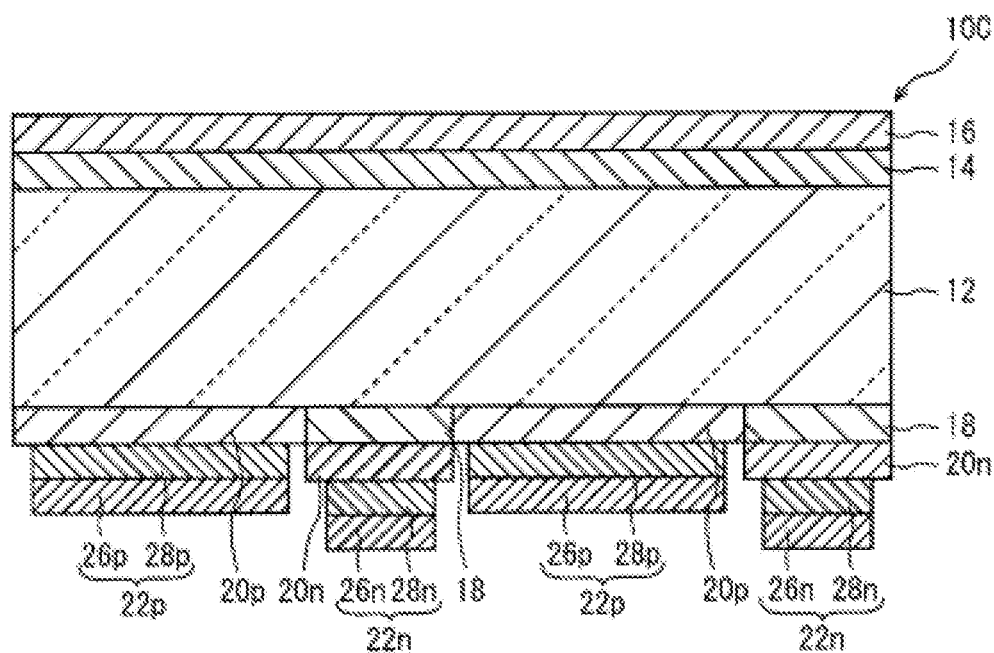
FIG. 28A is a sectional view illustrating an example of a schematic configuration of a photoelectric conversion element according to a modification example 7 of the first embodiment of the present invention.

FIG. 28A is a sectional view illustrating an example of a schematic configuration of a photoelectric conversion element 10C according to a modification example 7 of the embodiment. As illustrated in FIG. 28A, the photoelectric conversion element 10C is not provided with the intrinsic non-crystalline silicon layer 19 compared to the photoelectric conversion element 10.

When manufacturing the photoelectric conversion element 10C, for example, the intrinsic non-crystalline silicon layer, the n-type non-crystalline silicon layer, and the coating layer are formed in order on the rear surface of the silicon substrate 12. Next, by using the photolithography method, the coating layer, the n-type non-crystalline silicon layer, and the intrinsic non-crystalline silicon layer are patterned, a part of the silicon substrate 12 is exposed, and the n-type non-crystalline silicon layer 20n and the intrinsic non-crystalline silicon layer 18 are formed. At this time, the coating layer is formed on the n-type non-crystalline silicon layer 20n. Next, on the coating layer formed on the n-type non-crystalline silicon layer 20n, and on the rear surface of the silicon substrate 12, the p-type non-crystalline silicon layer is formed. Next, the coating layer formed on the n-type non-crystalline silicon layer 20n is removed. Accordingly, on the rear surface of the silicon substrate 12, the intrinsic non-crystalline silicon layer 18 and the p-type non-crystalline silicon layer 20p are formed, and the n-type non-crystalline silicon layer 20n is formed on the intrinsic non-crystalline silicon layer 18.

Figure 28B:
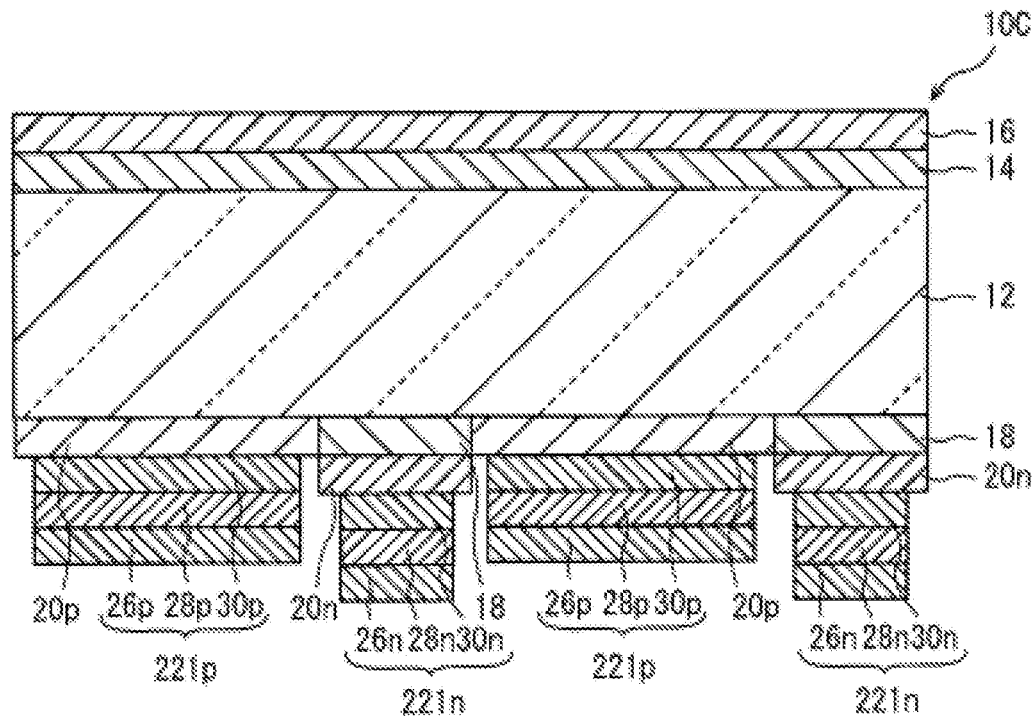
FIG. 28B is a sectional view illustrating an example of a schematic configuration of the photoelectric conversion element according to the modification example 7 of the first embodiment of the present invention.

In addition, as illustrated in FIG. 28B, in the photoelectric conversion element 10C illustrated in FIG. 28A, instead of the electrodes 22n and 22p, the electrodes 221n and 221p may be provided. The electrodes 221n and 221p include the conductive layers 30n and 30p in addition to the conductive layers 26n and 26p and the conductive layers 28n and 28p, similar to the modification example 1. Even in this case, by using the manufacturing method similar to that of the photoelectric conversion element 10C illustrated in FIG. 28A, after forming the p-type non-crystalline silicon layer 20 and the n-type non-crystalline silicon layer 20n, the conductive layer 29, the conductive layer 27, and the conductive layer 25 are formed in order, and the electrodes 22n and 22p are formed.

Modification Example 8

Figure 29A:
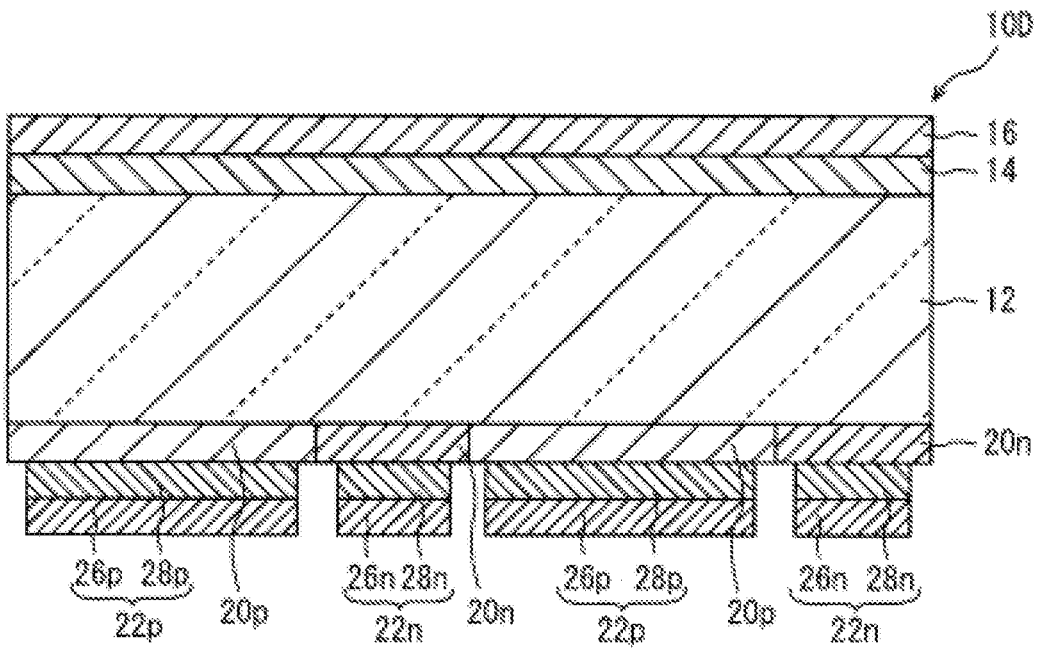
FIG. 29A is a sectional view illustrating an example of a schematic configuration of a photoelectric conversion element according to a modification example 8 of the first embodiment of the present invention.

FIG. 29A is a sectional view illustrating an example of a schematic configuration of a photoelectric conversion element 10D according to a modification example 8 of the embodiment. As illustrated in FIG. 29A, the photoelectric conversion element 10D is not provided with the intrinsic non-crystalline silicon layers 18 and 19 compared to the photoelectric conversion element 10.

When manufacturing the photoelectric conversion element 10D, for example, the n-type non-crystalline silicon layer and the coating layer are formed in order on the rear surface of the silicon substrate 12. Next, the coating layer and the n-type silicon layer are patterned, a part of the silicon substrate 12 is exposed, and the n-type non-crystalline silicon layer 20n is formed. At this time, the coating layer is formed on the n-type non-crystalline silicon layer 20n. Next, on the coating layer formed on the n-type non-crystalline silicon layer 20n, and on the rear surface of the silicon substrate 12, the p-type non-crystalline silicon layer is formed. Next, the coating layer formed on the n-type non-crystalline silicon layer 20n is removed. Accordingly, on the rear surface of the silicon substrate 12, the n-type non-crystalline silicon layer 20n and the p-type non-crystalline silicon layer 20p are formed.

Figure 29B:
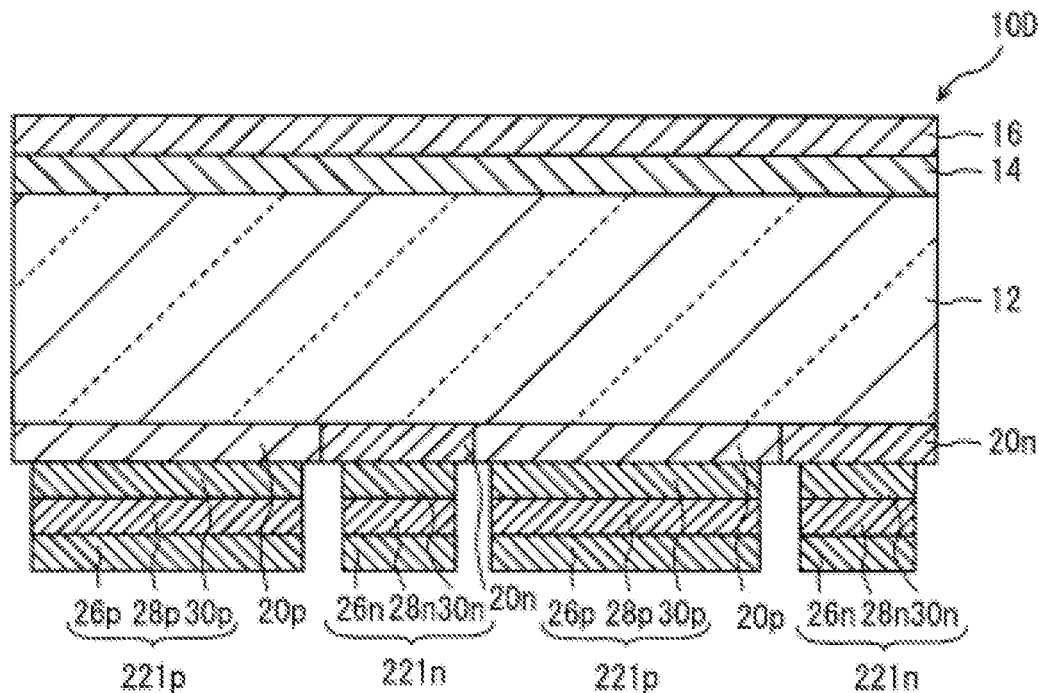
FIG. 29B is a sectional view illustrating an example of a schematic configuration of the photoelectric conversion element according to the modification example 8 of the first embodiment of the present invention.

In addition, as illustrated in FIG. 29B, in the photoelectric conversion element 10D illustrated in FIG. 29A, instead of the electrodes 22n and 22p, the electrodes 221n and 221p may be provided. The electrodes 221n and 221p include the conductive layers 30n and 30p in addition to the conductive layers 26n and 26p and the conductive layers 28n and 28p, similar to the modification example 1. Even in this case, by using the manufacturing method similar to that of the photoelectric conversion element 10D illustrated in FIG. 29A, after forming the p-type non-crystalline silicon layer 20 and the n-type non-crystalline silicon layer 20n, the conductive layer 29, the conductive layer 27, and the conductive layer 25 are formed in order, and the electrodes 22n and 22p are formed.

Modification Example 9

In the modification example 1, at least a part between the n-type non-crystalline silicon layer 20n and the conductive layer 30n, and between the p-type non-crystalline silicon layer 20p and the conductive layer 30p, the conductive layers containing metal elements (for example, titanium) that are more likely to be oxidized than the main component metal of the conductive layers 30n and 30p, are respectively provided. In this case, the oxidization of the n-type non-crystalline silicon layer 20n and the conductive layer 30n, and the oxidization of the p-type non-crystalline silicon 20p and the conductive layer 30p are further suppressed, the contact resistance is reduced, and the photoelectric conversion efficiency can be improved. In addition, instead of titanium, any one or more metal among nickel, cobalt, iron, chrome, zinc, tantalum, manganese, aluminum, magnesium, cerium, niobium, molybdenum, and tungsten, may be used.

Second Embodiment

Figure 30:
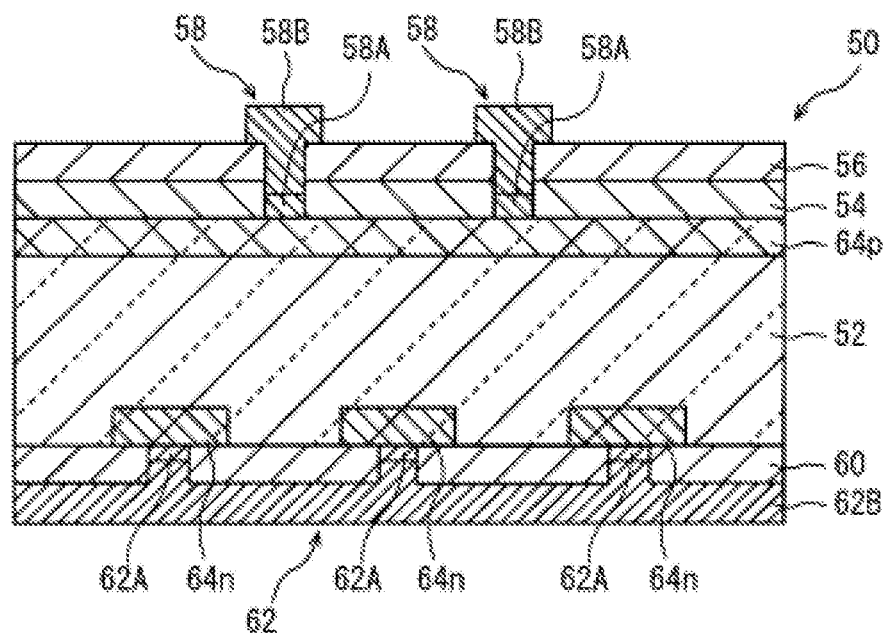
FIG. 30 is a sectional view illustrating a schematic configuration of a photoelectric conversion element according to a second embodiment of the present invention.

FIG. 30 is a sectional view illustrating a configuration of a photoelectric conversion element 50 according to a second embodiment of the present invention. The photoelectric conversion element 50 includes a silicon substrate 52, a non-crystalline film 54, a non-crystalline film 56, an electrode 58, an insulation film 60, and an electrode 62.

The silicon substrate 52 is an n-type single crystal silicon substrate. The silicon substrate 52 includes a p-type diffusion layer 64p and an n-type diffusion layer 64n.

The p-type diffusion layer 64p contains, for example, boron (B) as p-type impurities. The maximum concentration of boron (B) is, for example, $1 \times 10^{18}$ cm$^{-3}$ to $1 \times 10^{20}$ cm$^{-3}$. The thickness of the p-type diffusion layer 64p is, for example, 50 nm to 1000 nm.

The n-type diffusion layer 64n is in contact with the rear surface opposite to the light incident side of the silicon substrate 52, and is disposed at a desired interval in the in-surface direction of the silicon substrate 52. The n-type diffusion layer 64n contains, for example, phosphorus (P) as n-type impurities. The maximum concentration of phosphorus (P) is, for example, $1 \times 10^{18}$ cm$^{-3}$ to $1 \times 10^{20}$ cm$^{-3}$. The thickness of the n-type diffusion layer 64n is, for example, 50 nm to 1000 nm.

Other description of the silicon substrate 52 is the same as the description of the silicon substrate 12.

The non-crystalline film 54 is disposed to be in contact with the front surface on the light-incident side of the silicon substrate 52. The non-crystalline film 54 includes at least the non-crystalline phase, and made of, for example, a-Si:H. The thickness of the non-crystalline film 54 is, for example, 1 nm to 20 nm. The conductive type of a-Si:H is preferably an i-type or the p-type, and more preferably the i-type. Since the passivation is effectively performed with respect to the front surface of the silicon substrate 52 by a-Si:H, the lifetime of the minority carrier in the vicinity of the front surface of the silicon substrate 52 is improved, and the photoelectric conversion efficiency is improved.

The non-crystalline film 56 is disposed to be in contact with the non-crystalline film 54. The non-crystalline film 54 includes at least the non-crystalline phase, and made of, for example, silicon nitride. The thickness of the non-crystalline film 56 is, for example, 50 nm to 200 nm. By forming the non-crystalline film 56 which is further made of silicon nitride on the non-crystalline film 54 containing a-Si:H, the lifetime of the minority carrier in the vicinity of the front surface of the silicon substrate 52 is further improved, and the photoelectric conversion efficiency is further improved.

The electrode 58 penetrates the non-crystalline film 54 and the non-crystalline film 56, is in contact with the p-type diffusion layer 64p of the silicon substrate 52, and is disposed on the non-crystalline film 56. The electrode 58 includes a conductive layer 58A and a conductive layer 58B. The conductive layer 58A is in contact with the p-type diffusion layer 64p. The conductive layer 58A contains, for example, titanium as an example of the second metal. A part of the second metal may be oxidized. The conductive layer 58A may contain, for example, titanium oxide. The thickness of the conductive layer 58A is, for example, 0.1 nm to 10 nm. The conductive layer 58B is in contact with the conductive layer 58A. In the conductive layer 58B, for example, silver which is an example of the first metal is a main component. The conductive layer 58B may contain metal other than silver. The thickness of the conductive layer 58B is, for example, 100 nm to 1000 nm. Since the electrode 58 is in contact with the p-type diffusion layer 64, the contact resistance which is extremely low is obtained.

The insulation film 60 is disposed to be in contact with the rear surface of the silicon substrate 52. The insulation film 60 is made of, for example, silicon oxide, silicon nitride, silicon oxynitride, and aluminum oxide. The thickness of the insulation film 60 is, for example, 50 nm to 1000 nm.

The electrode 62 penetrates the insulation film 60, is in contact with the n-type diffusion layer 64n of the silicon substrate 52, and is disposed to cover the insulation film 60. The electrode 62 includes a conductive layer 62A and a conductive layer 62B. The conductive layer 62A is in contact with the n-type diffusion layer 64n. The conductive layer 62A contains, for example, titanium as an example of the second metal. A part of the second metal may be oxidized. The conductive layer 62A may contain, for example, titanium oxide. The thickness of the conductive layer 62A is, for example, 0.1 nm to 10 nm. The conductive layer 62B is in contact with the conductive layer 62A. In the conductive layer 62B, silver which is an example of the first metal is a main component. The conductive layer 62B may contain metal other than silver. The thickness of the conductive layer 62B is, for example, 100 nm to 1000 nm.

[Manufacturing Method of Photoelectric Conversion Element]

With reference to FIGS. 31A to 31G, a manufacturing method of the photoelectric conversion element 50 will be described.

Figure 31A:
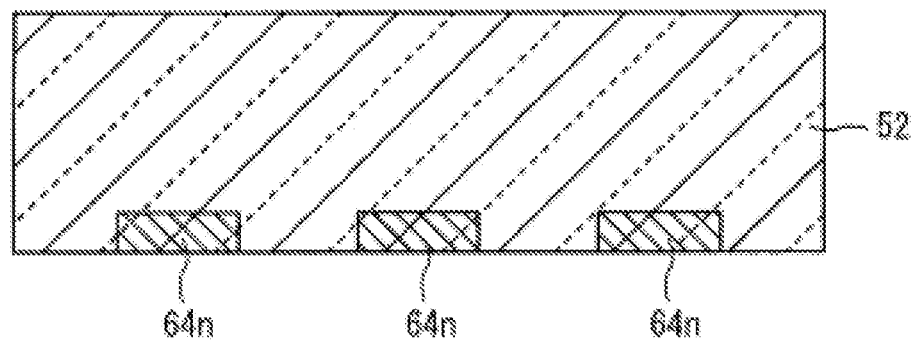
FIG. 31A is a sectional view illustrating a manufacturing method of the photoelectric conversion element illustrated in FIG. 30, and is a view illustrating a state where an n-type diffusion layer is formed on the rear surface side of the silicon substrate.

First, as illustrated in FIG. 31A, the n-type diffusion layer 64n is formed on the silicon substrate 52. Specifically, first, the silicon substrate 52 is prepared. Next, the rear surface of the silicon substrate 52 is coated with the resist. Next, the resist is patterned by the photolithography method, and the resist pattern is formed. Next, by using the resist pattern as a mask, the n-type impurities, such as P and arsenic (As), are ion-injected into the silicon substrate 52. According to this, the n-type diffusion layer 64n is formed on the rear surface side of the silicon substrate 52. In addition, after the ion injection, the heat treatment may be performed for electrically vitalizing the n-type impurities. Instead of the ion injection method, a gas phase diffusion method, a solid phase diffusion method, a plasma doping method, or an ion doping method, may be used.

Figure 31B:
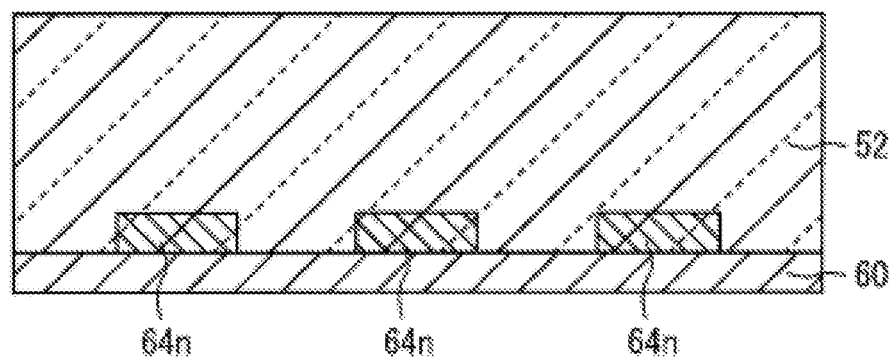
FIG. 31B is a sectional view illustrating a state where an insulation film is formed on the rear surface of the silicon substrate illustrated in FIG. 31A.

Next, as illustrated in FIG. 31B, the insulation film 60 is formed on the entire rear surface of the silicon substrate 52. The insulation film 60 is formed, for example, by the plasma CVD method. In addition, the insulation film 60 may be formed by an atomic layer deposition (ALD) method and a heat CVD method.

Figure 31C:
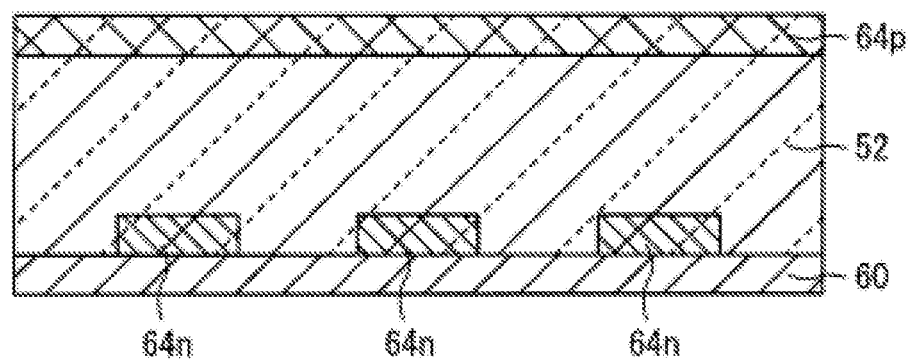
FIG. 31C is a sectional view illustrating a state where a p-type diffusion layer is formed on a front surface side of the silicon substrate illustrated in FIG. 31B.

Next, as illustrated in FIG. 31C, the p-type diffusion layer 64p is formed on the silicon substrate 52. Specifically, the p-type impurities, such as B, gallium (Ga), or indium (In), are ion-injected into the silicon substrate 52 from the light-incident side. Accordingly, the p-type diffusion layer 64p is formed on the light-incident side of the silicon substrate 52. In addition, after the ion injection, the heat treatment may be performed for electrically vitalizing the p-type impurities. In addition, not being limited to the ion injection, the p-type diffusion layer 64p may be formed by a gas phase diffusion method and a solid phase diffusion method. Instead of the ion injection method, a gas phase diffusion method, a solid phase diffusion method, a plasma doping method, or an ion doping method, may be used.

Figure 31D:
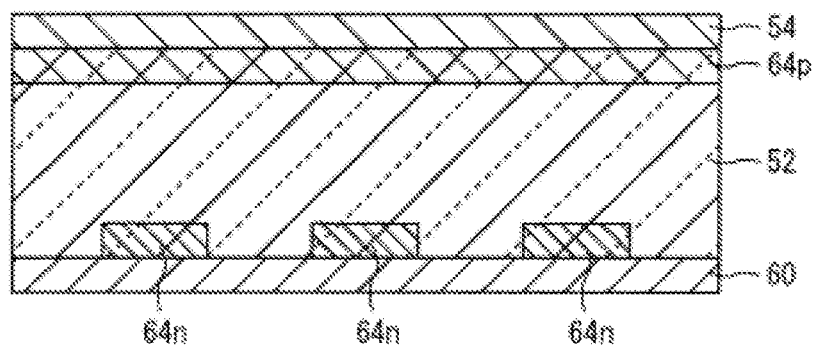
FIG. 31D is a sectional view illustrating a state where a non-crystalline film is formed on the light-receiving surface of the silicon substrate illustrated in FIG. 31C.

Next, as illustrated in FIG. 31D, the non-crystalline film 54 is formed on the light-receiving surface of the silicon substrate 52. The non-crystalline film 54 is formed, for example, by the plasma CVD.

Figure 31E:
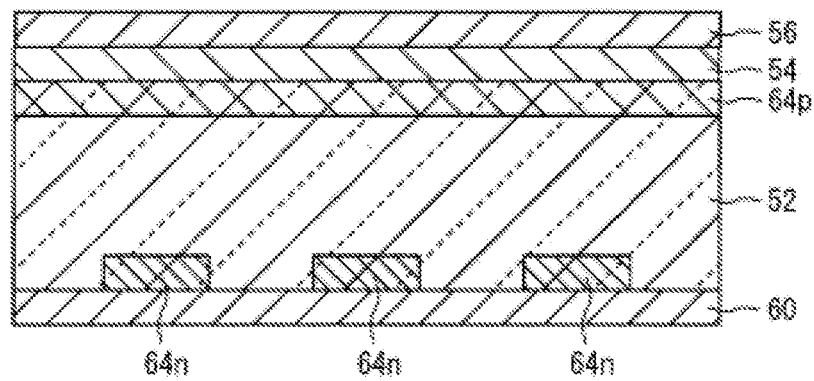
FIG. 31E is a sectional view illustrating a state where the non-crystalline film is formed on the passivation film on the silicon substrate illustrated in FIG. 31D.

Next, as illustrated in FIG. 31E, the non-crystalline film 56 is formed on the non-crystalline film 54. The non-crystalline film 56 is formed, for example, by the plasma CVD.

Figure 31F:
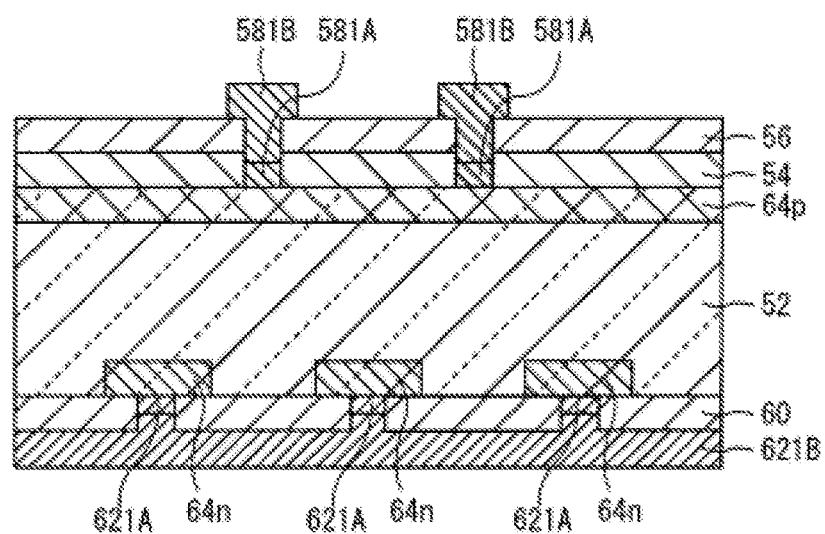
FIG. 31F is a sectional view illustrating a state where a metal film is formed on the silicon substrate illustrated in FIG. 31E.
Figure 31G:
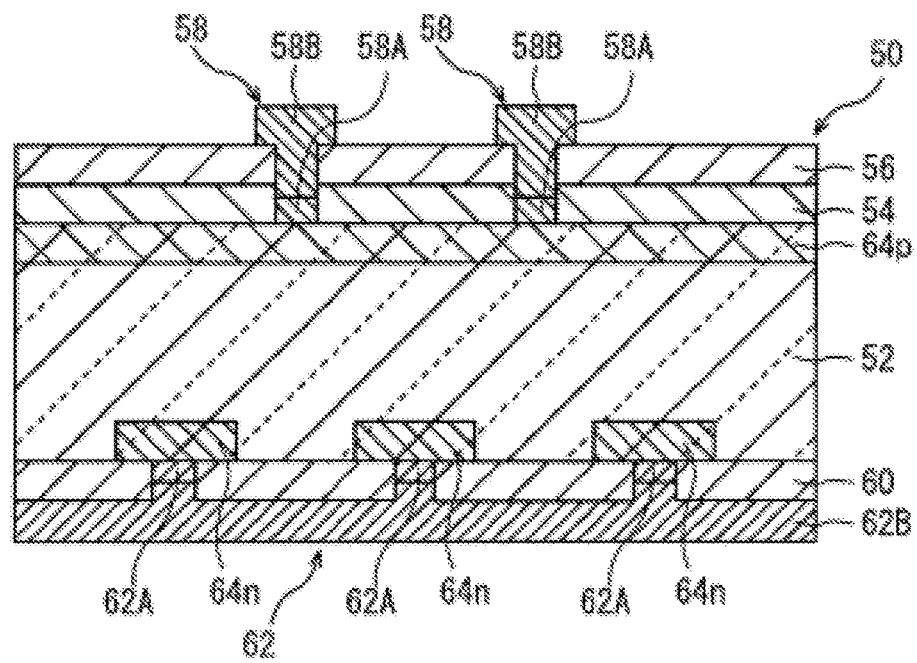
FIG. 31G is a sectional view illustrating a state where the electrode is formed on the silicon substrate illustrated in FIG. 31F.

Next, as illustrated in FIG. 31F, conductive layers 581A and 621A and conductive layers 581B and 621B, are formed. A forming method of the conductive layers 581A and 621A and the conductive layers 581B and 621B is, for example, as follows.

First, the entire surface of the non-crystalline film 56 is coated with the resist. Next, the resist is patterned by the photolithography method, and the resist pattern is formed. Next, by using mixed liquid of hydrofluoric acid and nitric acid by using a photoresist as a mask, etching is performed with respect to a part of the non-crystalline film 56 and the non-crystalline film 54. Next, resist pattern is removed. Accordingly, a part of the p-type diffusion layer 64p is exposed. Next, by the deposition method or the sputtering method, the metal film on which silver is layered on titanium, is formed on the entire surface of the non-crystalline film 56. Next, the metal film is patterned. Accordingly, the conductive layer 581A made of titanium and the conductive layer 581B made of silver, are formed.

Next, the entire surface of the insulation film 60 is coated with the resist. Next, the resist is patterned by the photolithography method, and the resist pattern is formed. Next, by using the resist pattern as a mask, by using hydrofluoric acid, the etching is performed with respect to a part of the insulation film 60, and the resist pattern is removed. Accordingly, a part of the n-type diffusion layer 64n of the silicon substrate 52 is exposed.

Next, by using the deposition method or the sputtering method, the conductive layer 621A and the conductive layer 621B, are formed.

Next, as illustrated in FIG. 31F, the conductive layers 581A and 621A and the conductive layers 581B and 621B are heat-treated, and the electrodes 58 and 62 are formed. By the heat treatment, the conductive layer 581A, the conductive layer 621A, the conductive layer 581B, and the conductive layer 621B, respectively become the conductive layer 58A, the conductive layer 62A, the conductive layer 58B, and the conductive layer 62B. The heat treatment is performed similar to the first embodiment. Accordingly, the photoelectric conversion element 50 is obtained.

Even in the photoelectric conversion element 50, similar to the photoelectric conversion element 10, the element characteristics are improved. In the photoelectric conversion element 50, by the p-type diffusion layer 64p provided on the entire front surface of the silicon substrate 52, the depletion layer is formed on the entire light-receiving surface of the silicon substrate 52, and high carrier transmission in the horizontal direction is achieved by the p-type diffusion layer 64p. According to this, it is possible to effectively separate electron-positive hole pair generated by the light. Furthermore, by the non-crystalline film 54 (for example, i-type a-Si:H) provided on the front surface of the silicon substrate 52, it is possible to obtain a high passivation effect. In a case where a-Si:H is used as the non-crystalline film 54, the passivation performance deteriorates due to high temperature processing (for example, 300° C. or higher), but in the photoelectric conversion element 50, the low contact resistance is obtained in a low temperature process at 250° C. or lower.

In addition, the photoelectric conversion element 50 may be provided with the n-type diffusion layer instead of the p-type diffusion layer 64p, and may be provided with the p-type diffusion layer instead of the n-type diffusion layer 64n. In addition, in the photoelectric conversion element 50, the conductive type of the silicon substrate 52 may be the p-type.

Modification Example 1

Figure 32:
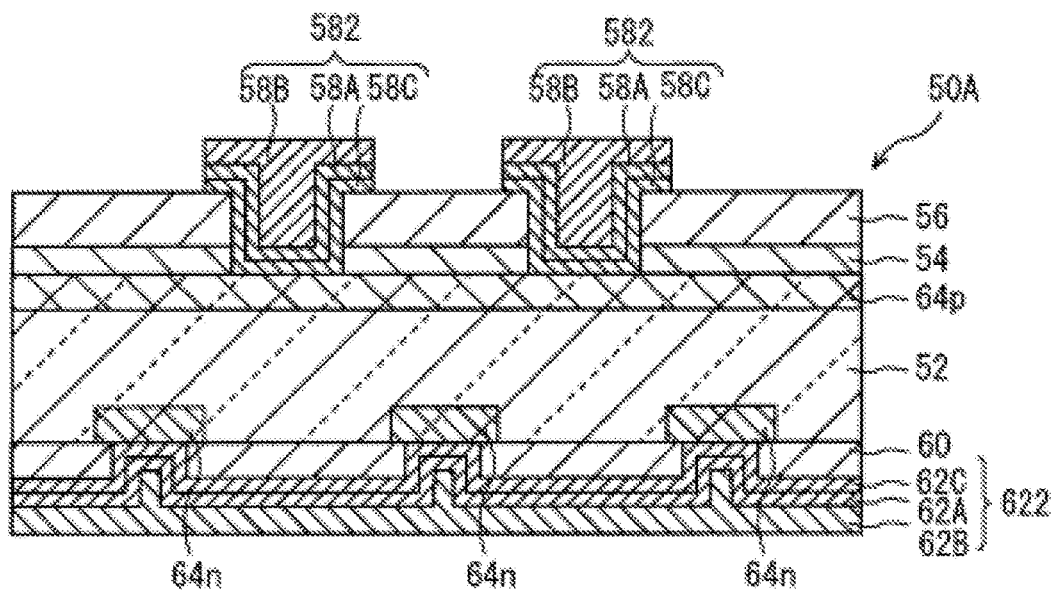
FIG. 32 is a sectional view illustrating a schematic configuration of a photoelectric conversion element according to a modification example 1 of the second embodiment of the present invention.

FIG. 32 is a sectional view illustrating a configuration of a photoelectric conversion device 50A according to a modification example 1 of the embodiment. The photoelectric conversion device 50A is different from the photoelectric conversion device 50 in that an electrode 582 and an electrode 622 are provided instead of the electrode 58 and the electrode 62. The electrode 582 and the electrode 622 are respectively provided with conductive layers 58C and 62C in addition to the conductive layers 58A and 62A and the conductive layers 58B and 62B. In the conductive layer 58C, for example, silver is contained as a main component, as an example of metal which is more unlikely to be oxidized than the second metal contained in the conductive layer 58A. In the conductive layer 62C, for example, silver is contained as a main component, as an example of metal which is more unlikely to be oxidized than the second metal contained in the conductive layer 62A. The thickness of the conductive layers 58C and 62C is, for example, 50 nm to 1000 nm.

(Manufacturing Method)

A manufacturing method of the photoelectric conversion device 50A is as follows. First, the process to FIG. 31E is performed similar to the photoelectric conversion element 10, and the non-crystalline film 56 is formed on the non-crystalline film 54.

Figure 33A:
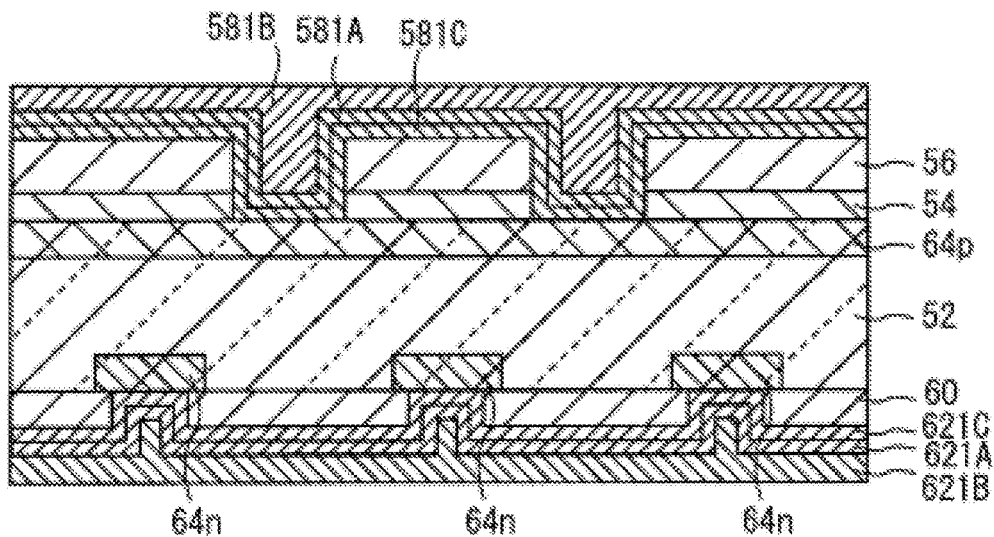
FIG. 33A is a view illustrating a manufacturing process of the electrode of the photoelectric conversion element illustrated in FIG. 32.

Next, as illustrated in FIG. 33A, after a part of the p-type diffusion layer 64p is exposed similar to the process in FIG. 31F, by using the deposition method or the sputtering method, a conductive layer 581C made of silver, the conductive layer 581A made of titanium, and the conductive layer 581B made of silver, are formed in order.

Next, similar to the process in FIG. 31F, after the etching is performed with respect to a part of the insulation film 60, and a part of the n-type diffusion layer 64n of the silicon substrate 52 is exposed, by using the deposition method or the sputtering method, a conductive layer 621C made of silver, the conductive layer 621A made of titanium, and the conductive layer 621B made of silver, are formed.

Figure 33B:
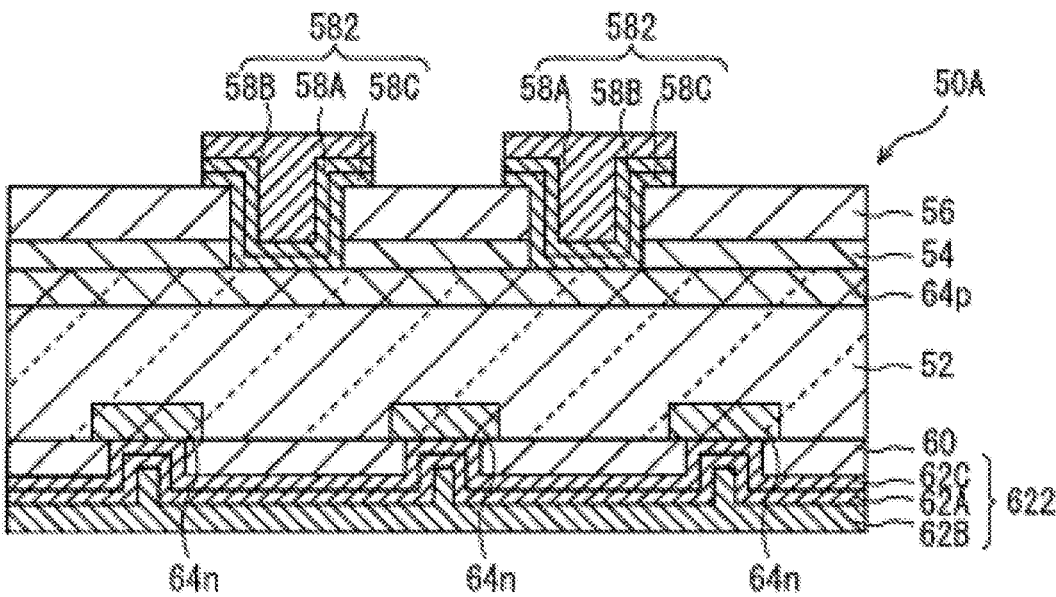
FIG. 33B is a sectional view illustrating a state where the conductive layer illustrated in FIG. 33A is patterned and the electrode is formed.

In addition, as illustrated in FIG. 33B, by using the photolithography method, after the conductive layer 581C, the conductive layer 581A, and the conductive layer 581B are patterned, the heat treatment is performed similar to the first embodiment. Accordingly, the conductive layer 581C, the conductive layer 581A, the conductive layer 581B, the conductive layer 621C, the conductive layer 621A, and the conductive layer 621B, respectively become the conductive layer 58C, the conductive layer 58A, the conductive layer 58B, the conductive layer 62C, the conductive layer 62A, and the conductive layer 62B, and the electrode 582 and the electrode 622 are formed.

Even in the photoelectric conversion device 50A, similar to the photoelectric conversion device 50, high passivation characteristics and high carrier collection efficiency are obtained, and high photoelectric conversion efficiency is obtained. In addition, by the photoelectric conversion device 50, the contact resistance between the electrode and the semiconductor layer is further reduced, and the photoelectric conversion efficiency can be improved. In addition, in the photoelectric conversion device 50A, the n-type diffusion layer may be provided instead of the p-type diffusion layer 64p, and the p-type diffusion layer may be provided instead of the n-type diffusion layer 64n. In addition, in the photoelectric conversion device 50A, the conductive type of the silicon substrate 52 may be the p-type. In addition, in the embodiment, the conductive layer (conductive layers 58A and 62A) containing the second metal in both electrodes 582 and 622 is formed, but the conductive layer (conductive layers 58A and 62A) containing the second metal only in any one of the electrodes 582 and 622 may be provided. In addition, even when both of the conductive layers 58A and 62A are omitted, the photoelectric conversion device 50A can function as the photoelectric conversion element.

Modification Example 2

Figure 34A:
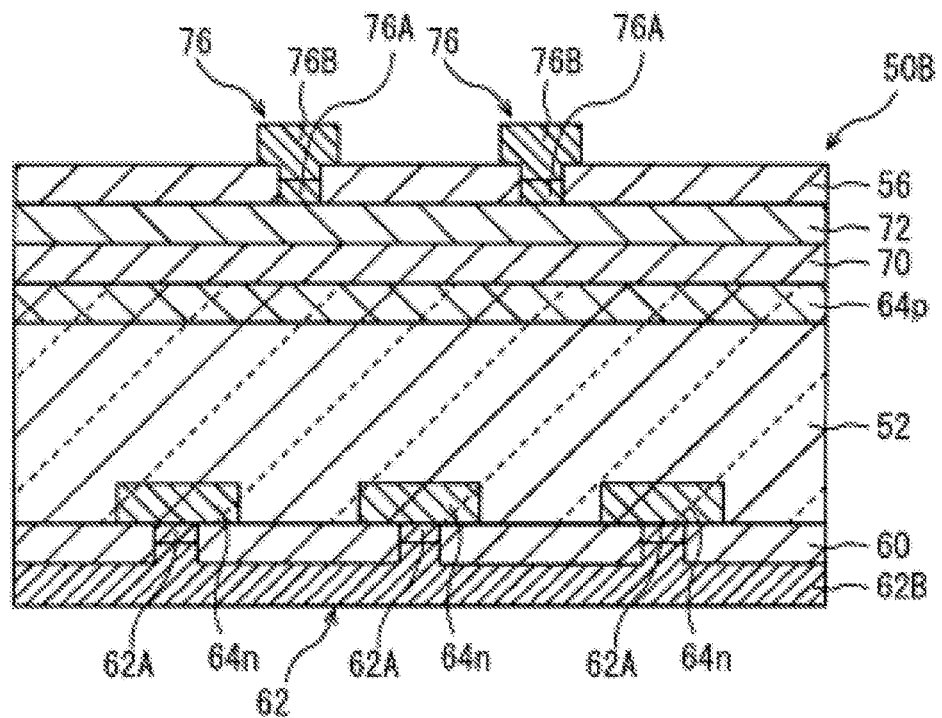
FIG. 34A is a sectional view illustrating a schematic configuration of a photoelectric conversion element according to a modification example 2 of the second embodiment of the present invention.

FIG. 34A is a sectional view illustrating a schematic configuration of a photoelectric conversion element 50B according to a modification example 2 of the embodiment. Compared to the photoelectric conversion element 50, instead of the non-crystalline film 54, the photoelectric conversion element 50B is provided with a non-crystalline film 70 and a non-crystalline film 72. In addition, compared to the photoelectric conversion element 50, the photoelectric conversion element 50B is provided with an electrode 76 instead of the electrode 58.

The non-crystalline film 70 includes at least the non-crystalline phase, and is made of a-Si, for example. It is preferable that the non-crystalline film 70 is made of the i-type a-Si, but may contain p-type impurities having lower concentration than the concentration of the p-type impurities contained in the non-crystalline film 72. The film thickness of the non-crystalline film 70 is, for example, 5 nm to 20 nm. The non-crystalline film 70 is in contact with the p-type diffusion layer 64p of the silicon substrate 50, is disposed on the p-type diffusion layer 64p, and passivates the silicon substrate 52. Accordingly, the lifetime of the minority carrier in the vicinity of the front surface of the silicon substrate 52 is further improved, and the photoelectric conversion efficiency is further improved. In addition, as long as the non-crystalline phase is included, the non-crystalline film 70 may include the crystalline phase. The non-crystalline film 70 may include, for example, both a-Si:H and fine Si crystal.

The non-crystalline film 72 includes at least non-crystalline phase, and is made of, for example, p-type a-Si:H. The film thickness of the non-crystalline film 72 is, for example, 1 nm to 30 nm. The non-crystalline film 72 is in contact with the non-crystalline film 70, and is disposed on the non-crystalline film 70. Accordingly, the lifetime of the minority carrier in the vicinity of the front surface of the silicon substrate 52 is further improved, and the photoelectric conversion efficiency is further improved. Furthermore, as long as the non-crystalline phase is included, the non-crystalline film 72 may include the crystalline phase. The non-crystalline film 72 may include, for example, both p-type a-Si:H and fine Si crystal.

The electrode 76 penetrates the non-crystalline film 56, is in contact with the non-crystalline film 72, and is disposed on the non-crystalline film 56. The electrode 76 includes a conductive layer 76A and a conductive layer 76B. The conductive layer 76A is in contact with the non-crystalline film 72. The conductive layer 76A contains, for example, titanium as an example of the second metal. A part of the second metal may be oxidized. In other words, the conductive layer 76A may contain, for example, titanium oxide. The thickness of the conductive layer 76A is, for example, 0.1 nm to 10 nm. The conductive layer 76B is in contact with the conductive layer 76A. In the conductive layer 76B, for example, silver which is an example of the first metal is a main component. The conductive layer 76B may contain metal other than silver. The thickness of the conductive layer 76B is, for example, 100 nm to 1000 nm.

A manufacturing method of the photoelectric conversion element 50B may be a method in which a process of forming the non-crystalline film 54 is changed to a process of forming the non-crystalline film 70 and the non-crystalline film 72, and in which a process of forming the electrode 58 is changed to a process of forming the electrode 76, from the manufacturing method of the photoelectric conversion element 50. When forming the electrode 76, by performing the etching with respect to the non-crystalline film 56, by stopping the etching on the non-crystalline film 72, an opening portion is formed on the non-crystalline film 56. Next, after depositing titanium and silver in order by using the sputtering method or the deposition method, by performing the patterning using the photolithography method and performing the heat treatment, the conductive layer 76A containing titanium and the conductive layer 76B containing silver as a main component, are formed, and the electrode 76 is formed.

Figure 34B:
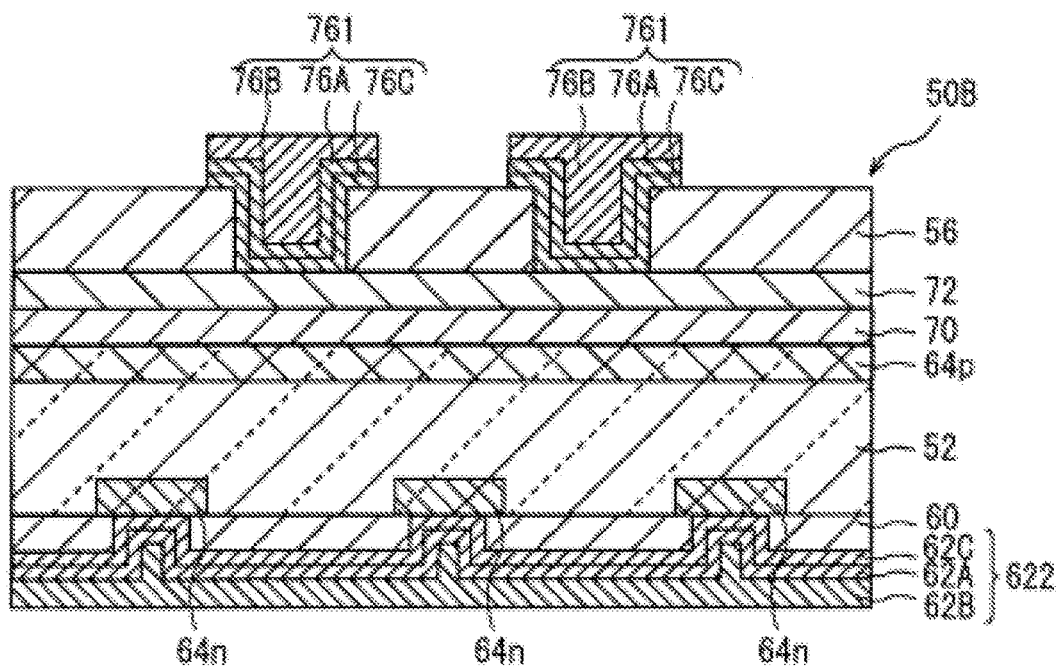
FIG. 34B is a sectional view illustrating a schematic configuration of the photoelectric conversion element of the modification example 2 of the second embodiment of the present invention.

In addition, as illustrated in FIG. 34B, in the photoelectric conversion element 50B, instead of the electrodes 62 and 76, the electrodes 622 and 761 may be provided. The electrodes 622 and 761 respectively further include the conductive layers 62C and 76C in addition to the conductive layers 62A and 76A and conductive layers 62B and 76B. In the conductive layer 62C, as an example of metal which is more unlikely to be oxidized than the second metal contained in the conductive layer 62A, for example, silver is contained as a main component. In the conductive layer 76C, as an example of metal which is more unlikely to be oxidized than the second metal contained in the conductive layer 76A, for example, silver is contained as a main component. The thickness of the conductive layers 62C and 76C is, for example, 50 nm to 1000 nm.

In addition, the photoelectric conversion element 50B may not be provided with the non-crystalline film 70. In the photoelectric conversion element 50A, the n-type diffusion layer may be provided instead of the p-type diffusion layer 64$p$, the p-type diffusion layer may be provided instead of the n-type diffusion layer 64$n$, and the film made of n-type a-Si:H may be provided instead of the non-crystalline film 72. The conductive type of the silicon substrate 52 may be changed to the p-type.

In the photoelectric conversion device 50B, the electrode 76 is not directly in contact with the silicon substrate 52, and the front surface of the silicon substrate 52 is coated with the non-crystalline film 70. Therefore, compared to the photoelectric conversion device 50A, more excellent passivation characteristics are obtained. As a result, it is possible to further improve the photoelectric conversion efficiency. In addition, in the modification example, the conductive layer containing the second metal is provided in both the electrodes 62 and 76, but the conductive layer containing the second metal may be provided in any one of the electrodes 62 and 76. In addition, even when the second conductive layer is omitted, and the photoelectric conversion element 50B functions as the photoelectric conversion element.

Third Embodiment

Figure 35:
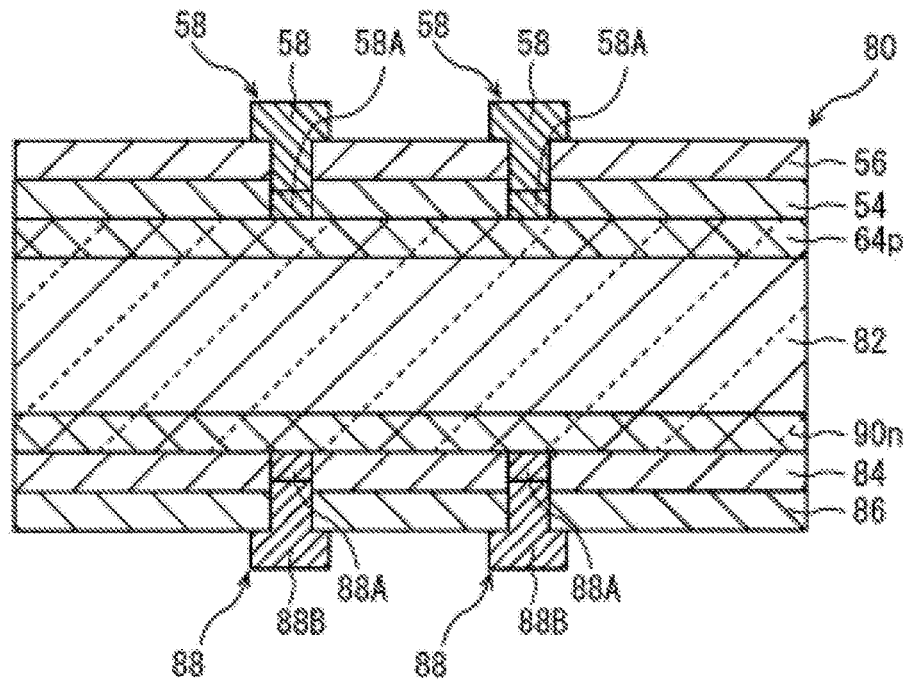
FIG. 35 is a sectional view illustrating a schematic configuration of a photoelectric conversion element according to a third embodiment of the present invention.

FIG. 35 is a sectional view illustrating a schematic configuration of a photoelectric conversion element 80 according to a third embodiment of the present invention. In the photoelectric conversion element 80, a silicon substrate 82 is provided instead of the silicon substrate 52 of the photoelectric conversion element 50 (refer to FIG. 30), non-crystalline films 84 and 86 are provided instead of the insulation film 60, and an electrode 88 is provided instead of the electrode 62. Other parts are the same as those of the photoelectric conversion element 50.

In the silicon substrate 82, an n-type diffusion layer 90$n$ is provided instead of the n-type diffusion layer 64$n$ of the silicon substrate 52. Other parts are the same as those of the silicon substrate 52.

The n-type diffusion layer 90$n$ is in contact with the entire rear surface opposite to the light-incident side of the silicon substrate 82, and is disposed in the silicon substrate 82. The n-type diffusion layer 90$n$ has the same thickness as that of the n-type diffusion layer 64$n$, and contains the n-type impurities having the same concentration as that of the n-type impurities of the n-type diffusion layer 64$n$.

The non-crystalline film 84 includes at least the non-crystalline phase, and made of, for example, i-type a-Si:H or n-type a-Si:H. In addition, the film thickness of the non-crystalline film 84 is, for example, 1 nm to 20 nm. The non-crystalline film 84 is in contact with the rear surface opposite to the light-incident side of the silicon substrate 82, and is disposed on the silicon substrate 82.

The non-crystalline film 86 includes at least the non-crystalline phase, and is made of, for example, silicon nitride. In addition, the film thickness of the non-crystalline film 86 is, for example, 50 nm to 200 nm.

The electrode 88 penetrates the non-crystalline films 84 and 86, is in contact with the n-type diffusion layer 90$n$, and is disposed on the non-crystalline film 86. The electrode 88 includes a conductive layer 88A and a conductive layer 88B. The conductive layer 88A is in contact with the n-type diffusion layer 90$n$. The conductive layer 88A contains, for example, titanium as an example of the second metal. A part of the second metal may be oxidized. The conductive layer 88A may contain, for example, titanium oxide. The thickness of the conductive layer 88A is, for example, 0.1 nm to 10 nm. The conductive layer 88B is in contact with the conductive layer 88A. In the conductive layer 88B, silver which is an example of the first metal is a main component. The conductive layer 88B may contain metal other than silver. The thickness of the conductive layer 88B is, for example, 100 nm to 1000 nm.

In the photoelectric conversion element 80, the front surface on the light-incident side of the silicon substrate 82 is passivated by the non-crystalline film 54, and the rear surface of the silicon substrate 82 is passivated by the non-crystalline film 84. Accordingly, high photoelectric conversion efficiency is obtained. In addition, the light may be incident on the rear surface side of the silicon substrate 80.

[Manufacturing Method of Photoelectric Conversion Element]

With reference to FIGS. 36A to 36F, a manufacturing method of the photoelectric conversion element 80 will be described.

Figure 36A:
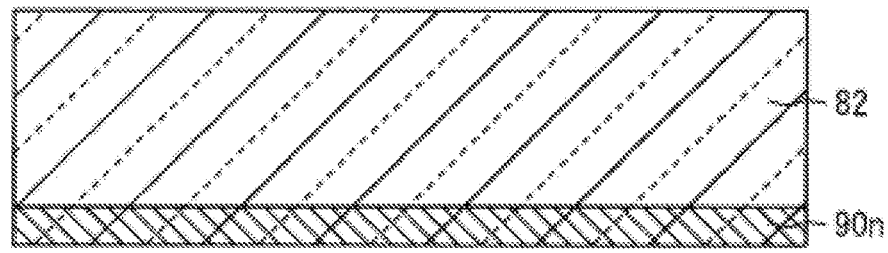
FIG. 36A is a sectional view illustrating a state where the n-type diffusion layer is formed on the rear surface side of the silicon substrate illustrated in FIG. 35.

First, as illustrated in FIG. 36A, the n-type diffusion layer 90$n$ is formed on the silicon substrate 82. Specifically, n-type impurities, such as P and arsenic (As), are ion-injected into the silicon substrate 82, and the n-type diffusion layer 90n is formed on the rear surface side of the silicon substrate 82. In addition, after the ion injection, the heat treatment may be performed for electrically vitalizing the n-type impurities. Instead of the ion injection method, a gas phase diffusion method, a solid phase diffusion method, a plasma doping method, or an ion doping method, may be used.

Figure 36B:
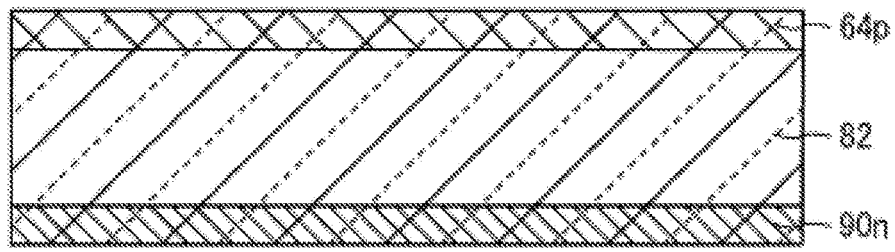
FIG. 36B is a sectional view illustrating a state where the p-type diffusion layer is formed on the front surface side of the silicon substrate illustrated in FIG. 36A.

Next, as illustrated in FIG. 36B, the p-type diffusion layer 64p is formed on the silicon substrate 82. Specifically, p-type impurities, such as B, gallium (Ga), or indium (In), are ion-injected into the silicon substrate 82 from the light-incident side. Accordingly, the p-type diffusion layer 64p is formed on the light-incident side of the silicon substrate 82. In addition, after the ion injection, the heat treatment may be performed for electrically vitalizing the p-type impurities. In addition, not being limited to the ion injection, the p-type diffusion layer 64p may be formed by a gas phase diffusion method and a solid phase diffusion method.

Figure 36C:
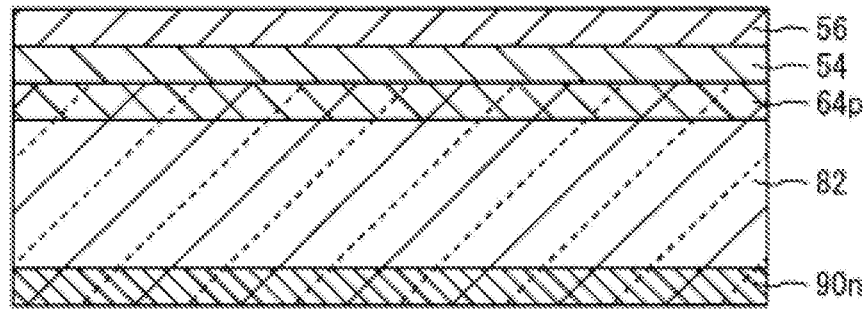
FIG. 36C is a sectional view illustrating a state where the non-crystalline film is formed on the front surface of the silicon substrate illustrated in FIG. 36B.

Next, as illustrated in FIG. 36C, the non-crystalline films 54 and 56 are formed on the light-receiving surface of the silicon substrate 82. The non-crystalline films 54 and 56 are formed, for example, by the plasma CVD.

Figure 36D:
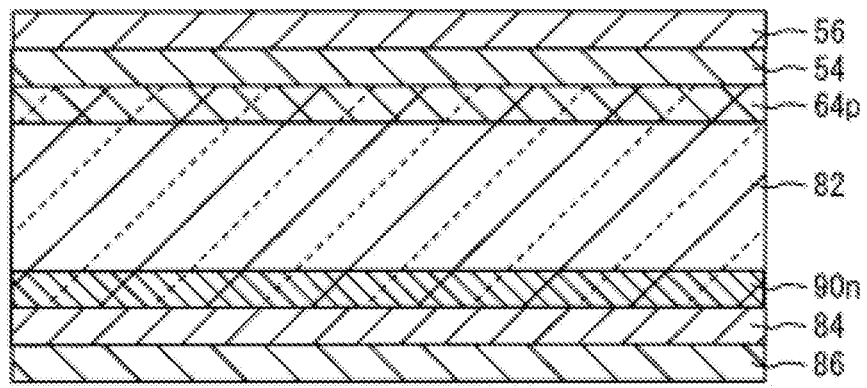
FIG. 36D is a sectional view illustrating a state where the non-crystalline film is formed on the rear surface of the silicon substrate illustrated in FIG. 36C.

Next, as illustrated in FIG. 36D, the non-crystalline films 84 and 86 are layered in order on the rear surface of the silicon substrate 82. The non-crystalline films 84 and 86 are formed, for example, by the plasma CVD.

Figure 36E:
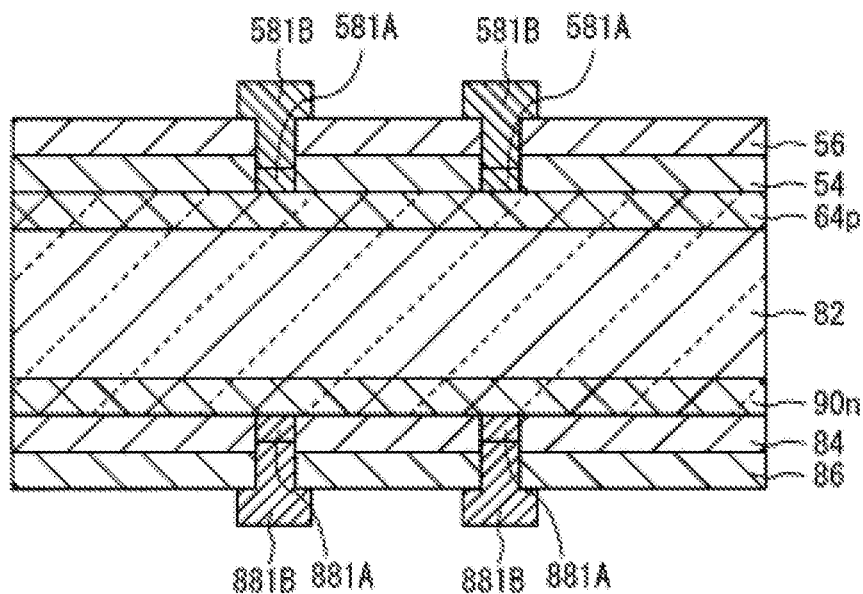
FIG. 36E is a sectional view illustrating a state where the metal film is formed on the silicon substrate illustrated in FIG. 36D.

Next, as illustrated in FIG. 36E, the conductive layers 581A and 881A and the conductive layers 581B and 881B are formed. A manufacturing method of the conductive layers 581A and 881A and the conductive layers 581B and 881B is, for example, as follows.

First, the entire surface of the non-crystalline film 56 is coated with the resist. Next, the resist is patterned by the photolithography method, and the resist pattern is formed. Next, by using a photoresist as a mask, etching is performed with respect to a part of the non-crystalline film 56 and the non-crystalline film 54. Next, resist pattern is removed. Accordingly, a part of the p-type diffusion layer 64p is exposed. Next, by the deposition method or the sputtering method, the conductive layer made of titanium and the conductive layer made of silver, are formed. Next, the conductive layer made of titanium and the conductive layer made of silver, are patterned. Accordingly, the conductive layer 581A and the conductive layer 581B are formed.

Next, the entire surface of the non-crystalline film 86 is coated with the resist. Next, the resist is patterned by the photolithography method, and the resist pattern is formed. Next, by using the resist pattern as a mask, the etching is performed with respect to a part of the non-crystalline film 86 and the non-crystalline film 84, and the resist pattern is removed. Accordingly, a part of the n-type diffusion layer 90n of the silicon substrate 82 is exposed.

Next, by using the deposition method and the sputtering method, for example, the conductive layer made of titanium and the conductive layer made of silver, are formed. Next, the conductive layer made of titanium and the conductive layer made of silver are patterned. Accordingly, the conductive layer 881A and the conductive layer 881B are formed.

Figure 36F:
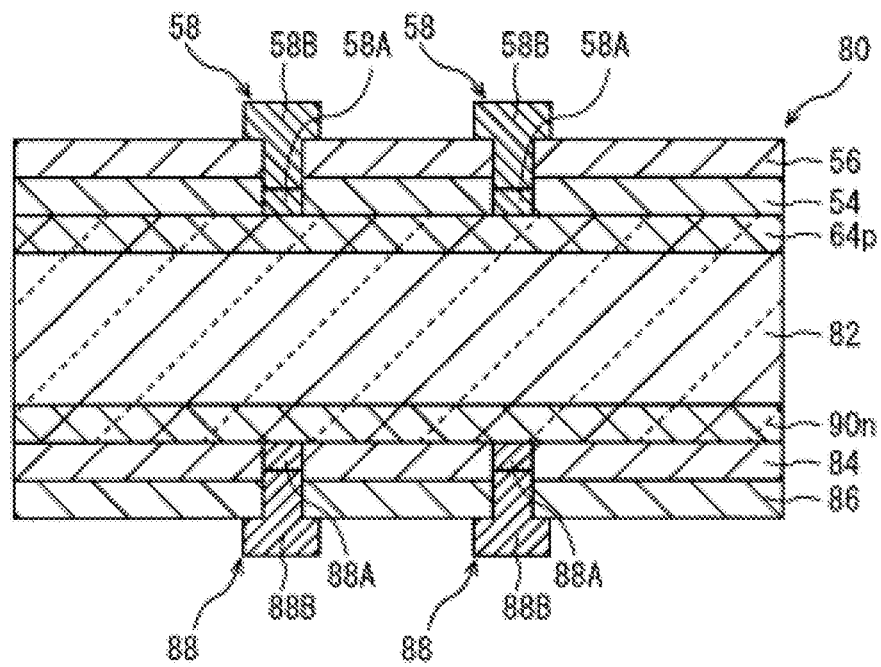
FIG. 36F is a sectional view illustrating a state where the electrode is formed on the silicon substrate illustrated in FIG. 36E.

Next, as illustrated in FIG. 36F, by performing the heat treatment, the conductive layer 581A, the conductive layer 581B, the conductive layer 881A, and the conductive layer 881B, respectively become the conductive layer 58A containing titanium, the conductive layer 58B containing silver as a main component, the conductive layer 88A containing titanium, and the conductive layer 88B containing silver as a main component, and the electrodes 58 and 88 are formed. The heat treatment is performed similar to the first embodiment. Accordingly, as illustrated in FIG. 36F, the photoelectric conversion element 80 is obtained.

Figure 37:
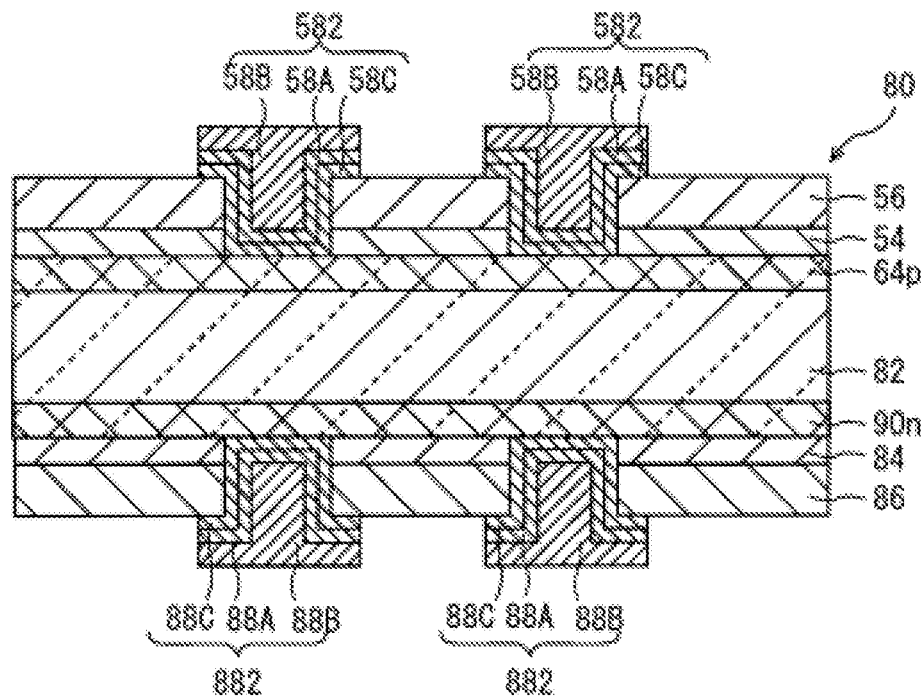
FIG. 37 is a sectional view illustrating a schematic configuration of the photoelectric conversion element of the third embodiment of the present invention.

In addition, as illustrated in FIG. 37, in the photoelectric conversion element 80, the electrodes 582 and 882 may be provided instead of the electrodes 58 and 88. The electrode 582 further includes the conductive layer 58C in addition to the conductive layers 58A and the conductive layer 58B. The electrode 882 further includes a conductive layer 88C in addition to the conductive layers 88A and conductive layer 88B. In the conductive layer 58C, as an example of the third metal which is more unlikely to be oxidized than the second metal contained in the conductive layer 58A, for example, silver is contained as a main component. In the conductive layer 88C, as an example of the third metal which is more unlikely to be oxidized than the second metal contained in the conductive layer 88A, for example, silver is contained as a main component. The thickness of the conductive layers 58C and 88C is, for example, 50 nm to 1000 nm. In this case, in the process of FIG. 36E, after a part of the p-type conductive layer 64p is exposed, by using the deposition method or the sputtering method, for example, silver, titanium, silver are deposited in order, and a part of the n-type conductive layer 90n is exposed. After this, by the deposition method or the sputtering method, for example, silver, titanium, and silver are deposited in order. After this, similar to the process of FIG. 36E, the patterning is performed, and similar to the process of FIG. 36F, the heat treatment is performed. Accordingly, the electrode 58 configured of the conductive layer 58C, the conductive layer 58A, and the conductive layer 58B, and the electrode 88 configured of the conductive layer 88C, the conductive layer 88A, and the conductive layer 88B, are formed.

In the photoelectric conversion device 80, the front surface on the light-incident side of the silicon substrate 82 is effectively passivated by the non-crystalline film 54, and the rear surface of the silicon substrate 82 is effectively passivated by the non-crystalline film 84. As a result, since extremely excellent passivation characteristics are obtained, and it is possible to improve the photoelectric conversion efficiency.

In addition, in the photoelectric conversion element 80, the n-type diffusion layer may be provided instead of the p-type diffusion layer 64p, and the p-type diffusion layer may be provided instead of the n-type diffusion layer 90n. In this case, the non-crystalline film 54 is made of i-type a-Si:H or n-type a-Si:H, and the non-crystalline film 84 is made of i-type a-Si:H or p-type a-Si:H. In addition, in the embodiment, the conductive layer containing the second metal is provided in both the electrodes 58 and 88, but the conductive layer containing the second metal may be provided in any one of the electrodes 58 and 88. Similarly, the conductive layer containing the second metal may be provided in any one of the electrodes 582 and 882. In addition, even when the conductive layer containing the second metal is omitted, and the photoelectric conversion device 80 functions as the photoelectric conversion element.

Modification Example 1

Figure 38A:
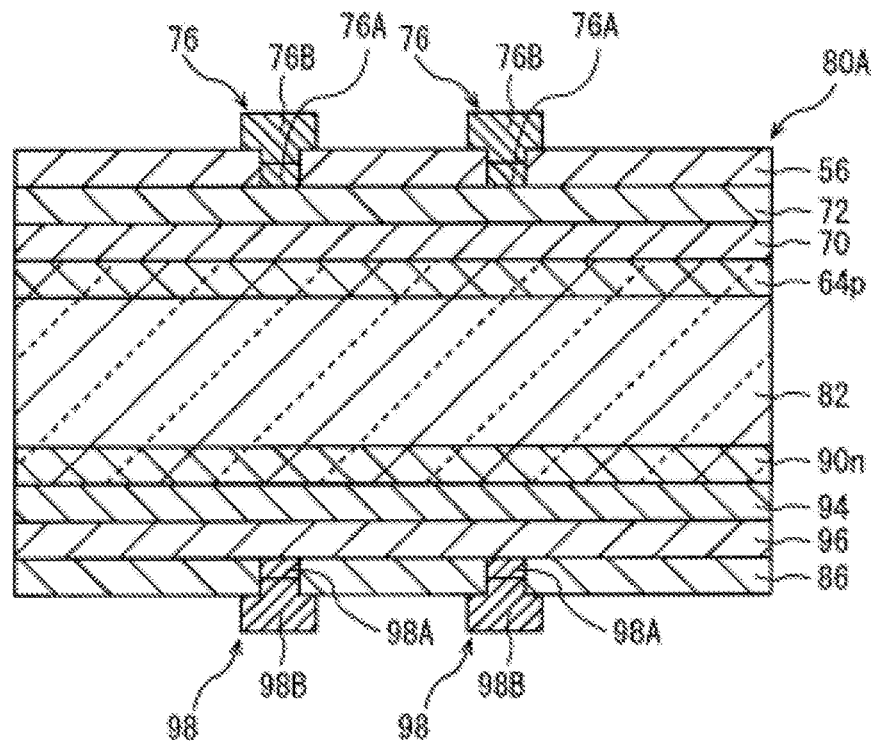
FIG. 38A is a sectional view illustrating a schematic configuration of a photoelectric conversion element according to a modification example 1 of the third embodiment of the present invention.

FIG. 38A is a sectional view illustrating a schematic configuration of a photoelectric conversion element 80A according to a modification example 1 of the embodiment. Compared to the photoelectric conversion element 80, the photoelectric conversion element 80A is provided with the non-crystalline film 70 and the non-crystalline film 72 instead of the non-crystalline film 54. Instead of the non-crystalline film 84, a non-crystalline film 94 and a non-crystalline film 96 are provided. Instead of the electrode 58, the electrode 76 is provided. Instead of the electrode 88, an electrode 98 is provided. The description of the non-crystalline film 70, the non-crystalline film 72, the non-crystalline film 56, the electrode 76, the conductive layer 76A, and the conductive layer 76B, is similar to the modification example 2 of the second embodiment.

The non-crystalline film 94 includes at least the non-crystalline phase, and is made of, for example, i-type a-Si:H or n-type a-Si:H. The i-type a-Si:H is preferable. The non-crystalline film 94 is in contact with the rear surface of the silicon substrate 82, and is disposed on the rear surface of the silicon substrate 82.

The non-crystalline film 96 includes at least the non-crystalline phase, and is made of, for example, n-type a-Si:H. The non-crystalline film 96 is in contact with the non-crystalline film 94, and is disposed on non-crystalline film 941.

The electrode 98 penetrates the non-crystalline film 86, is in contact with the non-crystalline film 96, and is disposed on the non-crystalline film 86. The electrode 98 includes a conductive layer 98A and a conductive layer 98B. The conductive layer 98A is in contact with the non-crystalline film 96. The conductive layer 98A contains, for example, titanium as an example of the second metal. The thickness of the conductive layer 98A is, for example, 0.1 nm to 10 nm. The conductive layer 98B is in contact with the conductive layer 98A. In the conductive layer 98B, silver which is an example of the first metal is a main component. The conductive layer 98B may contain metal other than silver. The thickness of the conductive layer 98B is, for example, 100 nm to 1000 nm.

A manufacturing method of the photoelectric conversion element 80A may be a method in which a process of forming the non-crystalline film 54 is changed to a process of forming the non-crystalline film 70 and the non-crystalline film 72, a process of forming the non-crystalline film 84 is changed to a process of forming the non-crystalline film 94 and the non-crystalline film 96, a process of forming the electrode 58 is changed to a process of forming the electrode 76, and a process of forming the electrode 88 is changed to a process of forming the electrode 98, from the manufacturing method of the photoelectric conversion element 80.

Figure 38B:
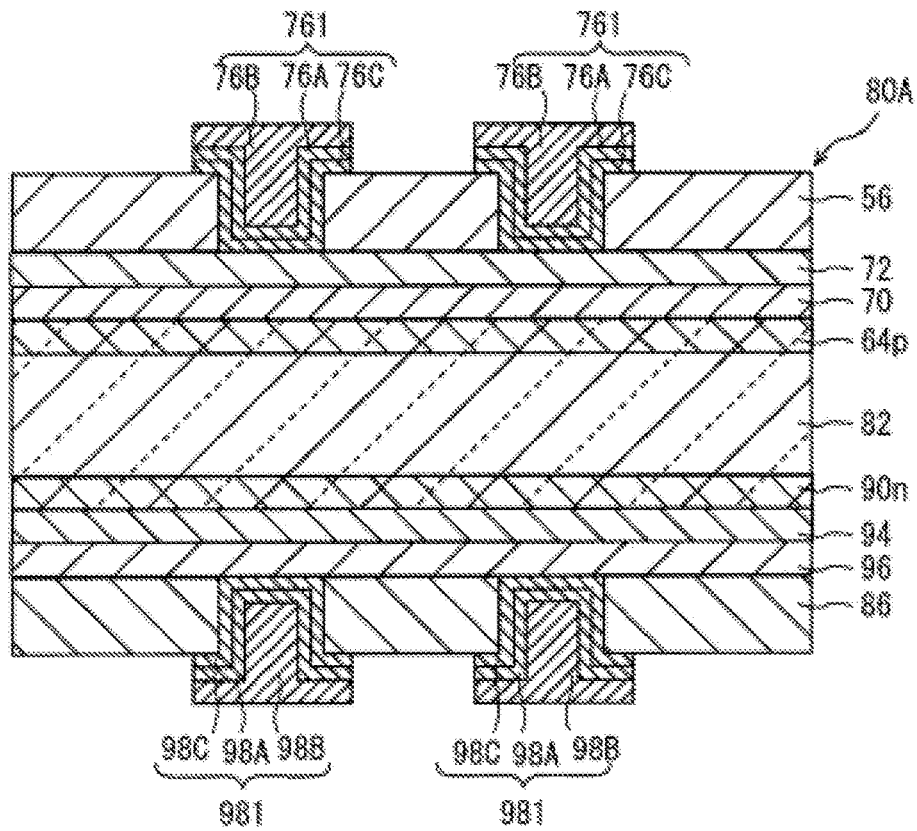
FIG. 38B is a sectional view illustrating a schematic configuration of the photoelectric conversion element according to the modification example 1 of the third embodiment of the present invention.

In addition, as illustrated in FIG. 38B, in the photoelectric conversion element 80A, the electrodes 761 and 981 may be provided instead of the electrodes 76 and 98. The electrode 761 further includes the conductive layer 76C in addition to the conductive layer 76A and the conductive layer 76B. In addition, the electrode 981 further includes a conductive layer 98C in addition to the conductive layer 98A and the conductive layer 98B. In the conductive layer 76C, as an example of metal which is more unlikely to be oxidized than the second metal contained in the conductive layer 76A, for example, silver is contained as a main component. In the conductive layer 98C, as an example of metal which is more unlikely to be oxidized than the second metal contained in the conductive layer 98A, for example, silver is contained as a main component. The thickness of the conductive layers 76C and 98C is, for example, 50 nm to 1000 nm.

In the configurations of FIGS. 38A and 38B, the non-crystalline films 70 and 72 are formed between the electrodes 76 and 761 and the silicon substrate 82, and the non-crystalline films 94 and 96 are formed between the electrodes 98 and 981 and the silicon substrate 82. There-fore, compared to the photoelectric conversion element 80 illustrated in FIGS. 35 and 37, a higher passivation effect is obtained.

The photoelectric conversion element 80A may not be provided with the non-crystalline films 70 and 94. In the photoelectric conversion element 80A, the n-type diffusion layer may be provided instead of the p-type diffusion layer 64p, the p-type diffusion layer may be provided instead of the n-type diffusion layer 90n, a film made of n-type a-Si:H may be provided instead of the non-crystalline film 72, and a film made of p-type a-Si:H may be provided instead of the non-crystalline film 96. The conductive type of the silicon substrate 82 may be changed to the p-type. In addition, in the configuration of FIG. 38A, the conductive layer containing the second metal is provided in both the electrodes 76 and 98, but the conductive layer containing the second metal may be provided in any one of the electrodes 76 and 98. Similarly, even in the configuration of FIG. 38B, the conductive layer containing the second metal may be provided in any one of the electrodes 761 and 981. In addition, even when the conductive layer containing the second metal is omitted, the photoelectric conversion element 80A functions as the photoelectric conversion element.

Modification Example 2

Figure 39A:
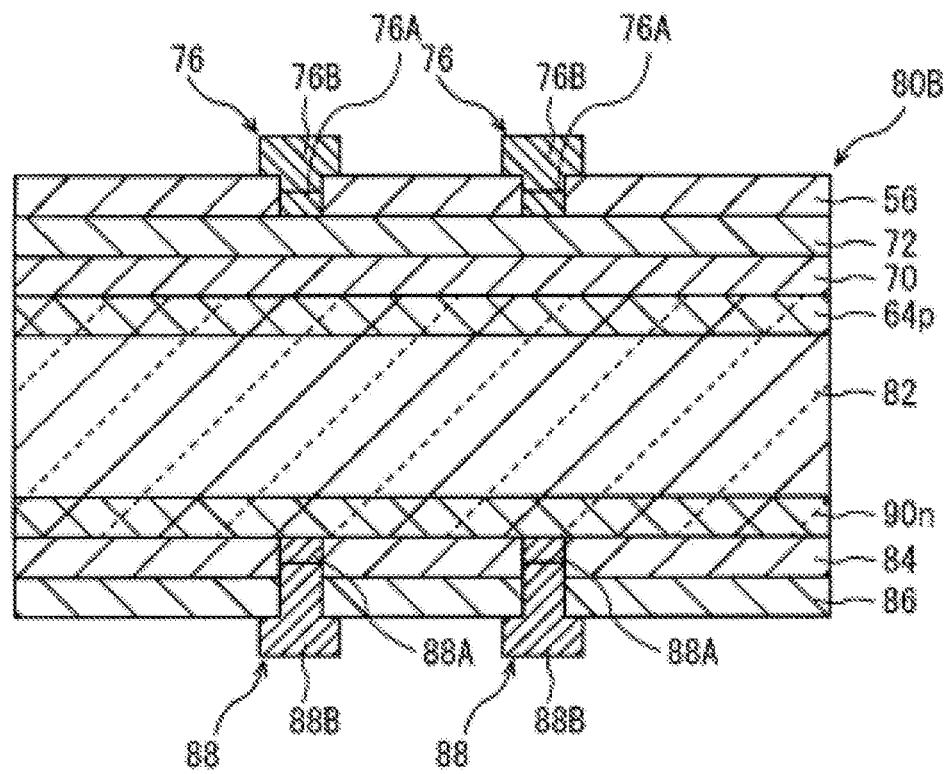
FIG. 39A is a sectional view illustrating a schematic configuration of a photoelectric conversion element according to a modification example 2 of the third embodiment of the present invention.

FIG. 39A is a vertically sectional view illustrating a schematic configuration of a photoelectric conversion element 80B according to a modification example 2 of the third embodiment. Compared to the photoelectric conversion element 80, instead of the non-crystalline film 54, the photoelectric conversion element 80B is provided with the non-crystalline film 70 and the non-crystalline film 72. Instead of the electrode 58, the electrode 76 is provided.

A manufacturing method of the photoelectric conversion element 80B may be a method in which a process of forming the non-crystalline film 54 in FIG. 36C is changed to a process of forming the non-crystalline film 70 and the non-crystalline film 72, and a process of forming the electrode 58 in FIG. 36E is changed to a process of forming the electrode 76, from the manufacturing method of the photoelectric conversion element 80.

Figure 39B:
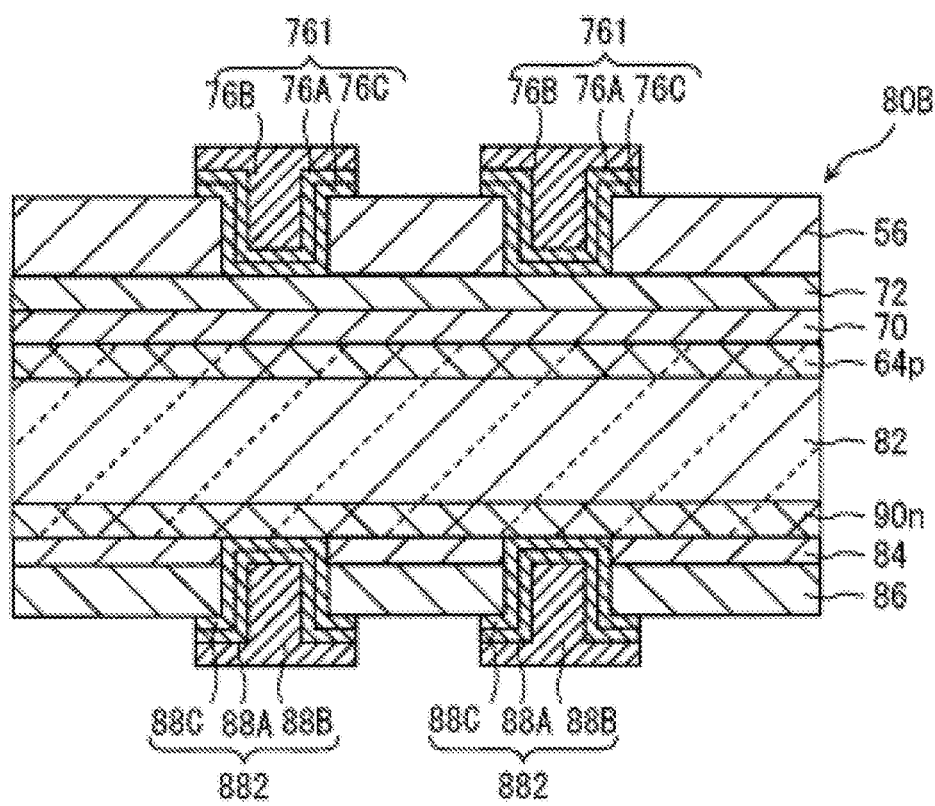
FIG. 39B is a sectional view illustrating a schematic configuration of the photoelectric conversion element according to the modification example 2 of the third embodiment of the present invention.

In addition, as illustrated in FIG. 39B, in the photoelectric conversion element 80B, the electrodes 761 and 882 may be provided instead of the electrodes 76 and 88. The electrode 761 further includes the conductive layer 76C in addition to the conductive layers 76A and 76B. In addition, the electrode 882 further includes the conductive layer 88C in addition to the conductive layers 88A and 88B. In the conductive layer 76C, as an example of the third metal which is more unlikely to be oxidized than the second metal contained in the conductive layer 76A, for example, silver is contained as a main component. In the conductive layer 88C, as an example of the third metal which is more unlikely to be oxidized than the second metal contained in the conductive layer 88A, for example, silver is contained as a main component. The thickness of the conductive layers 76C and 88C is, for example, 50 nm to 1000 nm.

In FIGS. 39A and 39B, since the light-receiving surface side of the silicon substrate 82 is covered with the non-crystalline films 70 and 72, an extremely high passivation effect is obtained. Meanwhile, on the rear surface side of the silicon substrate 82, a large part of the front surface of the silicon substrate is passivated by the non-crystalline film 84, and the electrodes 88 and 882 are provided to be directly in contact with the n-type diffusion layer 90n. Accordingly, the extremely low contact resistance and high passivation effect are obtained. Therefore, on the light-receiving surface side on which the excessive carrier density in the silicon substrate 82 becomes higher than that on the rear surface side, the passivation characteristics which is higher than that on the rear surface side, are achieved. Furthermore, on the rear surface side on which the excessive carrier density becomes lower than that on the light-receiving surface side, high passivation characteristics are rarely damaged, and the low contact resistance can be realized. Therefore, it is possible to further improve the photoelectric conversion efficiency.

The photoelectric conversion element 80B may not be provided with the non-crystalline film 70. In the photoelectric conversion element 80B, the n-type diffusion layer may be provided instead of the p-type diffusion layer 64p, the p-type diffusion layer may be provided instead of the n-type diffusion layer 90n, and a film made of n-type a-Si:H may be provided instead of the non-crystalline film 72. The conductive type of the silicon substrate 82 may be changed to the p-type. In addition, in the configuration of FIG. 39A, the conductive layer containing the second metal is provided in both the electrodes 76 and 88, but the conductive layer containing the second metal may be provided in any one of the electrodes 76 and 88. Similarly, even in the configuration of FIG. 39B, the conductive layer containing the second metal may be provided in any one of the electrodes 761 and 882. In addition, even when the conductive layer containing the second metal is omitted, the photoelectric conversion element 80B functions as the photoelectric conversion element.

Fourth Embodiment

Figure 40:
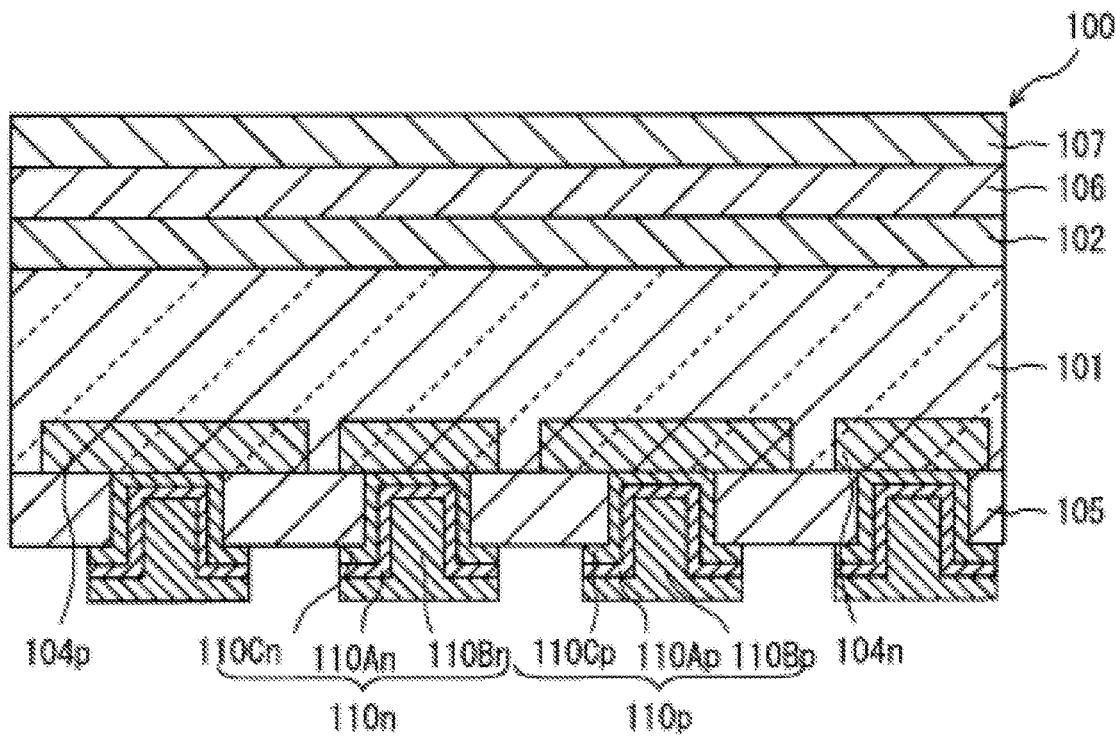
FIG. 40 is a sectional view illustrating a schematic configuration of a photoelectric conversion element according to a fourth embodiment of the present invention.

FIG. 40 is a sectional view illustrating a schematic configuration of a photoelectric conversion element 100 according to the embodiment of the present invention. The photoelectric conversion element 100 includes a silicon substrate 101, an insulation layer 105, an insulation layer 106, an insulation layer 107, an electrode 110n, and an electrode 110p.

The insulation layers 105 and 106 are made of, for example, silicon oxide. The insulation layer 107 is made of, for example, silicon nitride.

The silicon substrate 101 is the n-type single crystal silicon substrate. The silicon substrate 101 includes an n-type diffusion layer 102, an n-type diffusion layer 104n, and a p-type diffusion layer 104p.

The p-type diffusion layer 104p contains, for example, boron (B) as p-type impurities. The n-type diffusion layers 102 and 104n contain, for example, phosphorus (P) as n-type impurities.

The electrode 110n includes a conductive layer 110An, a conductive layer 110Bn, and a conductive layer 110Cn. In addition, the electrode 110p includes a conductive layer 110Ap, a conductive layer 110Bp, and a conductive layer 110Cp.

The conductive layers 110Cn and 110Cp contain, for example, silver as a main component as an example of the third metal. The conductive layers 110An and 110Ap contain, for example, titanium as an example of the second metal. The conductive layers 110Bn and 110Bp contain, for example silver as a main component as an example of the first metal.

(Manufacturing Method)

Figure 41A:
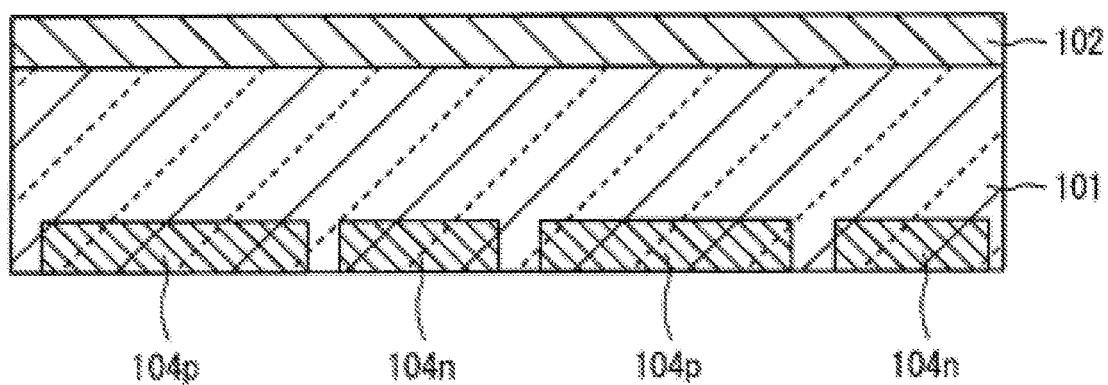
FIG. 41A is a sectional view illustrating a state where the n-type diffusion layer is formed on the front surface of the silicon substrate illustrated in FIG. 40.

With reference to FIGS. 41A to 41E, a manufacturing method of the photoelectric conversion element 100 will be described. As illustrated in FIG. 41A, on the front surface of the silicon substrate 101, for example, by using the ion injection method, by ion-injecting the donor impurities, such as P or As, the n-type diffusion layer 102 is formed on the front surface of the silicon substrate 101.

Next, on the rear surface of the silicon substrate 101 opposite to the n-type diffusion layer 102, for example, after forming the resist pattern by using the photolithography method, by ion-injecting the donor impurities, such as P or As, the n-type diffusion layer 104n is formed.

After removing the resist, for example, the resist pattern is formed by using the photolithography method, and acceptor impurities, such as boron (B), are ion-injected. Accordingly, the p-type diffusion layer 104p is formed. After this, the resist is removed. In addition, at this time, the heat treatment for vitalizing the impurities may be performed. In addition, instead of the ion injection method, a gas phase diffusion method, a solid phase diffusion method, a plasma doping method, or an ion doping method, may be used.

Figure 41B:
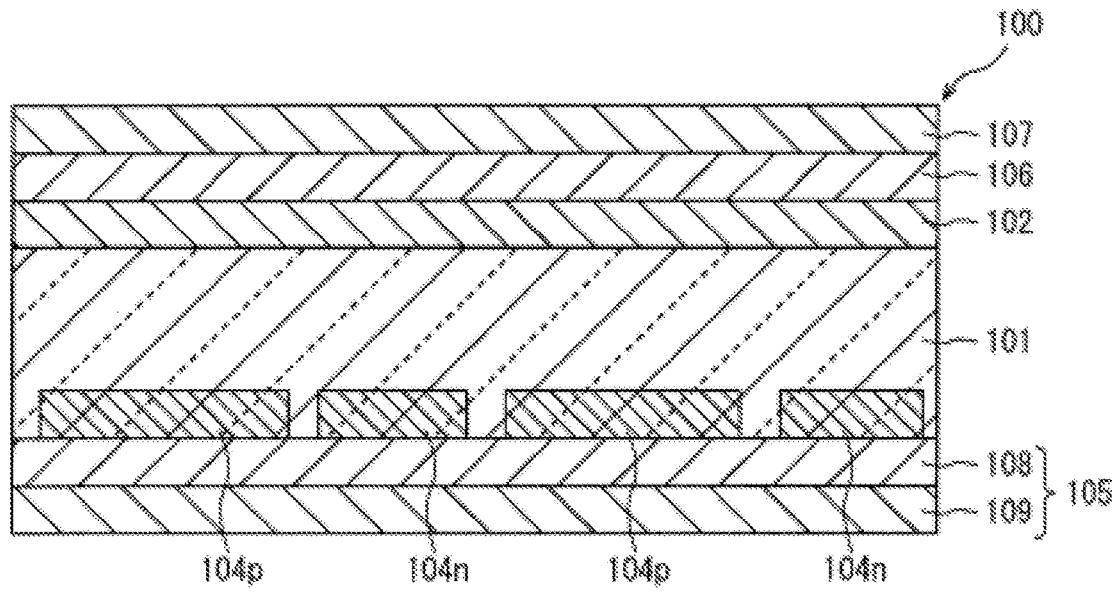
FIG. 41B is a sectional view illustrating a state where an insulation layer made of silicon oxide is formed on the front surface of the n-type diffusion layer, on the silicon substrate illustrated in FIG. 41A.

Next, by performing heat oxidization processing, as illustrated in FIG. 41B, the insulation layers 106 and 108 made of silicon oxide are formed on the front surface of the n-type diffusion layer 104n. Next, by using an LP-CVD method and the plasma CVD method, for example, the insulation layers 107 and 109 made of silicon nitride are respectively formed on the front surface of the insulation layers 106 and 108. Silicon oxide or silicon oxynitride may be used instead of silicon nitride. Accordingly, on the rear surface of the silicon substrate 101, the insulation layer 105 which is made of the layered film of the insulation layer 108 and the insulation layer 109, is formed. Furthermore, the insulation layers 106 and 108 can be omitted.

Figure 41C:
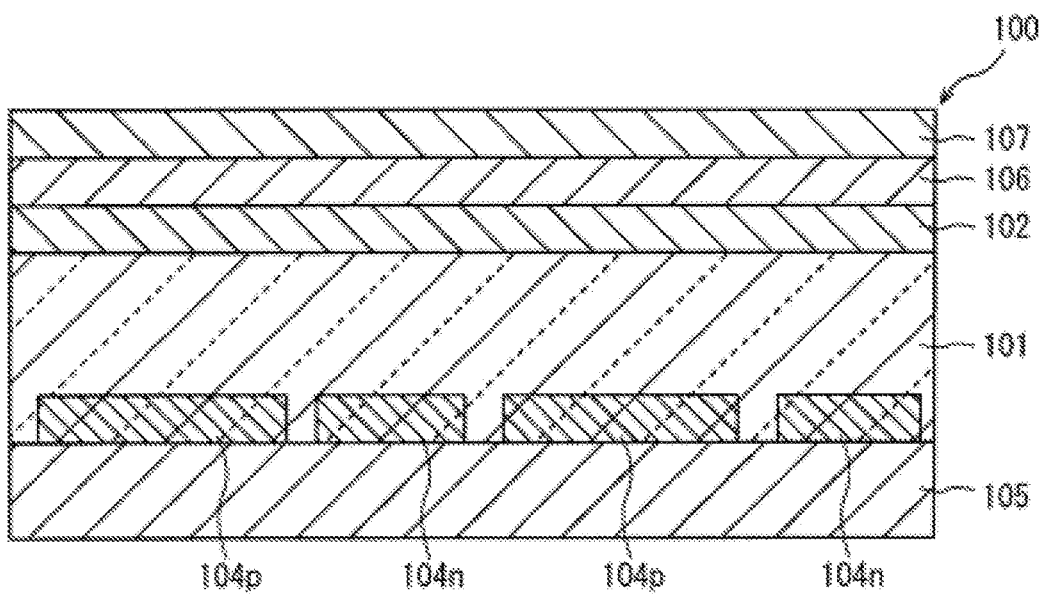
FIG. 41C is a sectional view illustrating a state where the insulation layer made of silicon nitride is formed on the front surface of the silicon substrate illustrated in FIG. 41B, and the insulation layer made of silicon oxide is formed on the rear surface of the silicon substrate.

In addition, as illustrated in FIG. 41C, only on the front surface of the silicon substrate 101, the insulation layer 107 made of silicon nitride is formed, and on the rear surface of the silicon substrate 101, the insulation layer 105 made of silicon oxide may be formed.

Figure 41D:
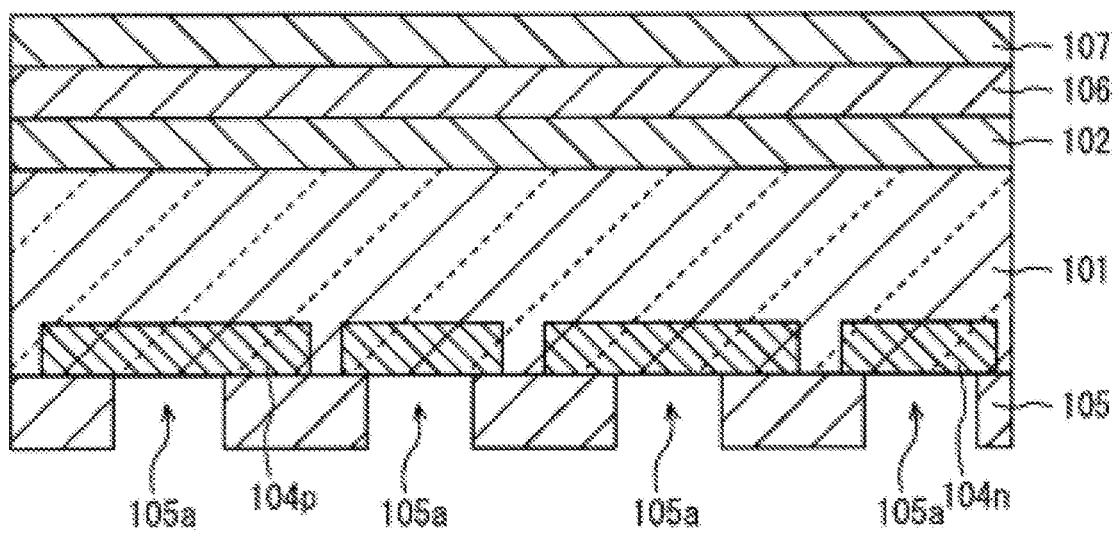
FIG. 41D is a sectional view illustrating a state where an opening portion is formed at a part of the insulation layer illustrated in FIG. 41B, and a part of the n-type diffusion layer and the p-type diffusion layer is exposed.

Next, as illustrated in FIG. 41D, for example, by using the photolithography method, an opening portion 105a is formed at a part of the insulation layer 105, and a part of the n-type diffusion layer 104n and the p-type diffusion layer 104p is exposed.

Figure 41E:
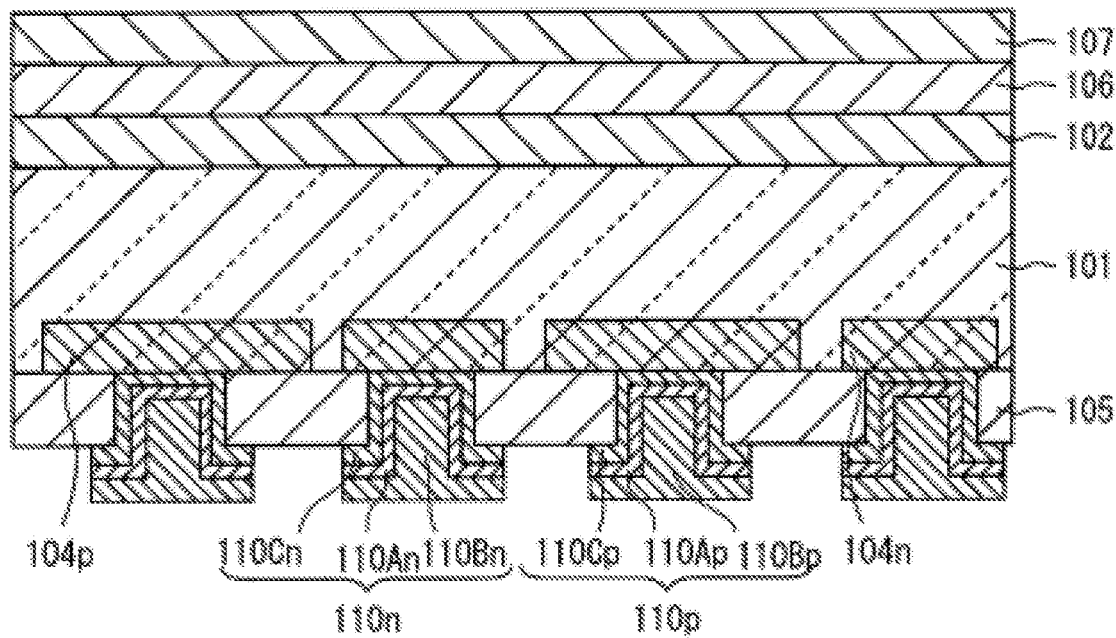
FIG. 41E is a sectional view illustrating a state where a conductive layer made of silver, a conductive layer made of titanium, and a conductive layer made of silver are formed on the silicon substrate illustrated in FIG. 41D.

Next, as illustrated in FIG. 41E, by using a vapor deposition method or the sputtering method, for example, a layered film on which silver, titanium, and silver are layered in order, is formed. In addition, by using the photolithography method, the layered film is patterned. After this, by performing the heat treatment, the electrodes 110n and 110p are formed, and the photoelectric conversion element 100 is obtained.

In addition, the electrode 110n includes the conductive layer 110An made of silver, the conductive layer 110Bn containing titanium, and the conductive layer 110Cn made of silver, and the electrode 110p includes the conductive layer 110Ap made of silver, the conductive layer 110Bp containing titanium, and the conductive layer 110Cp made of silver. The conductive layers 110Bn and 110Bp may contain oxygen.

Even in the photoelectric conversion element 100, similar to the photoelectric conversion device 10, the contact resistance between the electrodes 110n and 110p and the semiconductor layer (the n-type diffusion layer 104n and the p-type diffusion layer 104p) is reduced, and the photoelectric conversion efficiency is improved. In addition, since the conductive layers 110Bn and 110Bp are made of a material (for example, silver) having high reflectivity, by effectively reflecting the light which penetrates the silicon substrate 101, the photoelectric conversion efficiency is improved.

In addition, the photoelectric conversion element 100 may be provided with the n-type diffusion layer instead of the p-type diffusion layer 104p, and may be provided with the p-type diffusion layer instead of the n-type diffusion layer 104n. In addition, in the photoelectric conversion element 100, the conductive type of the silicon substrate 101 may be the p-type. In addition, in the embodiment, an example in which the electrodes 110n and 110p are respectively made of three of the conductive layer 110An, the conductive layer 110Bn, and the conductive layer 110Cn, and the conductive layer 110Ap, the conductive layer 110Bp, and the conductive layer 110Cp, is described, but the conductive layer 110Cn and the conductive layer 110Cp can be omitted. In addition, instead of forming the conductive layers 110An and 110Ap in both the electrodes 110n and 110p, the conductive layers 110An and 110Ap may be provided only in any one of the electrodes 110n and 110p. Even when the conductive layer 110An and the conductive layer 110p are omitted, the photoelectric conversion element 100 can function as the photoelectric conversion element.

Fifth Embodiment

Figure 42:
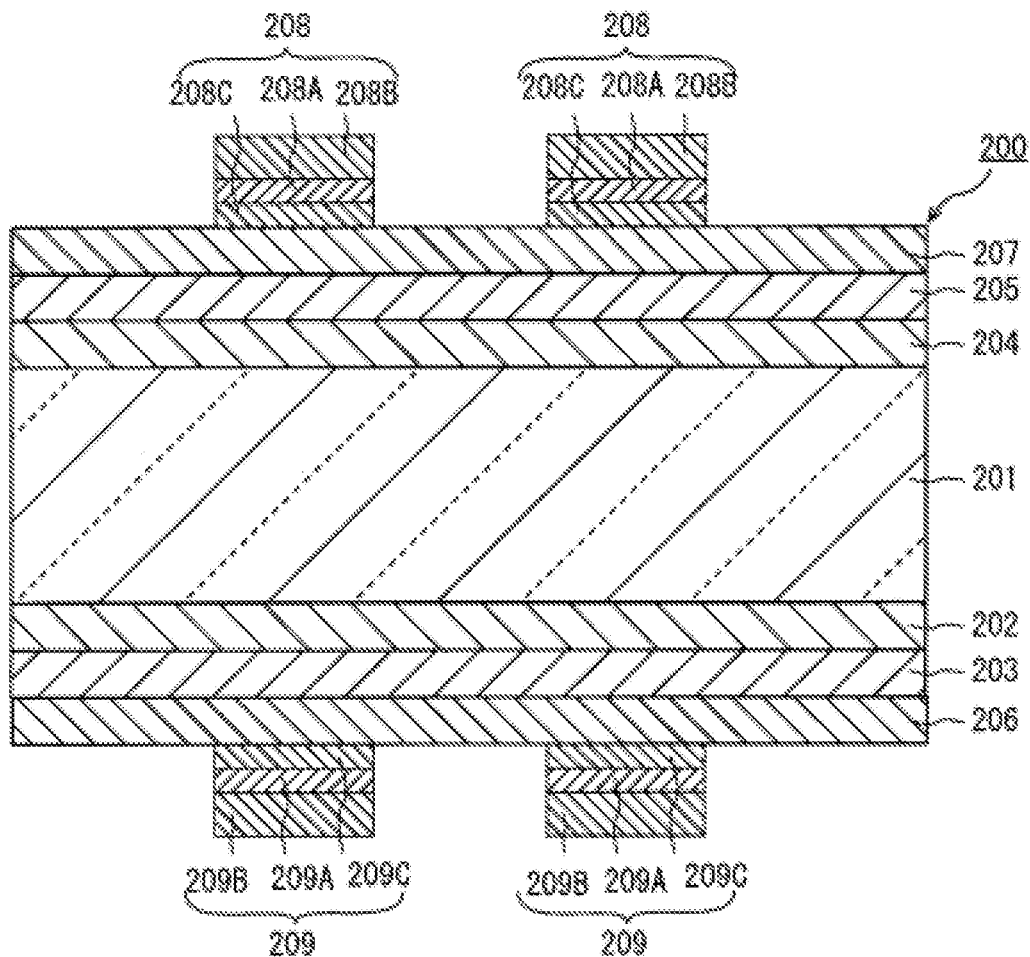
FIG. 42 is a sectional view illustrating a schematic configuration of a photoelectric conversion element according to a fifth embodiment of the present invention.

FIG. 42 is a sectional view illustrating a schematic configuration of a photoelectric conversion element 200 according to the embodiment of the present invention. The photoelectric conversion element 200 includes a silicon substrate 201, a non-crystalline film 202, a non-crystalline film 203, a non-crystalline film 204, a non-crystalline film 205, conductive metal oxide layers 206 and 207, and electrodes 208 and 209.

The silicon substrate 201 is an n-type single crystal silicon substrate. The electrode 208 includes a conductive layer 208A, a conductive layer 208B, and a conductive layer 208C. The electrode 209 includes a conductive layer 209A, a conductive layer 209B, and a conductive layer 209C. The conductive layers 208C and 209C contain, for example, silver as a main component as an example of the third metal. The conductive layers 208A and 209A contain, for example, titanium as a main component as an example of the second metal. The conductive layers 208A and 209A contain, for example, silver as a main component as an example of the first metal.

The non-crystalline film 204 includes at least the non-crystalline phase, and is made of, for example, a-Si:H. It is preferable that the non-crystalline film 204 is made of I-type a-Si:H, but the p-type impurities of which the concentration is lower than the p-type impurities contained in the non-crystalline film 205 may be contained. The film thickness of the non-crystalline film 204 is, for example, 1 nm to 20 nm. The non-crystalline film 204 is disposed to be in contact with the silicon substrate 201, and effectively passivates the silicon substrate 201. Accordingly, the lifetime of the minority carrier of the silicon substrate 201 is improved, and the photoelectric conversion efficiency is further improved. In addition, as long as the non-crystalline phase is included, the non-crystalline film 204 may include the crystalline phase. The non-crystalline film 204 may include, for example, both a-Si:H and fine silicon crystal.

The non-crystalline film 205 includes at least the non-crystalline phase, and is made of, for example, p-type a-Si:H. The film thickness of the non-crystalline film 205 is, for example, 1 nm to 30 nm. The non-crystalline film 205 is in contact with the non-crystalline film 204 and is disposed on the non-crystalline film 204. Accordingly, the lifetime of the minority carrier of the silicon substrate 201 is further improved, and the photoelectric conversion efficiency is further improved. In addition, as long as the non-crystalline phase is included, the non-crystalline film 205 may include the crystalline phase. The non-crystalline film 72 may include, for example, both p-type a-Si:H and fine silicon crystal.

The non-crystalline film 202 includes at least the non-crystalline phase, and is made of, for example, a-Si:H. It is preferable that the non-crystalline film 202 is made of i-type a-Si:H, but the n-type impurities of which the concentration is lower than the n-type impurities contained in the non-crystalline film 203 may be contained. The thickness of the non-crystalline film 202 is, for example, 1 nm to 20 nm. The non-crystalline film 202 is disposed to be in contact with the silicon substrate 201, and effectively passivates the silicon substrate 201. Accordingly, the lifetime of the minority carrier of the silicon substrate 201 is improved, and the photoelectric conversion efficiency is improved. In addition, as long as the non-crystalline phase is included, the non-crystalline film 202 may include the crystalline phase. The non-crystalline film 202 may include, for example, both a-Si:H and fine silicon crystal.

The non-crystalline film 203 includes at least the non-crystalline phase, and is made of, for example, n-type a-Si:H. The film thickness of the non-crystalline film 203 is, for example, 1 nm to 30 nm. The non-crystalline film 203 is in contact with the non-crystalline film 202 and is disposed on the non-crystalline film 202. Accordingly, the lifetime of the minority carrier of the silicon substrate 201 is further improved, and the photoelectric conversion efficiency is further improved. Furthermore, as long as the non-crystalline phase is included, the non-crystalline film 203 may include the crystalline phase. The non-crystalline film 203 may include, for example, both n-type a-Si:H and fine silicon crystal.

The conductive metal oxide layers 206 and 207 are made of, for example, indium tin oxide (ITO), indium tungsten oxide (IWO), zinc oxide, or tin oxide. In addition, the materials of the conductive metal oxide layers 206 and 207 are not necessarily the same as each other.

(Manufacturing Method)

With reference to FIGS. 43A to 43D, a manufacturing method of the photoelectric conversion element 200 will be described. Furthermore, although not illustrated, the texture structure may be formed on the front surface (the light-receiving surface, or both the light-receiving surface and the rear surface) of the silicon substrate 201.

Figure 43A:
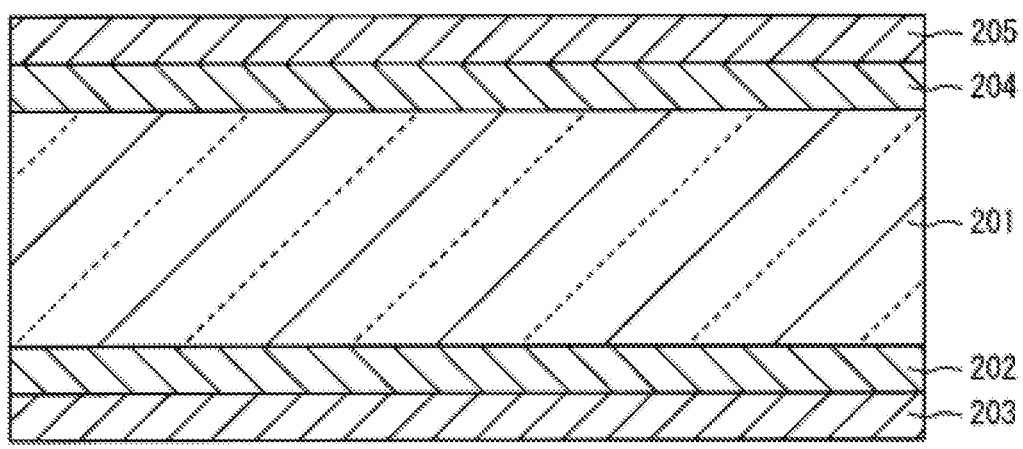
FIG. 43A is a sectional view illustrating a state where two non-crystalline films are formed on one surface of the silicon substrate illustrated in FIG. 42, and two non-crystalline films are formed on the other surface of the silicon substrate.

As illustrated in FIG. 43A, on one surface of the silicon substrate 201, for example, by using the plasma CVD, the non-crystalline film 202 is formed, and then, the non-crystalline film 203 is formed on the non-crystalline film 202. Next, on the surface of the silicon substrate 201 opposite to the non-crystalline film 202, for example, by using the plasma CVD, the non-crystalline film 204 is formed, and then, the non-crystalline film 205 is formed on the non-crystalline film 204.

Figure 43B:
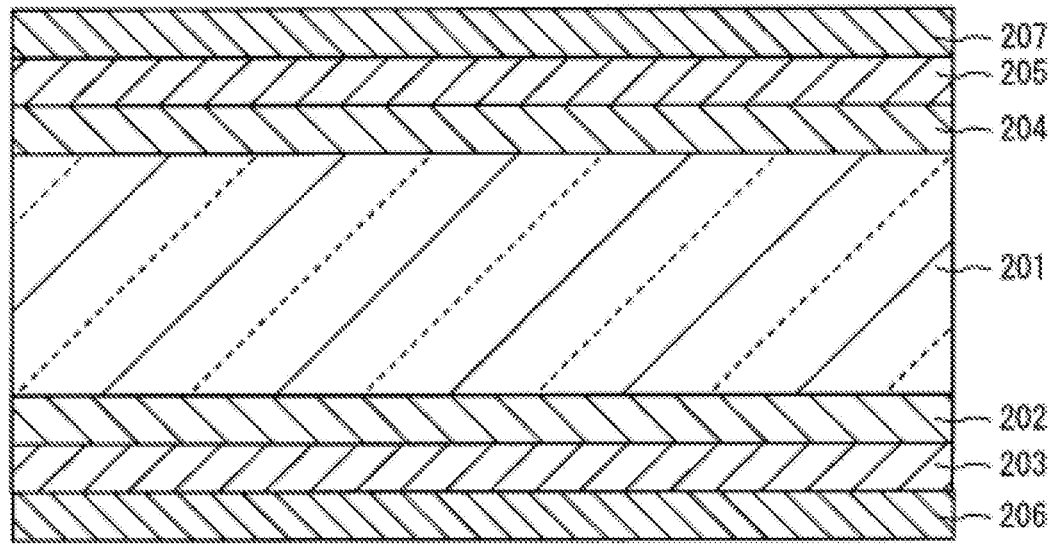
FIG. 43B is a sectional view illustrating a state where a conductive metal oxide layer is formed on the front surface of the non-crystalline film on one surface of the silicon substrate illustrated in FIG. 43A, and a conductive metal oxide layer is formed on the front surface of the non-crystalline film on the other surface of the silicon substrate.

Next, as illustrated in FIG. 43B, for example, by using the sputtering method, the conductive metal oxide layer 206 is formed on the front surface of the non-crystalline film 203, and then, the conductive metal oxide layer 207 is formed on the front surface of the non-crystalline film 205. In addition, instead of the sputtering method, a vapor deposition method, an ion plating method, or a remote plasma deposition may be used.

Figure 43C:
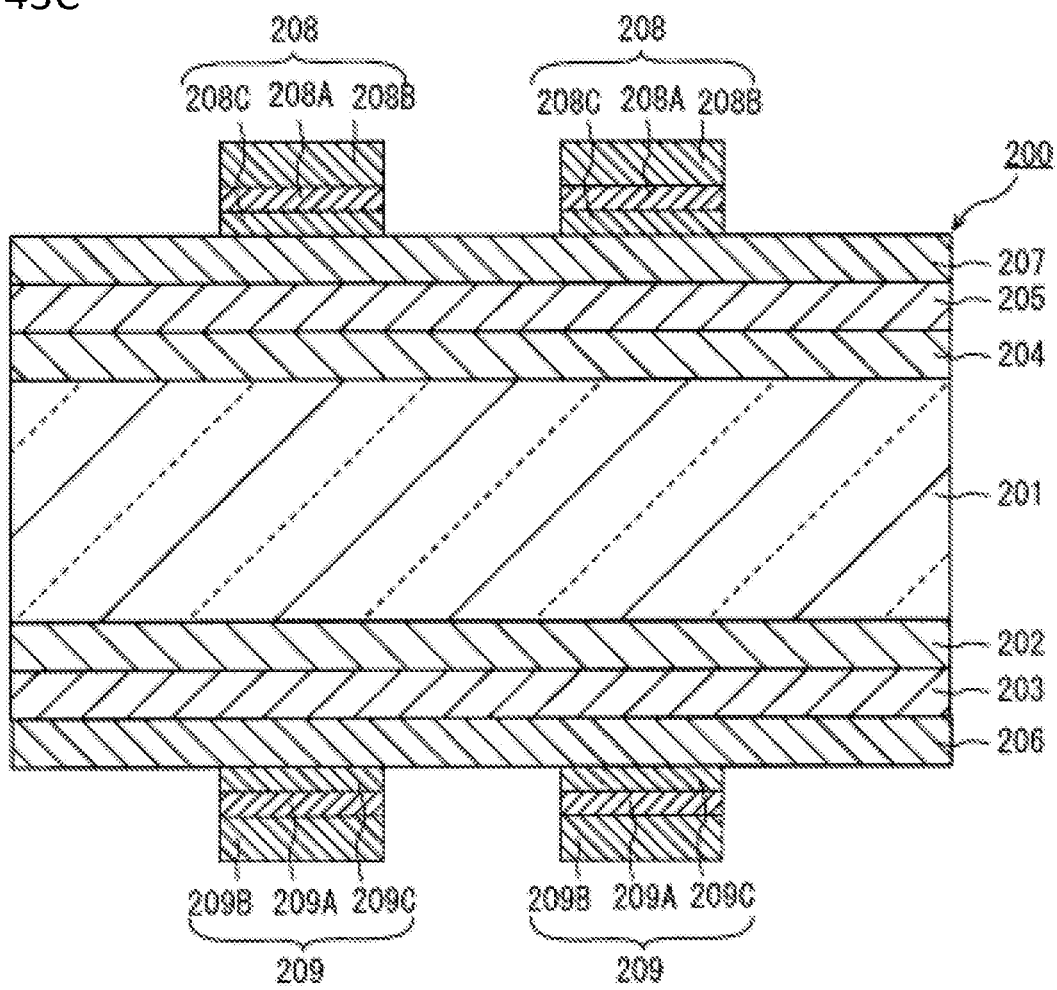
FIG. 43C is a sectional view illustrating a state where three conductive layers are formed and patterned, on the conductive metal oxide layer illustrated in FIG. 43B.

Next, as illustrated in FIG. 43C, for example, by using the vapor deposition method, on the conductive metal oxide layer 207, for example, silver, titanium, and silver are formed in order as a film. Similarly, on the conductive metal oxide layer 206, for example, silver, titanium, and silver are formed in order as a film. In addition, instead of the vapor deposition method, a sputtering method or a coating method may be used.

Next, for example, by using the photolithography method, the layered film made of silver, titanium, and silver on the conductive oxide layer 207, and the layered film made of silver, titanium, and silver on the conductive oxide layer 206, are patterned. After this, by performing the heat treatment similar to the first embodiment, the electrode 208 which is configured of the conductive layer 208C containing silver as a main component, the conductive layer 208A containing titanium, the conductive layer 208B containing silver as a main component, and the electrode 209 which is configured of the conductive layer 209C containing silver as a main component, the conductive layer 209A containing titanium, and the conductive layer 209B containing silver as a main component, are formed, and the photoelectric conversion element 200 is obtained.

Figure 44:
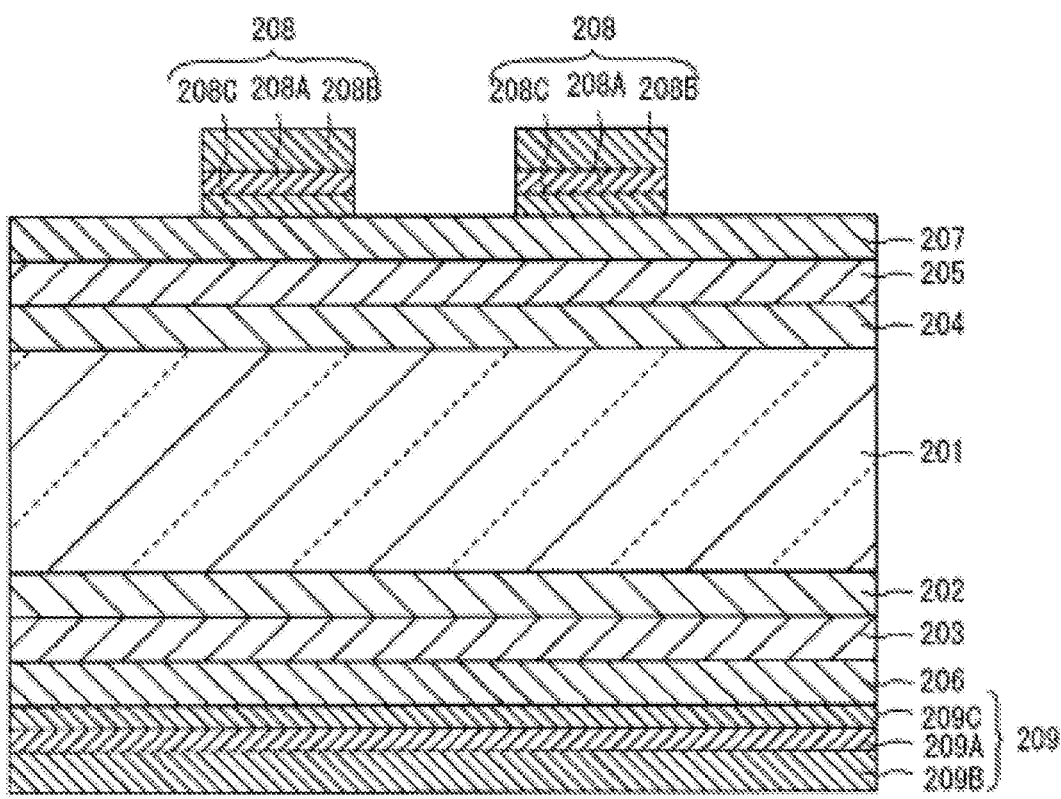
FIG. 44 is a sectional view illustrating a state where the electrode opposite to a light incident surface of the silicon substrate illustrated in FIG. 43C is not patterned.

In addition, as illustrated in FIG. 44, the electrode 209 opposite to the light-incident surface may not be patterned. In this case, as the light which penetrates the silicon substrate 201 is reflected by the electrode 209, and is incident on the silicon substrate 201 again, the photoelectric conversion efficiency can be improved.

In the photoelectric conversion element 200, since the conductive layers 208C and 209C are respectively in contact with the conductive metal oxide layers 206 and 207, the conductive layers 208C and 209C are likely to be oxidized when the heat treatment is performed. However, as the conductive layers 208A and 209A containing the second metal are provided, it is possible to suppress high resistance due to the oxidization of the conductive layers 208C and 209C. Therefore, even in the photoelectric conversion element 200, similar to the first embodiment, the contact resistance between the electrodes 208 and 209 and the conductive metal oxide layers 206 and 207 are also reduced, and the photoelectric conversion efficiency can be improved. Furthermore, by suppressing the oxidization of the conductive layers 208C and 209C, it is possible to employ a material (for example, silver) having high reflectivity as the conductive layers 208C and 209C. Therefore, the photoelectric conversion efficiency can be further improved.

In addition, the photoelectric conversion element 200 may be provided with the n-type non-crystalline instead of the p-type non-crystalline film 205, and may be provided with the p-type non-crystalline layer instead of the n-type non-crystalline film 203. In addition, in the photoelectric conversion element 200, the conductive type of the silicon substrate 201 may be the p-type. In addition, in the embodiment, the conductive layers 208A and 209A are formed in both electrodes 208 and 209, but the conductive layers 208A and 209A may be provided in any one of the electrodes 208 and 209. In addition, in each of the electrodes 208 and 209, the conductive layers 208C and 209C can be omitted.

Sixth Embodiment

Figure 45:
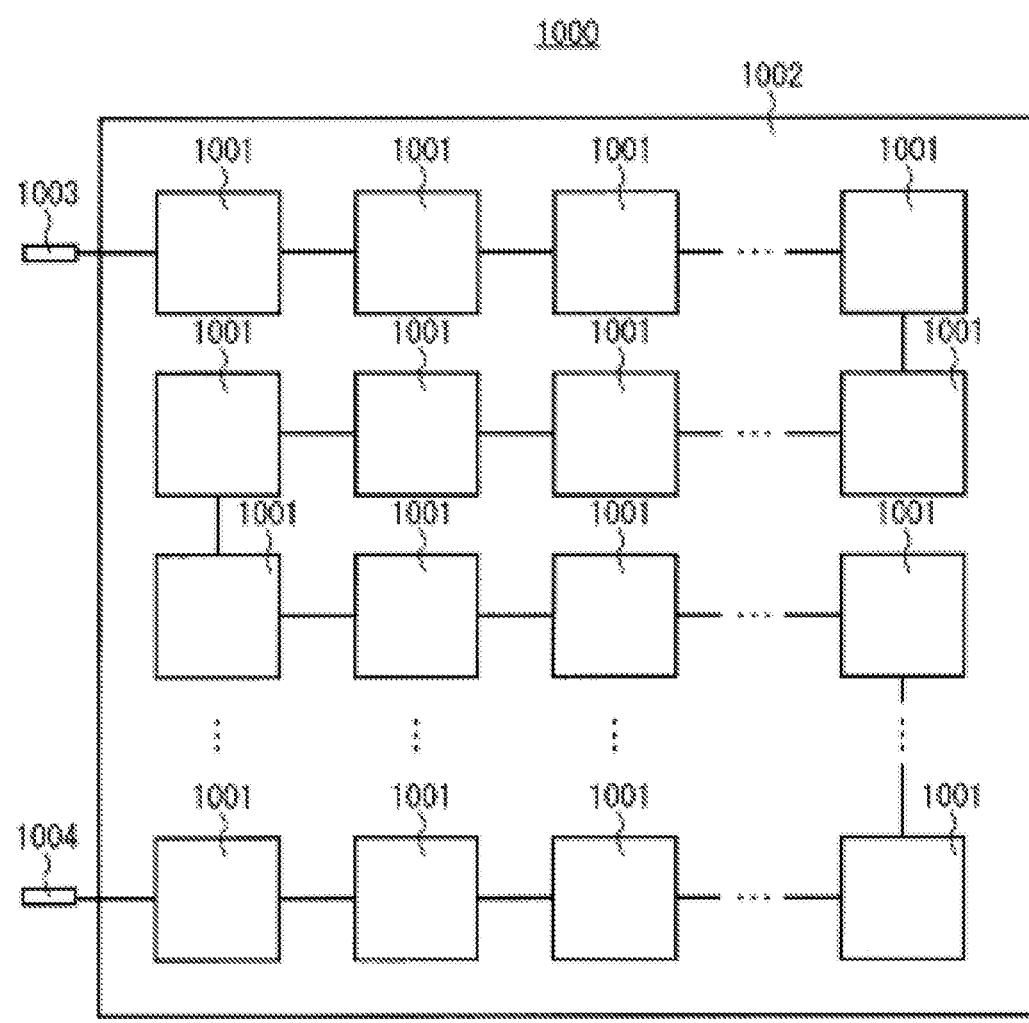
FIG. 45 is a schematic view illustrating a configuration of a photoelectric conversion module provided with the photoelectric conversion element according to the embodiment.

FIG. 45 is a schematic view illustrating a configuration of the photoelectric conversion module provided with the photoelectric conversion element according to the embodiment. With reference to FIG. 33, a photoelectric conversion module 1000 includes a plurality of photoelectric conversion elements 1001, a cover 1002, output terminals 1003 and 1004.

The plurality of photoelectric conversion elements 1001 are disposed in a shape of an array, and are connected to each other in series. Instead of being connected to each other in series, parallel connection or connection in which the series connection and the parallel connection are combined, may be employed. Each of the plurality of photoelectric conversion elements 1001 is made of any of the photoelectric conversion elements 10, 10A, 10B, 10C, 50, 50A, 50B, 80, 80A, 80B, 100, and 200.

The cover 1002 is made of pollution-resistant cover, and covers the plurality of photoelectric conversion elements 1001. The cover 1002 includes, for example, a transparent base material (for example, glass) provided on the light-receiving surface side of the photoelectric conversion element 1001, a rear surface base material (for example, glass or resin sheet) provided on the rear surface side opposite to the light-receiving surface side of the photoelectric conversion element 1001, and a sealing material (for example, EVA) which fills a void between the transparent base material and the resin base material.

The output terminal 1003 is connected to the photoelectric conversion element 1001 disposed at one end among the plurality of photoelectric conversion elements 1001 that are connected to each other in series.

The output terminal 1004 is connected to the photoelectric conversion element 1001 disposed at the other end among the plurality of photoelectric conversion elements 1001 that are connected to each other in series.

As described above, the characteristics of the photoelectric conversion elements 10, 10A, 10B, 10C, 50, 50A, 50B, 80, 80A, 80B, 100, and 200, are improved. Therefore, the performance of the photoelectric conversion module 1000 can be improved.

In addition, not being limited to the configuration illustrated in FIG. 45, the photoelectric conversion module according to the sixth embodiment may be configured in any manner as long as any of the photoelectric conversion elements 10, 10A, 10B, 10C, 50, 50A, 80, 80A, 80B, 100, and 200 is used.

Seventh Embodiment

Figure 46:
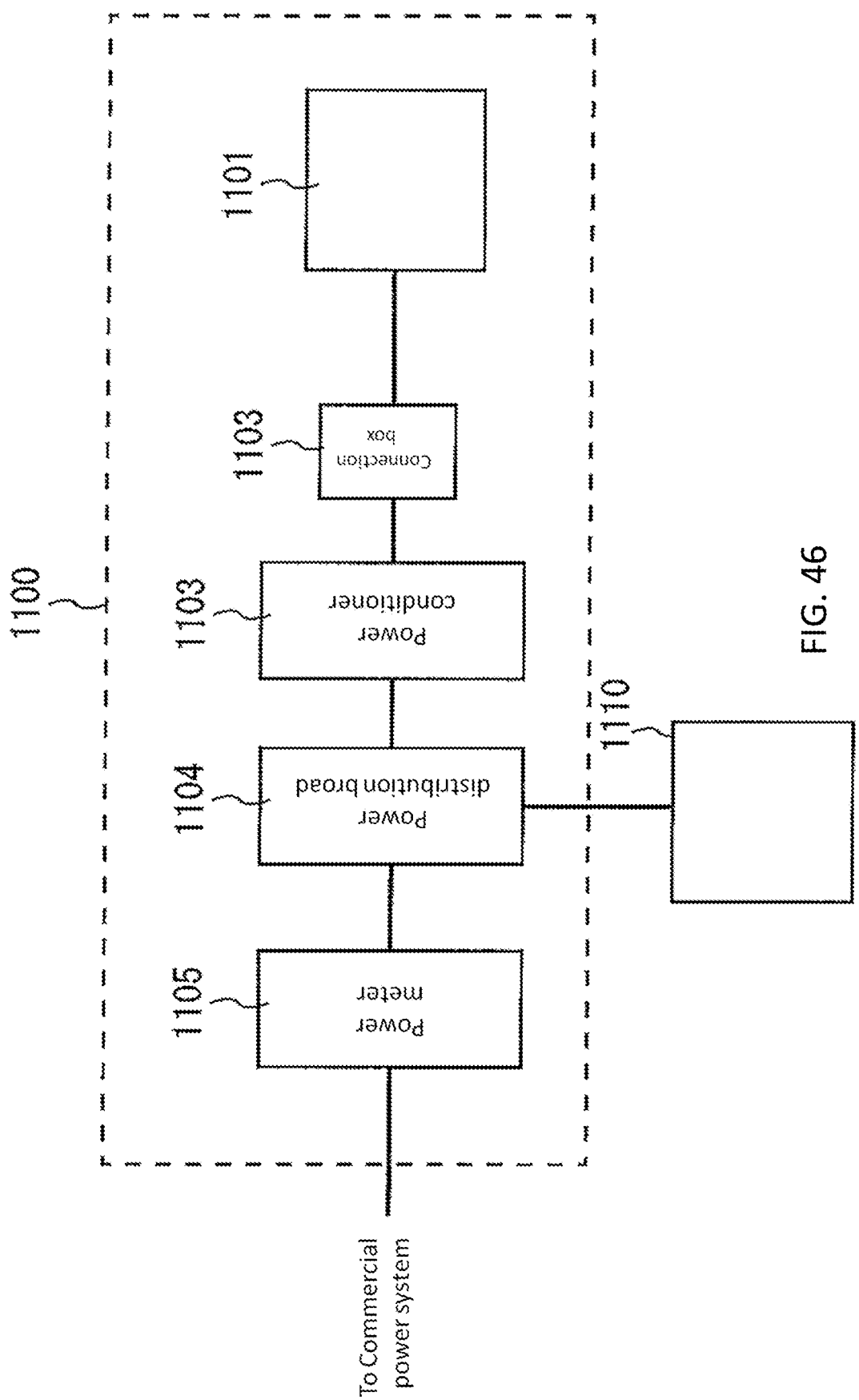
FIG. 46 is a schematic view illustrating a configuration of a solar photovoltaic power generation system provided with the photoelectric conversion element according to the embodiment.

FIG. 46 is a schematic view illustrating a configuration of a solar photovoltaic power generation system provided with the photoelectric conversion element according to the embodiment. With reference to FIG. 46, a solar photovoltaic power generation system 1100 includes a photoelectric conversion module array 1101, a connection box 1102, a power conditioner 1103, a distribution board 1104, and a power meter 1105.

The connection box 1102 is connected to the photoelectric conversion module array 1101. The power conditioner 1103 is connected to the connection box 1102. The distribution board 1104 is connected to the power conditioner 1103 and an electrical machine 1110. The power meter 1105 is connected to the distribution board 1104 and a commercial power system.

The photoelectric conversion module array 1101 converts sunlight into electricity, generates DC power, and supplies the generated DC power to the connection box 1102.

The connection box 1102 receives the DC power generated by the photoelectric conversion module array 1101, and supplies the received DC power to the power conditioner 1103.

The power conditioner 1103 converts the DC power received from the connection box 1102 into AC power, and supplies the converted AC power to the distribution board 1104.

The distribution board 1104 supplies the AC power received from the power conditioner 1103, and/or commercial power received via the power meter 1105, to the electrical machine 1110. In addition, when the AC power received from the power conditioner 1103 is greater than power consumption of the electrical machine 1110, the distribution board 1104 supplies residual AC power to the commercial power system via the power meter 1105.

The power meter 1105 measures the power in the direction toward the distribution board 1104 from the commercial power system, and measures the power in the direction toward the commercial power system from the distribution board 1104.

Figure 47:
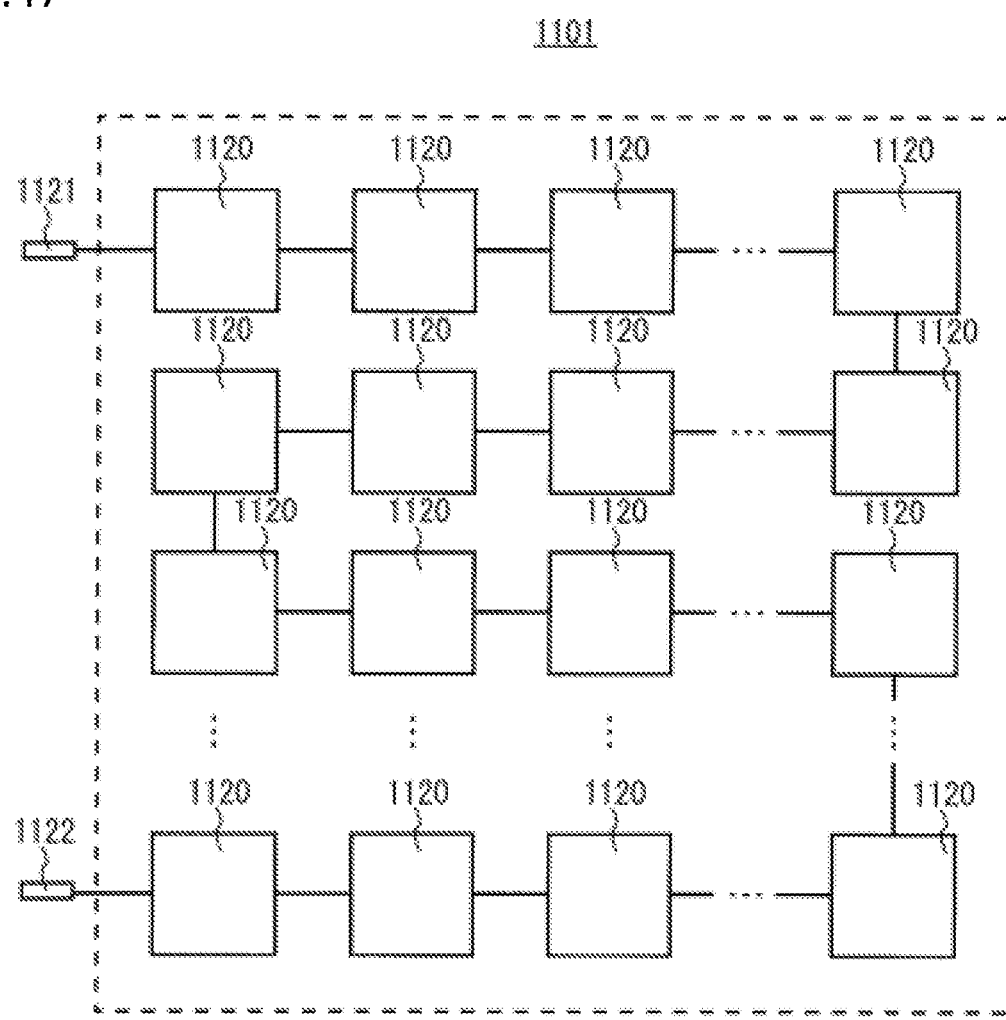
FIG. 47 is a schematic view illustrating a configuration of a photoelectric conversion module array illustrated in FIG. 46.

FIG. 47 is a schematic view illustrating a configuration of the photoelectric conversion module array 1101 illustrated in FIG. 46. With reference to FIG. 35, the photoelectric conversion module array 1101 includes a plurality of photoelectric conversion modules 1120 and output terminals 1121 and 1122.

The plurality of photoelectric conversion modules 1120 are disposed in a shape of an array, and are connected to each other in series. Each of the plurality of photoelectric conversion modules 1120 is made of the photoelectric conversion module 1000 illustrated in FIG. 4633.

The output terminal 1121 is connected to the photoelectric conversion module 1120 which is positioned at one end among the plurality of photoelectric conversion modules 1120 that are connected to each other in series.

The output terminal 1122 is connected to the photoelectric conversion module 1120 which is positioned at the other end among the plurality of photoelectric conversion modules 1120 that are connected to each other in series.

An operation in the solar photovoltaic power generation system 1100 will be described. The photoelectric conversion module array 1101 converts the sunlight into electricity, generates the DC power, and supplies the generated DC power to the power conditioner 1103 via the connection box 1102.

The power conditioner 1103 converts the DC power received from the photoelectric conversion module array 1101 into the AC power, and supplies the converted AC power to the distribution board 1104.

When the AC power received from the power conditioner 1103 is equal to or greater than the power consumption of the electrical machine 1110, the distribution board 1104 supplies the AC power received from the power conditioner 1103 to the electrical machine 1110. In addition, the distribution board 1104 supplies the residual AC power to the commercial power system via the power meter 1105.

In addition, when the AC power received from the power conditioner 1103 is less than the power consumption of the electrical machine 1110, the distribution board 1104 supplies the AC power received from the commercial power system and the AC power received from the power conditioner 1103, to the electrical machine 1110.

As described above, the solar photovoltaic power generation system 1100 is provided with any of the photoelectric conversion elements 10, 10A, 10B, 10C, 50, 50A, 50B, 80, 80A, 80B, 100, and 200 in which the element characteristics are improved. Therefore, performance of the solar photovoltaic power generation system 1100 can be improved.

In addition, not being limited to configurations illustrated in FIGS. 46 and 47, the solar photovoltaic power generation system according to the seventh embodiment may be configured in any manner as long as any of the photoelectric conversion elements 10, 10A, 10B, 10C, 50, 50A, 80, 80A, 80B, 100, and 200 is used.

Eighth Embodiment

Figure 48:
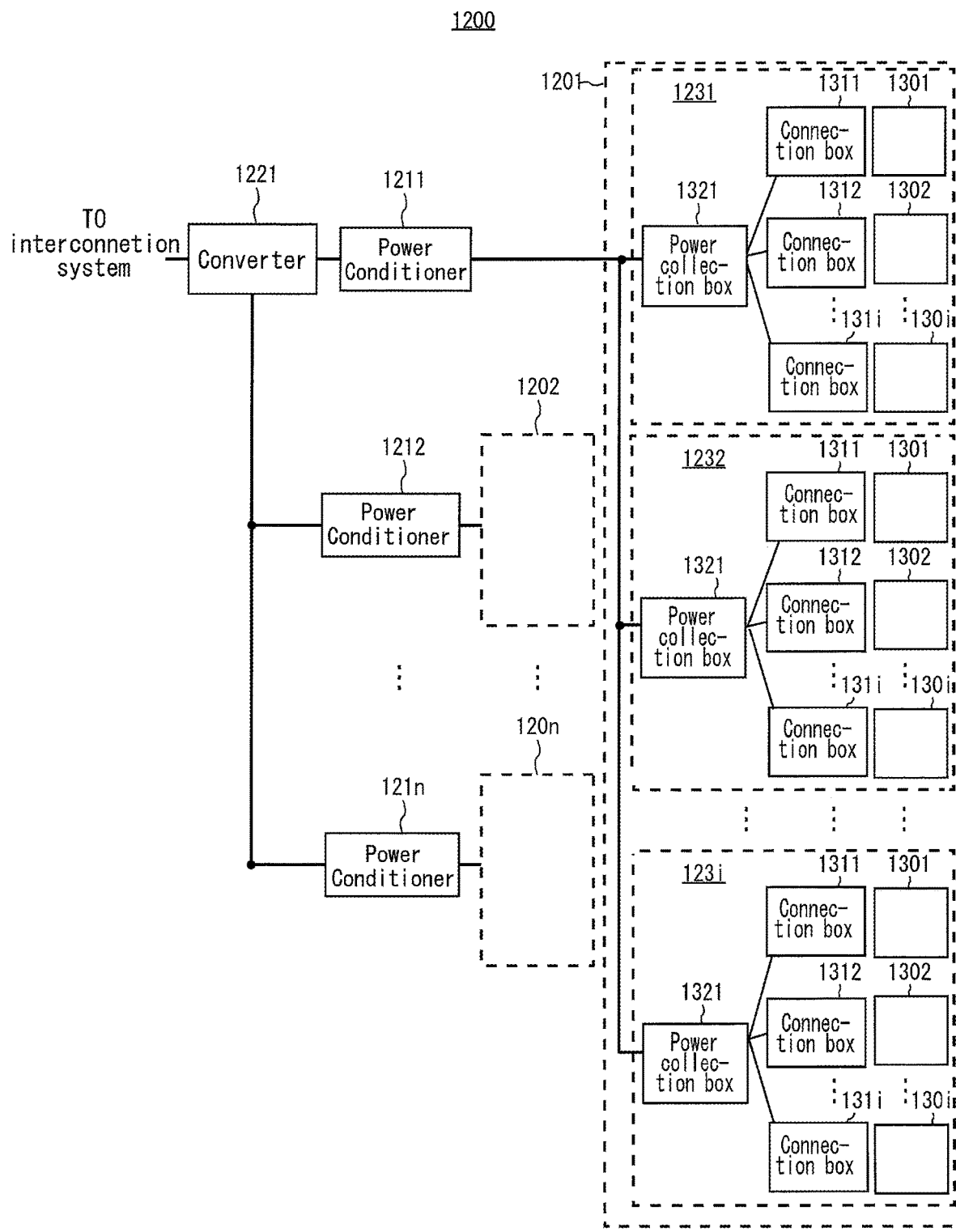
FIG. 48 is a schematic view illustrating a configuration of the solar photovoltaic power generation system provided with the photoelectric conversion element according to the embodiment.

FIG. 48 is a schematic view illustrating a configuration of the solar photovoltaic power generation system provided with the photoelectric conversion element according to the embodiment. With reference to FIG. 48, a solar photovoltaic power generation system 1200 includes subsystems 1201 to 120$n$ ($n$ is an integer which is equal to or greater than 2), power conditioners 1211 to 121$n$, and a converter 1221. The solar photovoltaic power generation system 1200 is a solar photovoltaic power generation system of which the dimension is greater than that of the solar photovoltaic power generation system 1100 illustrated in FIG. 46.

The power conditioners 1211 to 121$n$ are respectively connected to the subsystems 1201 to 120$n$.

The converter 1221 is connected to the power conditioners 1211 to 121$n$ and the commercial power system.

Each of the subsystems 1201 to 120$n$ is made of module systems 1231 to 123$j$ ($j$ is an integer which is equal to or greater than 2).

Each of the module systems 1231 to 123$j$ includes photoelectric conversion module arrays 1301 to 130$i$ ($i$ is an integer which is equal to or greater than 2), connection boxes 1311 to 131$i$, and a power collection box 1321.

Each of the photoelectric conversion module arrays 1301 to 130$i$ is configured the same as the photoelectric conversion module array 1101 illustrated in FIG. 46.

The connection boxes 1311 to 131$i$ are respectively connected to the photoelectric conversion module arrays 1301 to 130$i$.

The power collection box 1321 is connected to the connection boxes 1311 to 131$i$. In addition, $j$ power collection boxes 1321 of the subsystem 1201 are connected to the power conditioner 1211. $j$ power collection boxes 1321 of the subsystem 1202 are connected to the power conditioner 1212. Hereinafter, similarly, $j$ power collection boxes 1321 of the subsystem 120$n$ are connected to the power conditioner 121$n$.

$i$ photoelectric conversion module arrays 1301 to 130$i$ of the module system 1231 convert the sunlight into electricity, generate the DC power, and supply the generated DC power to the power collection box 1321 via each of the connection boxes 1311 to 131$i$. $i$ photoelectric conversion module arrays 1301 to 130$i$ of the 1232 convert the sunlight into electricity, generate the DC power, and supply the generated DC power to the power collection box 1321 via each of the connection boxes 1311 to 131$i$. Hereinafter, similarly, $i$ photoelectric conversion module arrays 1301 to 130$i$ of the module system 123$j$ convert the sunlight into electricity, generate the DC power, and supply the generated DC power to the power collection box 1321 via each of the connection boxes 1311 to 131$i$.

In addition, $j$ power collection boxes 1321 of the subsystem 1201 supply the DC power to the power conditioner 1211.

$j$ power collection boxes 1321 of the subsystem 1202 similarly supply the DC power to the power conditioner 1212.

Hereinafter, similarly, $j$ power collection boxes 1321 of the subsystem 120$n$ supply the DC power to the power conditioner 121$n$.

The power conditioners 1211 to 121$n$ respectively convert the DC power received from the subsystems 1201 to 120$n$ to the AC power, and supply the converted AC power to the converter 1221.

The converter 1221 receives the AC power from the power conditioners 1211 to 121n, converts a voltage level of the received AC power, and supplies the power to the commercial power system.

As described above, the solar photovoltaic power generation system 1200 is provided with any of the photoelectric conversion elements 10, 10A, 10B, 10C, 50, 50A, 80, 80A, 80B, 100, and 200 in which the element characteristics are improved. Therefore, the performance of the solar photovoltaic power generation system 1200 can be improved.

In addition, not being limited to configurations illustrated in FIG. 48, the solar photovoltaic power generation system according to the eighth embodiment may be configured in any manner as long as any of the photoelectric conversion elements 10, 10A, 10B, 10C, 50, 50A, 50B, 80, 80A, 80B, 100, and 200 is used.

Above, the embodiments of the present invention are described in detail, but the description is merely an example, but the description is merely an example, and the present invention is not limited to the above-described embodiments.

(1) For example, in the first embodiment, the silicon substrate 12 may be the p-type single crystal silicon substrate. In this case, the width dimension of the p-type non-crystalline silicon layer 20p becomes less than the width dimension of the n-type non-crystalline silicon layer 20n in the in-surface direction of the silicon substrate 12. This is similar in the modification example of the first embodiment, the second to the fourth embodiments, and the modification examples thereof.

(2) In the first embodiment, the texture structure on the light-receiving surface side of the silicon substrate 12, and the texture structure of the rear surface side, are not necessary configuration elements. This is similar in the modification example of the first embodiment, the second to the fourth embodiments, and the modification examples thereof.

(3) In the first embodiment, the passivation film 14 and the reflection preventing film 16 are not necessary configuration elements. This is similar in the modification example of the first embodiment.

(4) In the first embodiment, the high concentration region may be formed on the light-receiving surface side of the silicon substrate 12. The high concentration region is a region in which the impurities having the same conductive type as the silicon substrate 12 are doped to higher concentration than the silicon substrate 12. The high concentration region functions as a front surface field (FSF). This is similar in the modification example of the first embodiment, and the fourth embodiment.

(6) In the first to the fourth embodiments and the modification examples thereof, the first metal may be any of silver, platinum, and gold. The second metal may be at least one of nickel, cobalt, iron, chrome, zinc, tantalum, manganese, titanium, aluminum, magnesium, cerium, niobium, molybdenum, and tungsten. The third metal may be any of silver, platinum, and gold. The fourth metal may be at least one of nickel, cobalt, iron, chrome, zinc, tantalum, manganese, titanium, aluminum, magnesium, cerium, niobium, molybdenum, and tungsten. In addition, in the first embodiment, a main component of the semiconductor layer which is in contact with the electrodes 22n and 22p, that is, the n-type non-crystalline silicon layers 20n and the p-type non-crystalline silicon layer 20p, is silicon. It is preferable that the second metal is metal which is more likely to be oxidized than silicon regarding the suppression of the oxidization of the semiconductor layer (the n-type non-crystalline silicon layer 20n and the p-type non-crystalline silicon layer 20p) which is in contact with the electrodes 22n and 22p. Specifically, the second metal may be at least one of titanium, aluminum, magnesium, and cerium. This is similar in the modification example of the first embodiment, the second to the fourth embodiments, and the modification examples thereof.

INDUSTRIAL APPLICABILITY

The present invention can be used in the photoelectric conversion element, the solar battery, the photoelectric conversion module, and the photoelectric conversion system.

The invention claimed is:

1. A photoelectric conversion device comprising:
a semiconductor substrate;
a first semiconductor layer having a first conductive type;
a second semiconductor layer having a second conductive type opposite to the first conductive type;
a first electrode which is formed to be in contact with the first semiconductor layer; and
a second electrode which is formed on the second semiconductor layer,
wherein the first electrode includes a first conductive layer and a second conductive layer which is formed to be in contact with the first conductive layer,
wherein the first conductive layer includes a first metal as a main component,
wherein the second conductive layer includes a second metal which is more likely to be oxidized than the first metal,
wherein the first semiconductor layer includes a non-crystalline semiconductor,
wherein the first conductive layer includes a plurality of metal crystal grains,
wherein an average crystal grain size of the plurality of metal crystal grains is greater than a thickness of the first conductive layer in an in-surface direction of the first conductive layer,
wherein the plurality of metal crystal grains includes metal crystal grains oriented in a <110> direction, metal crystal grains oriented in a <100> direction, and metal crystal grains oriented in a <111> direction,
wherein each of the <100> direction, the <110> direction, and the <111> direction is within 10 degrees with respect to a thickness direction of the semiconductor substrate, and
wherein an area of the plurality of metal crystal grains oriented in the <111> direction is greater than an area of the plurality of metal crystal grains oriented in the <110> direction and an area of the plurality of metal crystal grains oriented in the <100> direction.

2. The photoelectric conversion device according to claim 1, wherein the second conductive layer is disposed between the first conductive layer and the first semiconductor layer.

3. The photoelectric conversion device according to claim 2,
wherein the first electrode further includes a third conductive layer which is formed between the first semiconductor layer and the second conductive layer, and
wherein the third conductive layer includes a third metal which is less likely to be oxidized than the second metal as a main component.

4. The photoelectric conversion device according to claim 3,
wherein the first electrode further includes a fourth conductive layer which is formed to be in contact with the first semiconductor layer and the third conductive layer, and
wherein the fourth conductive layer includes a fourth metal which is more likely to be oxidized than the third metal.

5. The photoelectric conversion device according to claim 4, wherein the fourth conductive layer contains an oxygen atom.

6. The photoelectric conversion device according to claim 5, wherein a distance between the semiconductor substrate and a position of a maximum concentration of the oxygen atom in the fourth conductive layer is greater than a distance between the semiconductor substrate and a center of the fourth conductive layer in a film thickness direction of the fourth conductive layer.

7. The photoelectric conversion device according to claim 4, wherein the fourth metal is more likely to be oxidized than a main component element of the first semiconductor layer.

8. The photoelectric conversion device according to claim 1, wherein the second conductive layer contains an oxygen atom.

9. The photoelectric conversion device according to claim 8, wherein a distance between the semiconductor substrate and a position of a maximum concentration of the oxygen atom in the second conductive layer is greater than a distance between the semiconductor substrate and a center of the second conductive layer in a film thickness direction of the second conductive layer.

10. The photoelectric conversion device according to claim 1, wherein the second metal is more likely to be oxidized than a main component element of the first semiconductor layer.

11. The photoelectric conversion device according to claim 3,
wherein a main component element of the first semiconductor layer is silicon,
wherein the first metal is any of silver, platinum, and gold,
wherein the second metal is at least one of nickel, cobalt, iron, chrome, zinc, tantalum, manganese, titanium, aluminum, magnesium, cerium, niobium, molybdenum, and tungsten, and
wherein the third metal is any of silver, platinum, and gold.

12. The photoelectric conversion device according to claim 4,
wherein a main component element of the first semiconductor layer is silicon,
wherein the first metal is any of silver, platinum, and gold,
wherein the second metal is at least one of nickel, cobalt, iron, chrome, zinc, tantalum, manganese, titanium, aluminum, magnesium, cerium, niobium, molybdenum, and tungsten,
wherein the third metal is any of silver, platinum, and gold, and
wherein the fourth metal is at least one of nickel, cobalt, iron, chrome, zinc, tantalum, manganese, titanium, aluminum, magnesium, cerium, niobium, molybdenum, and tungsten.

13. The photoelectric conversion device according to claim 4, wherein the third conductive layer includes a plurality of metal crystal grains, and
wherein an average crystal grain size of the plurality of metal crystal grains of the third conductive layer is greater than a thickness of the third conductive layer in an in-surface direction of the third conductive layer.

14. The photoelectric conversion device according to claim 1, wherein the first conductive layer further includes tin.

15. The photoelectric conversion device according to claim 1, wherein at least a part of the second metal is not oxidized.

16. The photoelectric conversion device according to claim 1, wherein only a part of the second metal is oxidized.

17. The photoelectric conversion device according to claim 1, wherein an amount of the second metal in the second conductive layer is equal to 90 at. % or more.

18. The photoelectric conversion device according to claim 1, wherein the second conductive layer further includes a fifth metal which is less likely to be oxidized than the second metal.

19. The photoelectric conversion device according to claim 1, wherein the second conductive layer is a metal layer.

* * * * *